United States Patent
Lim et al.

(10) Patent No.: US 12,557,545 B2
(45) Date of Patent: *Feb. 17, 2026

(54) COMPOUND AND ORGANIC LIGHT EMITTING DEVICE COMPRISING THE SAME

(71) Applicant: LG Chem, Ltd., Seoul (KR)

(72) Inventors: Byeong Yun Lim, Daejeon (KR); Jaechol Lee, Daejeon (KR); Doowhan Choi, Daejeon (KR); Yongwook Kim, Daejeon (KR); Young Kwang Kim, Daejeon (KR); Minseob Seo, Daejeon (KR); Seung Jun Yoo, Daejeon (KR)

(73) Assignee: LG Chem, Ltd., Seoul (KR)

( * ) Notice: Subject to any disclaimer, the term of this patent is extended or adjusted under 35 U.S.C. 154(b) by 856 days.

This patent is subject to a terminal disclaimer.

(21) Appl. No.: 17/800,086

(22) PCT Filed: Feb. 17, 2021

(86) PCT No.: PCT/KR2021/002021
§ 371 (c)(1),
(2) Date: Aug. 16, 2022

(87) PCT Pub. No.: WO2021/177631
PCT Pub. Date: Sep. 10, 2021

(65) Prior Publication Data
US 2023/0140749 A1   May 4, 2023

(30) Foreign Application Priority Data

Mar. 3, 2020 (KR) ........................ 10-2020-0026668

(51) Int. Cl.
*H10K 85/60* (2023.01)
*C07D 487/04* (2006.01)
(Continued)

(52) U.S. Cl.
CPC ......... *H10K 85/636* (2023.02); *C07D 487/04* (2013.01); *C09K 11/06* (2013.01);
(Continued)

(58) Field of Classification Search
CPC . H10K 85/636; H10K 85/633; H10K 85/6572
See application file for complete search history.

(56) References Cited

U.S. PATENT DOCUMENTS

2004/0251816 A1   12/2004  Leo et al.
2010/0032658 A1   2/2010   Lee et al.
(Continued)

FOREIGN PATENT DOCUMENTS

CN   103022377 A   4/2013
CN   107353298 A   11/2017
(Continued)

OTHER PUBLICATIONS

International Search Report for Application No. PCT/KR2021/002021, mailed May 28, 2021, pp. 1-2.

*Primary Examiner* — Sean M DeGuire
(74) *Attorney, Agent, or Firm* — Lerner David LLP

(57) ABSTRACT

The present disclosure provides a novel compound represented by the following Chemical Formula 1 and an organic light emitting device including the same:

(Continued)

[Chemical Formula 1]

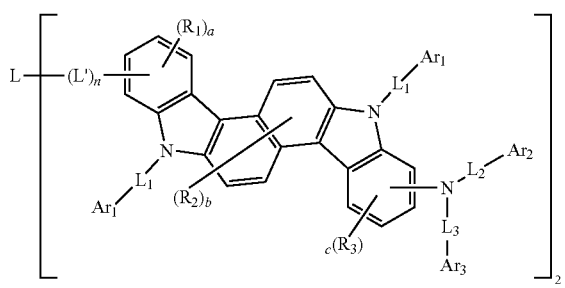

wherein L, L', $L_1$ to $L_3$, $Ar_1$ to $Ar_3$, $R_1$ to $R_3$, n, and a to c are described herein.

15 Claims, 1 Drawing Sheet

(51) Int. Cl.
*C09K 11/06* (2006.01)
*H10K 50/11* (2023.01)
(52) U.S. Cl.
CPC .... *H10K 85/633* (2023.02); *C09K 2211/1018* (2013.01); *H10K 50/11* (2023.02); *H10K 85/626* (2023.02); *H10K 85/6572* (2023.02); *H10K 85/6574* (2023.02)

(56) References Cited

U.S. PATENT DOCUMENTS

| | | |
|---|---|---|
| 2012/0153272 A1 | 6/2012 | Fukuzaki |
| 2016/0020412 A1 | 1/2016 | Kim et al. |
| 2016/0079545 A1 | 3/2016 | Fukuzaki |
| 2016/0133857 A1 | 5/2016 | Kim et al. |
| 2016/0293845 A1 | 10/2016 | Kim et al. |
| 2019/0378992 A1 | 12/2019 | Skulason et al. |
| 2020/0006672 A1 | 1/2020 | Sagara et al. |
| 2020/0277284 A1 | 9/2020 | Linge et al. |
| 2022/0271237 A1 | 8/2022 | Kim et al. |

FOREIGN PATENT DOCUMENTS

| | | |
|---|---|---|
| CN | 110023319 A | 7/2019 |
| CN | 110746409 A | 2/2020 |
| IN | 104513662 A | 4/2015 |
| JP | 2010059147 A | 3/2010 |
| JP | 2017075140 A | 4/2017 |
| KR | 20000051826 A | 8/2000 |
| KR | 20120032572 A | 4/2012 |
| KR | 20160007965 A | 1/2016 |
| KR | 20160055557 A | 5/2016 |
| KR | 20160117702 A | 10/2016 |
| KR | 20190059998 A | 5/2019 |
| KR | 20190128208 A | 11/2019 |
| WO | 2003012890 A2 | 2/2003 |
| WO | 2011025018 A1 | 3/2011 |
| WO | 2018097937 A1 | 5/2018 |
| WO | 2019076789 A1 | 4/2019 |
| WO | 2019120099 A1 | 6/2019 |

【FIG. 1】
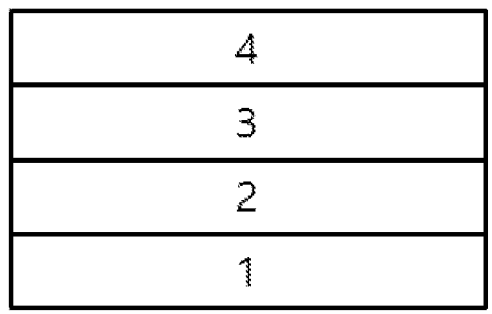
【FIG. 2】
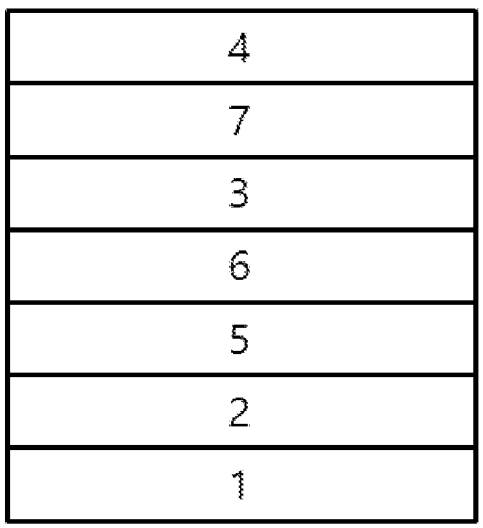

COMPOUND AND ORGANIC LIGHT EMITTING DEVICE COMPRISING THE SAME

CROSS-REFERENCE TO RELATED APPLICATION(S)

The present application is a national stage entry under 35 U.S.C. § 371 of International Application No. PCT/KR2021/002021 filed on Feb. 17, 2021, which claims priority from Korean Patent Application No. 10-2020-0026668 filed on Mar. 3, 2020, all the disclosures of which are incorporated herein by reference.

TECHNICAL FIELD

The present disclosure relates to a novel compound and an organic light emitting device comprising the same.

DESCRIPTION OF THE RELATED ART

In general, an organic light emitting phenomenon refers to a phenomenon where electric energy is converted into light energy by using an organic material. The organic light emitting device using the organic light emitting phenomenon has characteristics such as a wide viewing angle, an excellent contrast, a fast response time, an excellent luminance, driving voltage and response speed, and thus many studies have proceeded.

The organic light emitting device generally has a structure which comprises an anode, a cathode, and an organic material layer interposed between the anode and the cathode. The organic material layer frequently has a multilayered structure that comprises different materials in order to enhance efficiency and stability of the organic light emitting device, and for example, the organic material layer may be formed of a hole injection layer, a hole transport layer, a light emitting layer, an electron transport layer, an electron injection layer and the like. In the structure of the organic light emitting device, if a voltage is applied between two electrodes, the holes are injected from an anode into the organic material layer and the electrons are injected from the cathode into the organic material layer, and when the injected holes and electrons meet each other, an exciton is formed, and light is emitted when the exciton falls to a ground state again.

In the organic materials used in the organic light emitting devices as described above, the development of new materials is continuously required.

Meanwhile, recently, in order to reduce process costs, an organic light emitting device using a solution process, particularly an inkjet process, has been developed instead of a conventional deposition process. In the initial stage of development, attempts have been made to develop organic light emitting devices by coating all organic light emitting device layers by a solution process, but current technology has limitations. Therefore, only HIL, HTL, and EML are processed in a layer device structure by a solution process, and a hybrid process utilizing traditional deposition processes is being studied as a subsequent process.

Therefore, the present disclosure provides a novel material for an organic light emitting device that can be used for an organic light emitting device and at the same time, can be used for a solution process.

PRIOR ART LITERATURE

Patent Literature (Patent Literature 0001) Korean Unexamined Patent Publication No. 10-2000-0051826

DETAILED DESCRIPTION OF THE INVENTION

Technical Problem

It is an object of the present disclosure to provide a novel compound and an organic light emitting device comprising the same.

Technical Solution

According to an aspect of the present disclosure, there is provided a compound represented by the following Chemical Formula 1:

[Chemical Formula 1]

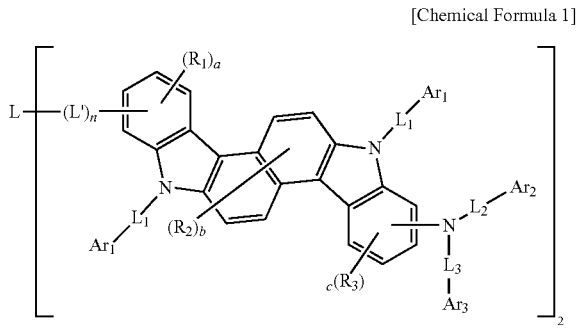

wherein in Chemical Formula 1,

L is a single bond; O; S; $N(Z_1)$; $C(Z_2)(Z_3)$; a substituted or unsubstituted $C_{6-60}$ arylene; or a substituted or unsubstituted $C_{2-60}$ heteroarylene containing at least one heteroatom selected among N, O and S;

L' is a single bond; or $N(Z_4)$;

n is 0 or 1, wherein $Z_1$ to $Z_4$ are each independently hydrogen; deuterium; a substituted or unsubstituted $C_{1-60}$ alkyl; a substituted or unsubstituted $C_{6-60}$ aryl; or a substituted or unsubstituted $C_{2-60}$ heteroaryl containing at least one heteroatom selected among N, O and S, $L_1$ to $L_3$ are each independently a single bond; a substituted or unsubstituted $C_{6-60}$ arylene; or a substituted or unsubstituted $C_{2-60}$ heteroarylene containing at least one heteroatom selected among N, O and S, $Ar_1$ to $Ar_3$ are each independently a substituted or unsubstituted $C_{6-60}$ aryl; or a substituted or unsubstituted $C_{2-60}$ heteroaryl containing at least one heteroatom selected among N, O and S, $R_1$ to $R_3$ are each independently deuterium; halogen; cyano; a substituted or unsubstituted $C_{1-60}$ alkyl; a substituted or unsubstituted $C_{6-60}$ aryl; or a substituted or unsubstituted $C_{2-60}$ heteroaryl containing at least one heteroatom selected among N, O and S, a and c are each independently an integer of 0 to 3, b is an integer of 0 to 4, when a, b and c are 2 or more, the substituent groups in parentheses are the same as or different from each other, and the structures in two square brackets ([ ]) are the same as or different from each other.

According to another aspect of the present disclosure, there is provided an organic light emitting device comprising: a first electrode; a second electrode that is provided opposite to the first electrode; and a light emitting layer that is provided between the first electrode and the second electrode, wherein the light emitting layer includes the compound represented by Chemical Formula 1.

Advantageous Effects

The above-mentioned compound represented by Chemical Formula 1 can be used as a material of an organic material layer in an organic light emitting device, can be used in a solution process, and can improve the efficiency and lifetime characteristics in an organic light emitting device.

BRIEF DESCRIPTION OF THE DRAWINGS

FIG. 1 shows an example of an organic light emitting device comprising a substrate 1, an anode 2, a light emitting layer 3, and a cathode 4.

FIG. 2 shows an example of an organic light emitting device comprising a substrate 1, an anode 2, a hole injection layer 5, a hole transport layer 6, a light emitting layer 3, an electron injection and transport layer 7, and a cathode 4.

DETAILED DESCRIPTION OF THE EMBODIMENTS

Hereinafter, embodiments of the present disclosure will be described in more detail to facilitate understanding of the invention.

Definition of Terms

As used herein, the notation

and ⫶ mean a bond linked to another substituent group, and the ph means a phenyl group.

As used herein, the term "substituted or unsubstituted" means being substituted with one or more substituents selected from the group consisting of deuterium; a halogen group; a cyano group; a nitro group; a hydroxy group; a carbonyl group; an ester group; an imide group; an amino group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an alkylamine group; an aralkylamine group; a heteroarylamine group; an arylamine group; an arylphosphine group; and a heteroaryl group containing at least one of N, O and S atoms, or being substituted with a substituent to which two or more substituents of the above-exemplified substituents are linked, or being unsubstituted. For example, "a substituent in which two or more substituents are linked" may be a biphenyl group. Namely, a biphenyl group may be an aryl group, or it may also be interpreted as a substituent in which two phenyl groups are linked.

In the present disclosure, the carbon number of a carbonyl group is not particularly limited, but is preferably 1 to 40. Specifically, the carbonyl group may be a group having the following structural formulas, but is not limited thereto.

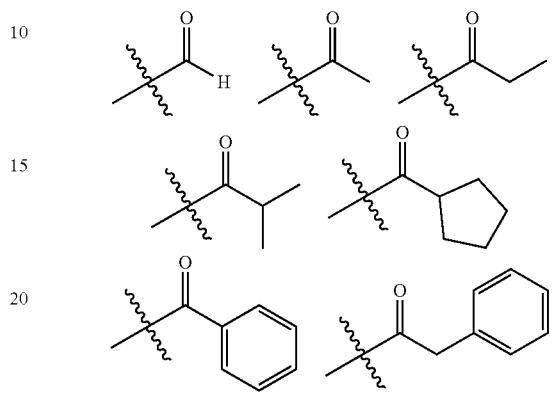

In the present disclosure, an ester group may have a structure in which oxygen of the ester group may be substituted by a straight-chain, branched-chain, or cyclic alkyl group having 1 to 25 carbon atoms, or an aryl group having 6 to 25 carbon atoms. Specifically, the ester group may be a group having the following structural formulas, but is not limited thereto.

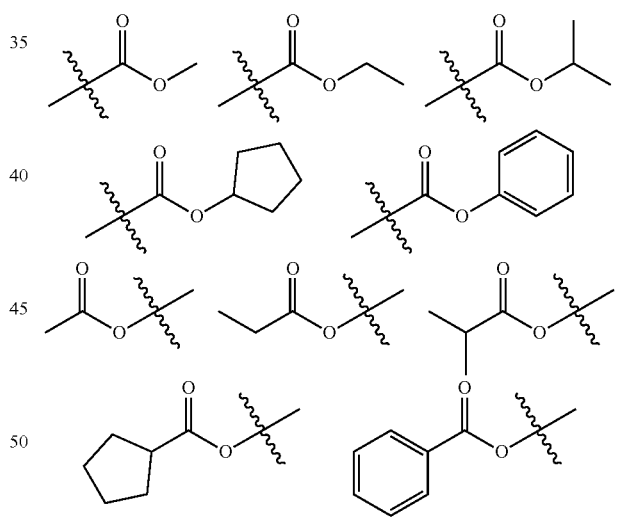

In the present disclosure, the carbon number of an imide group is not particularly limited, but is preferably 1 to 25. Specifically, the imide group may be a group having the following structural formulas, but is not limited thereto.

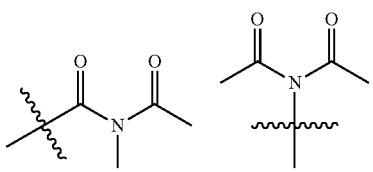

-continued

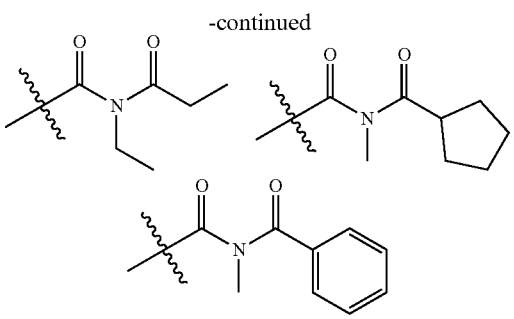

In the present disclosure, a silyl group specifically includes a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but is not limited thereto.

In the present disclosure, a boron group specifically includes a trimethylboron group, a triethylboron group, a t-butyldimethylboron group, a triphenylboron group, and a phenylboron group, but is not limited thereto.

In the present disclosure, examples of a halogen group include fluorine, chlorine, bromine, or iodine.

In the present disclosure, the alkyl group may be straight-chain or branched-chain, and the carbon number thereof is not particularly limited, but is preferably 1 to 40. According to one embodiment, the carbon number of the alkyl group is 1 to 20. According to another embodiment, the carbon number of the alkyl group is 1 to 10. According to another embodiment, the carbon number of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl, and the like, but are not limited thereto.

In the present disclosure, the alkenyl group may be straight-chain or branched-chain, and the carbon number thereof is not particularly limited, but is preferably 2 to 40. According to one embodiment, the carbon number of the alkenyl group is 2 to 20. According to another embodiment, the carbon number of the alkenyl group is 2 to 10. According to still another embodiment, the carbon number of the alkenyl group is 2 to 6. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present disclosure, a cycloalkyl group is not particularly limited, but the carbon number thereof is preferably 3 to 60. According to one embodiment, the carbon number of the cycloalkyl group is 3 to 30. According to another embodiment, the carbon number of the cycloalkyl group is 3 to 20. According to still another embodiment, the carbon number of the cycloalkyl group is 3 to 6. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present disclosure, an aryl group is not particularly limited, but the carbon number thereof is preferably 6 to 60, and it may be a monocyclic aryl group or a polycyclic aryl group. According to one embodiment, the carbon number of the aryl group is 6 to 30. According to one embodiment, the carbon number of the aryl group is 6 to 20. The aryl group may be a phenyl group, a biphenyl group, a terphenyl group or the like as the monocyclic aryl group, but is not limited thereto. The polycyclic aryl group includes a naphthyl group, an anthryl group, a phenanthryl group, a pyrenyl group, a perylenyl group, a chrysenyl group, or the like, but is not limited thereto.

In the present disclosure, the fluorenyl group may be substituted, and two substituents may be linked with each other to form a spiro structure. In the case where the fluorenyl group is substituted,

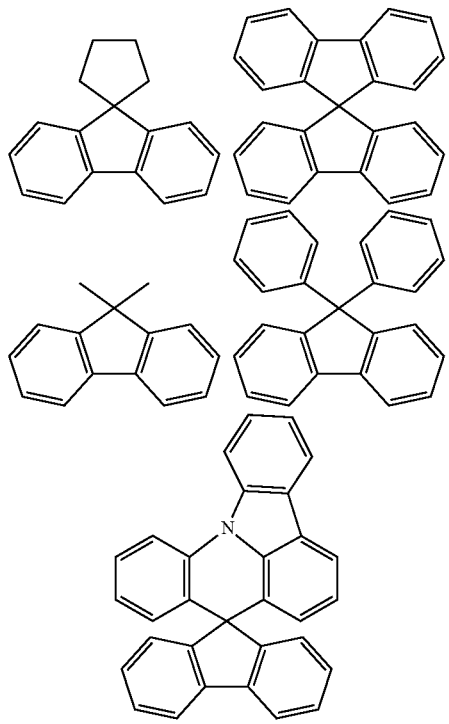

and the like can be formed. However, the structure is not limited thereto.

In the present disclosure, a heteroaryl group is a heteroaryl group containing at least one of O, N, Si and S as a heteroatom, and the carbon number thereof is not particularly limited, but is preferably 2 to 60. Examples of the heteroaryl group include xanthene, thioxanthene, a thiophene group, a furan group, a pyrrole group, an imidazole group, a thiazole group, an oxazol group, an oxadiazol group, a triazol group, a pyridyl group, a bipyridyl group, a pyrimidyl group, a triazine group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzoimidazole group, a benzothiazol group, a benzocarbazole group, a benzothiophene group, a dibenzothiophene group, a benzofuranyl group, a phenanthroline group, an isoxazolyl group, a thiadiazolyl group, a phenothiazinyl group, a dibenzofuranyl group, and the like, but are not limited thereto.

In the present disclosure, the aryl group in the aralkyl group, the aralkenyl group, the alkylaryl group, the arylamine group and the aryl silyl group is the same as the aforementioned examples of the aryl group. In the present disclosure, the alkyl group in the aralkyl group, the alkylaryl group and the alkylamine group is the same as the above-mentioned examples of the alkyl group. In the present disclosure, the heteroaryl group in the heteroarylamine group may be applied to the above-mentioned description of the heteroaryl group. In the present disclosure, the alkenyl group in the aralkenyl group is the same as the above-mentioned examples of the alkenyl group. In the present disclosure, the above-mentioned description of the aryl group may be applied except that the arylene is a divalent group. In the present disclosure, the above-mentioned description of the heteroaryl group can be applied except that the heteroarylene is a divalent group.

(Compound)

The present disclosure provides a compound represented by Chemical Formula 1.

The compound represented by Chemical Formula 1 has a structure in which two structures in square brackets are linked by a linker (L). Specifically, the compound represented by Chemical Formula 1 may exhibit excellent thermal stability and electrochemical stability due to the specificity of the structure compared to the compound represented by the following Chemical Formula X1 or X2 having only the structure in square brackets, and has the advantage in that it can be probabilistically more densely or more widely distributed than the compound represented by the following Chemical Formula X1 or X2 based on the same area. Accordingly, the compound can have high solubility in organic solvents, and at the same time, can improve the light emitting efficiency and lifetime characteristics of the organic light emitting device employing the compound.

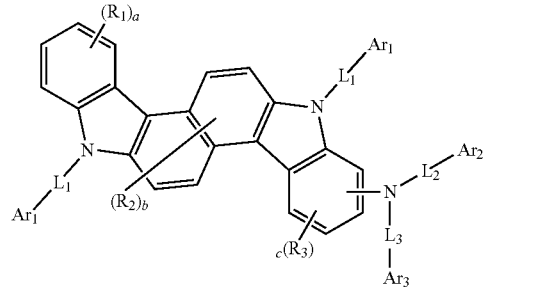

[Chemical Formula X1]

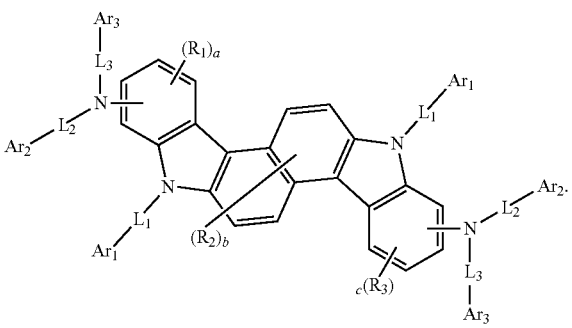

[Chemical Formula X2]

wherein in Chemical Formulas X1 and X2,
the description of each substituent group is as defined in Chemical Formula 1.

In particular, the compound represented by Chemical Formula 1 has high solubility in an organic solvent used in a solution process, for example, an organic solvent such as cyclohexanone, and thus is suitable for use in a large-area solution process such as an inkjet coating method using a solvent with a high boiling point.

Specifically, when the bonding site of L' is indicated on the compound represented by Chemical Formula 1, it may be represented by the following Chemical Formula 1':

[Chemical Formula 1']

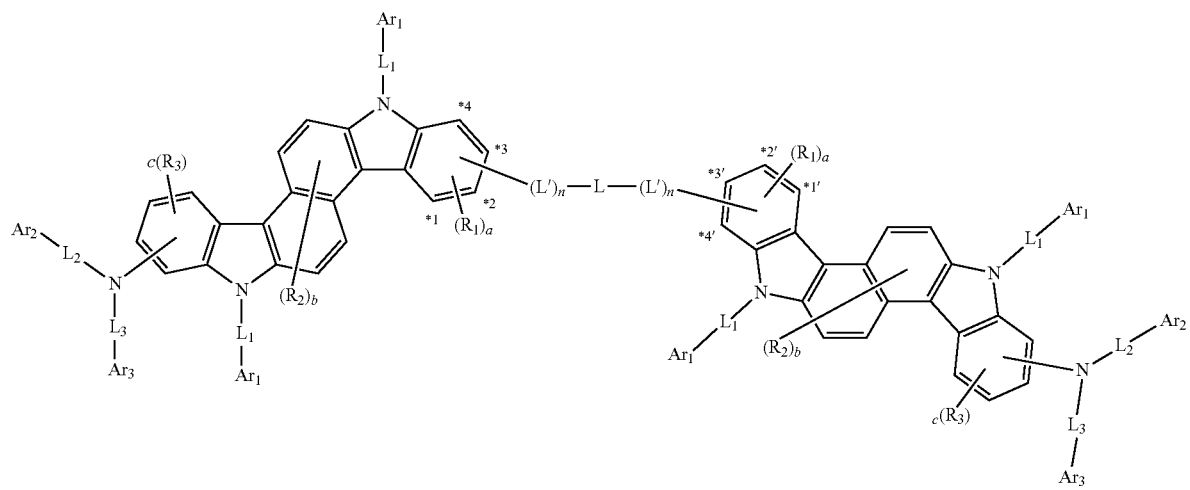

wherein in Chemical Formula 1', the description of each substituent group is as defined above, L' located on the left side of L may be bonded to any one of carbon at position *1, carbon at position *2, carbon at position *3, and carbon at position *4, and L' located on the right side of L may be bonded to any one of carbon at position *1', carbon at position *2', carbon at position *3', and carbon at position *4'.

More specifically, when the bonding site of L' located on the left side of L and the bonding site of L' located on the right side of L are represented by (the bonding site of L' located on the left side of L, the bonding site of L' located on the right side of L), (the bonding site of L' located on the left side of L, the bonding site of L' located on the right side of L) may be (positions *1, *1'), (positions *2, *2'), (positions *3, *3'), or (positions *4, *4').

Accordingly, the compound may be represented by any one of the following Chemical Formulas 1-1 to 1-4:

[Chemical Formula 1-1]

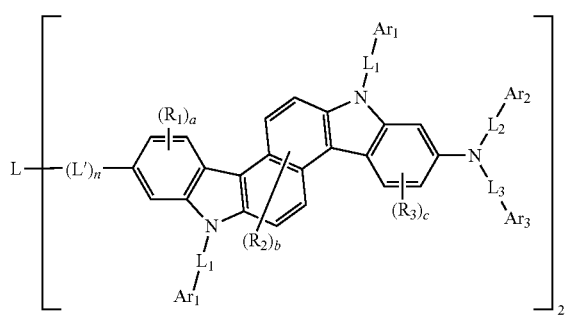

[Chemical Formula 1-2]

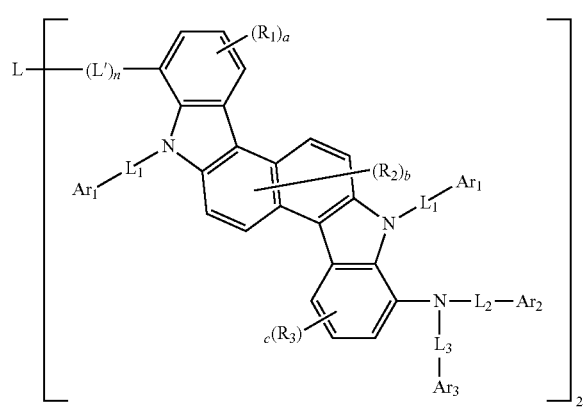

[Chemical Formula 1-3]

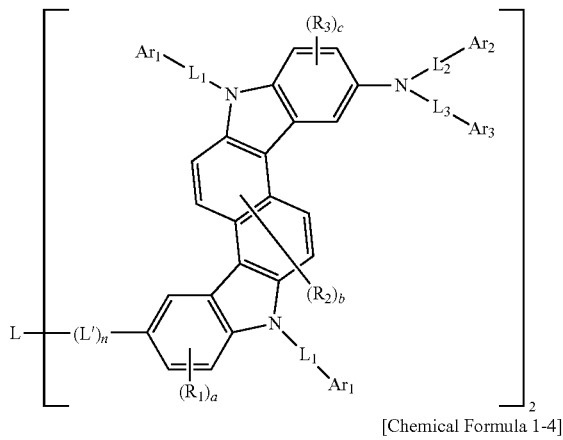

[Chemical Formula 1-4]

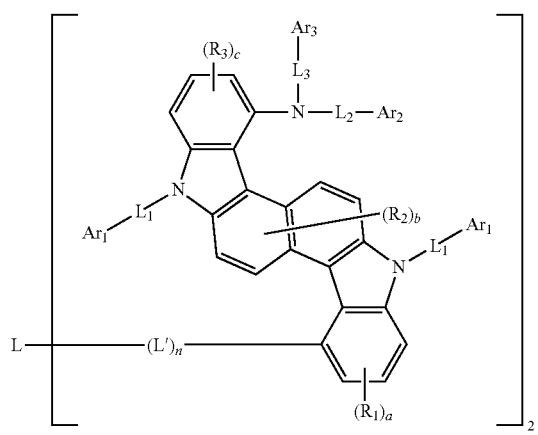

wherein in Chemical Formulas 1-1 to 1-4,

L, L', n, $L_1$ to $L_3$, $Ar_1$ to $Ar_3$, $R_1$ to $R_3$, a, b and c are as defined in Chemical Formula 1.

Meanwhile, in Chemical Formula 1, the linker (L) is a single bond; O; S; $N(Z_1)$; $C(Z_2)(Z_3)$; a substituted or unsubstituted $C_{6-60}$ arylene; or a substituted or unsubstituted $C_{2-60}$ heteroarylene containing at least one heteroatom selected among N, O and S, and L' is a single bond; or $N(Z_4)$, and n is 0 or 1.

In this case, when L is a single bond, O, S, $N(Z_1)$, or $C(Z_2)(Z_3)$, n is 0, and when L is a substituted or unsubstituted $C_{6-60}$ arylene, or a substituted or unsubstituted $C_{2-60}$ heteroarylene containing at least one heteroatom selected among N, O and S, n is 0 or 1.

Specifically, L is a single bond; O; S; $N(Z_1)$; $C(Z_2)(Z_3)$; a $C_{6-20}$ arylene which is unsubstituted or substituted with one or more substituents selected from the group consisting of deuterium and $C_{1-10}$ alkyl; or a $C_{2-20}$ heteroarylene containing at least one heteroatom selected among N, O and S which is unsubstituted or substituted with one or more substituent groups selected from the group consisting of deuterium and a $C_{1-10}$ alkyl, and L' is a single bond; or $N(Z_4)$, wherein $Z_1$ to $Z_4$ may be each independently hydrogen; deuterium; a $C_{1-10}$ alkyl; a $C_{6-20}$ aryl which is unsubstituted or substituted with one or more substituents selected from the group consisting of deuterium, a $C_{1-10}$ alkyl, benzofuranyl and benzothiophenyl; or a $C_{2-20}$ heteroaryl containing at least one heteroatom selected among N, O and S which is unsubstituted or substituted with one or more substituents selected from the group consisting of deuterium, a $C_{1-10}$ alkyl, benzofuranyl and benzothiophenyl.

Specifically, $Z_1$ to $Z_4$ may be each independently phenyl which is unsubstituted or substituted with one or more substituents selected from the group consisting of a $C_{1-10}$ alkyl, benzofuranyl and benzothiophenyl; naphthyl which is unsubstituted or substituted with one or more substituents selected from the group consisting of a $C_{1-10}$ alkyl, benzofuranyl and benzothiophenyl; or dibenzofuranyl which is unsubstituted or substituted with one or more substituents selected from the group consisting of a $C_{1-10}$ alkyl, benzofuranyl and benzothiophenyl.

Further, the $Z_1$ to $Z_4$ may be substituted with one or more substituents, preferably one substituent, selected from the group consisting of deuterium, methyl, ethyl, n-propyl, isopropyl, n-butyl, isobutyl, sec-butyl, tert-butyl, methylphenyl, ethylphenyl, tert-butylphenyl, benzofuranyl and benzothiophenyl, but are not limited thereto.

L is a single bond; O; or $N(Z_1)$, n is 0; or
L is a $C_{6-20}$ arylene, and n is 0, or 1.
And, L is a single bond; O; or $N(Z_1)$, n is 0; or
L is a $C_{6-20}$ arylene, and n is 0, or 1, provided that when n is 1, L' is $N(Z_4)$,
wherein $Z_1$ to $Z_4$ may be each independently phenyl which is unsubstituted or substituted with one substituent selected from the group consisting of methyl, tert-butyl and benzofuranyl; naphthyl which is unsubstituted or substituted with one substituent selected from the group consisting of methyl, tert-butyl and benzofuranyl; dibenzofuranyl which is unsubstituted or substituted with one substituent selected from the group consisting of methyl, tert-butyl and benzofuranyl.

For example, L may be a single bond, or any one selected from the group consisting of:

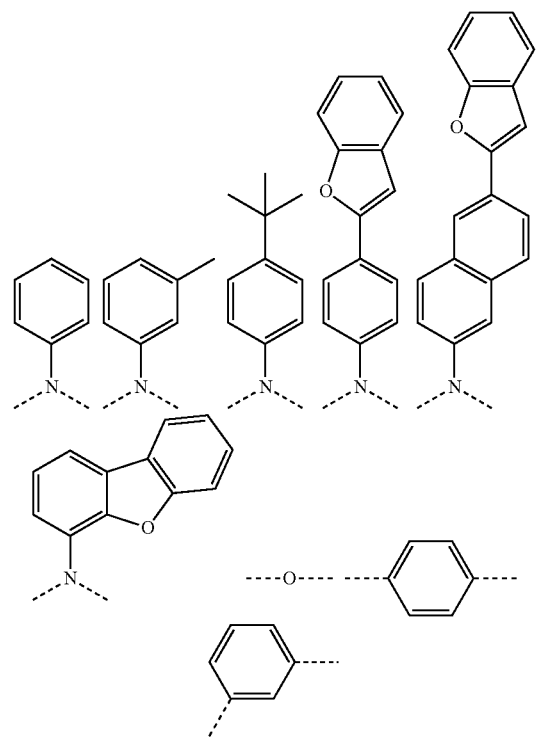

Further, the $-(L')_n-$ may be a single bond,

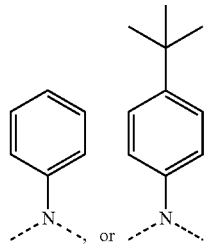

Further, in Chemical Formula 1, $L_1$ to $L_3$ may be each independently a single bond, phenylene, or naphthylene.

Specifically, $L_1$ and $L_2$ may be a single bond, and $L_3$ may be a single bond, phenylene, or naphthylene.

More specifically, $L_1$ and $L_2$ may be a single bond, and $L_3$ may be a single bond, or

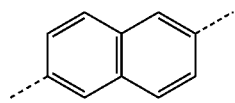

Further, in Chemical Formula 1, $Ar_1$ to $Ar_3$ may be each independently a $C_{6-20}$ aryl which is unsubstituted or substituted with one or more substituents selected from the group consisting of deuterium, a $C_{1-10}$ alkyl, a $C_{6-20}$ aryl, a $Si(C_{1-10}$ alkyl$)_3$ and a $Si(C_{6-20}$ aryl$)_3$; or a $C_{2-20}$ heteroaryl containing 1 or 2 heteroatoms selected among N, O and S which is unsubstituted or substituted with one or more substituents selected from the group consisting of deuterium, a $C_{1-10}$ alkyl, a $C_{6-20}$ aryl, a $Si(C_{1-10}$ alkyl$)_3$ and a $Si(C_{6-20}$ aryl$)_3$.

Specifically, $Ar_1$ to $Ar_3$ may be each independently a $C_{6-20}$ aryl which is unsubstituted or substituted with one or more substituents selected from the group consisting of deuterium, methyl, tert-butyl, phenyl and a $Si(phenyl)_3$; or a $C_{2-20}$ heteroaryl containing one heteroatom of N, O and S which is unsubstituted or substituted with one or more substituents selected from the group consisting of deuterium, methyl, tert-butyl, phenyl and $Si(phenyl)_3$.

More specifically, $Ar_1$ and $Ar_2$ may be each independently phenyl which is unsubstituted or substituted with one substituent selected from the group consisting of deuterium, methyl, tert-butyl, phenyl and $Si(phenyl)_3$; or naphthyl which is unsubstituted or substituted with one substituent selected from the group consisting of deuterium, methyl, tert-butyl, phenyl and $Si(phenyl)_3$.

$Ar_3$ may be phenyl which is unsubstituted or substituted with one substituent selected from the group consisting of deuterium, methyl, tert-butyl, phenyl and $Si(phenyl)_3$; dimethyl fluorenyl; phenylcarbazolyl; dibenzofuranyl; dibenzothiophenyl; benzofuranyl; or benzothiophenyl.

For example,
$Ar_1$ and $Ar_2$ may be each independently

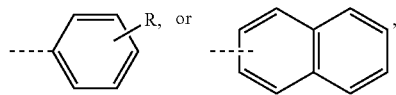

wherein R may be methyl, or tert-butyl.

Further, Ar₃ may be any one selected from the group consisting of:

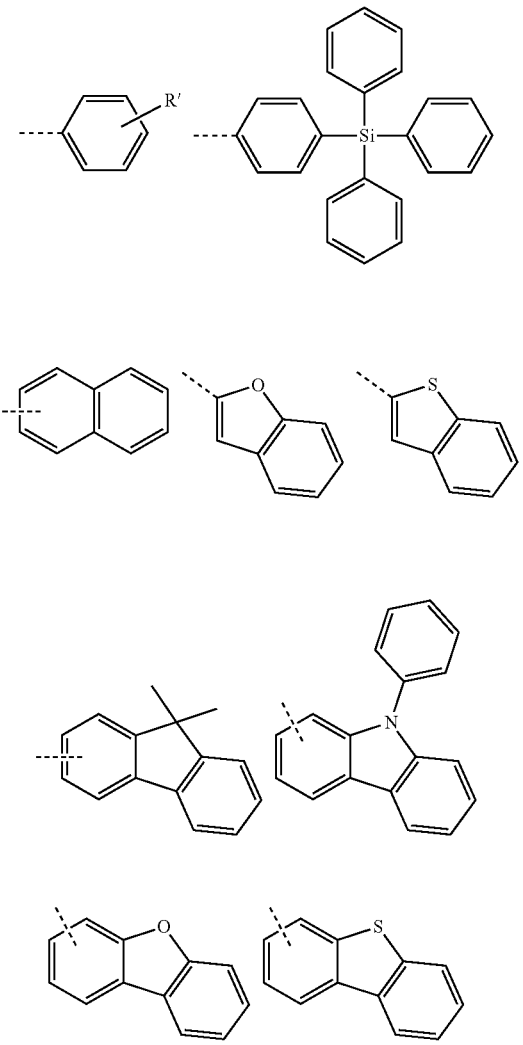

wherein R' is methyl, or tert-butyl.

Further, in Chemical Formula 1, $R_1$ to $R_3$ may be each independently deuterium; halogen; cyano; a $C_{1-10}$ alkyl; or a $C_{6-20}$ aryl. In this case, a, which means the number of $R_1$, is 0, 1, 2, or 3, b, which means the number of $R_2$, is 0, 1, 2, 3, or 4, and c, which means the number of $R_3$, is 0, 1, 2, or 3.

For example, $R_1$ to $R_3$ may be each independently deuterium, a may be 0 or 3, b may be 0 or 4, and c may be 0 or 3, but is not limited thereto.

Further, in Chemical Formula 1,

For each occurrence, L' may be identical to each other, n may be identical to each other, $L_1$ may be identical to each other, $L_2$ may be identical to each other, $L_3$ may be identical to each other, $Ar_1$ may be identical to each other, $Ar_2$ may be the same as each other, $Ar_3$ may be identical to each other, $R_1$ may be identical to each other, $R_2$ may be identical to each other, $R_3$ may be identical to each other, a may be identical to each other, b may be identical to each other, and c may be identical to each other.

For example, in Chemical Formula 1, the structures in two square brackets ([ ]) may be identical to each other. In other words, the structures in the two square brackets ([ ]) of Chemical Formula 1:

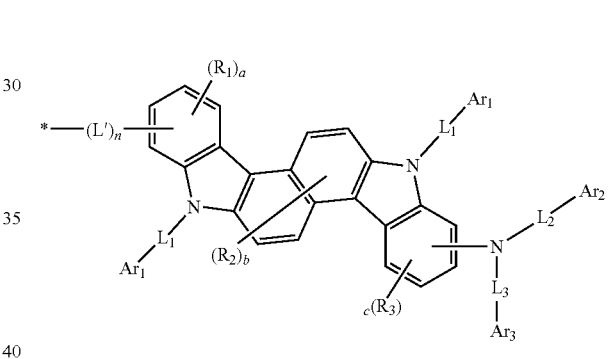

may be identical to each other, wherein * means a site bonding with L.

Further, the compound may be represented by any one of the following Chemical Formulas 1-1-1 to 1-4-1:

[Chemical Formula 1-1-1]

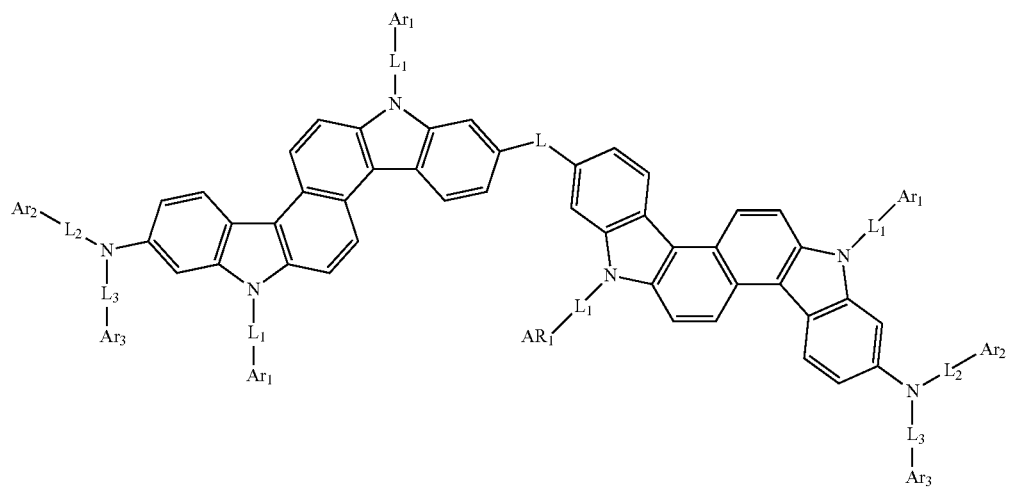

-continued
[Chemical Formula 1-2-1]
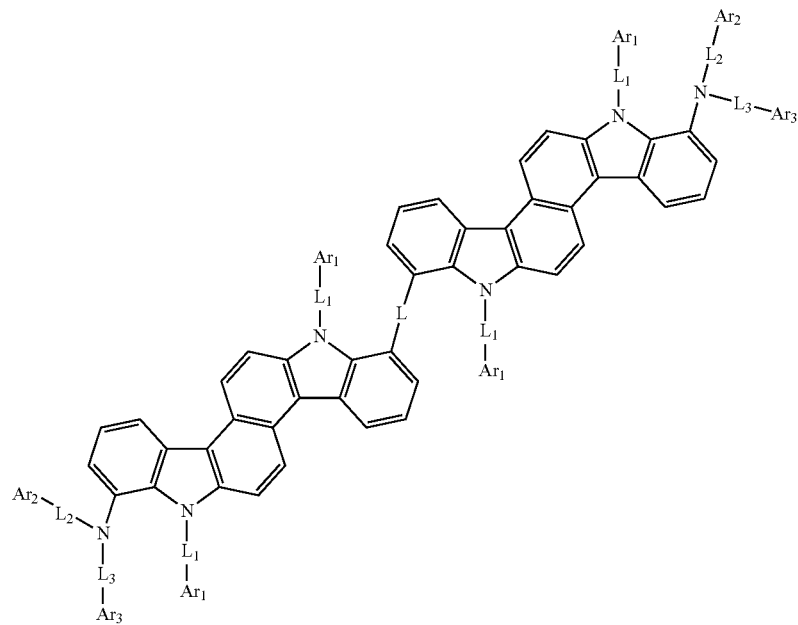
[Chemical Formula 1-3-1]
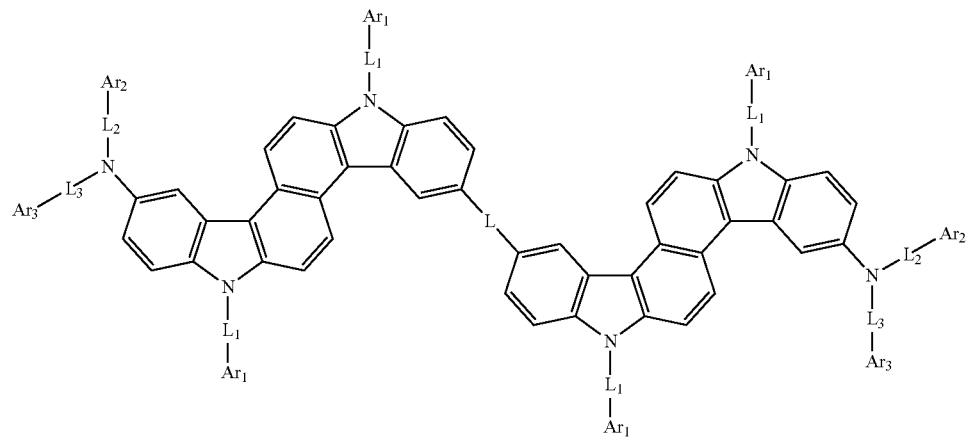
[Chemical Formula 1-4-1]
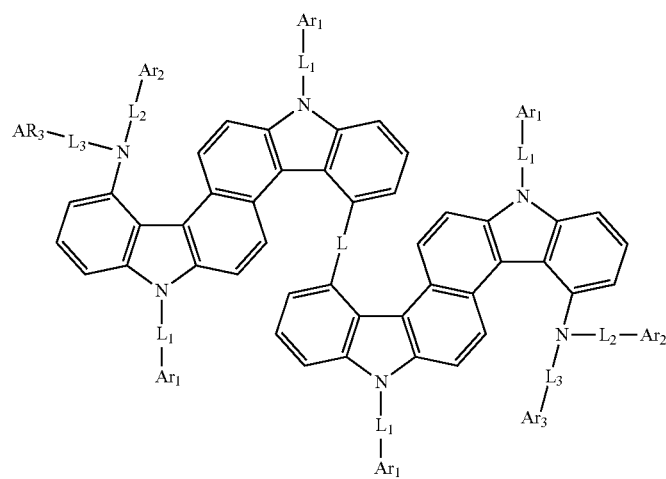

wherein in Chemical Formulas 1-1-1 to 1-4-1,
L is a single bond; O; N($Z_1$); or a $C_{6-20}$ arylene,
$Z_1$, $L_1$ to $L_3$ and $Ar_1$ to $Ar_3$ are as defined in Chemical Formula 1.

In Chemical Formula 1-1-1, for each occurrence, $L_1$ may be identical to each other, $L_2$ may be identical to each other, $L_3$ may be identical to each other, $Ar_1$ may be identical to each other, $Ar_2$ may be identical to each other, and $Ar_3$ may be identical to each other. Thereby, the compound of Chemical Formula 1-1-1 may have a dimer structure.

Representative examples of the compound represented by Chemical Formula 1 are as follows:

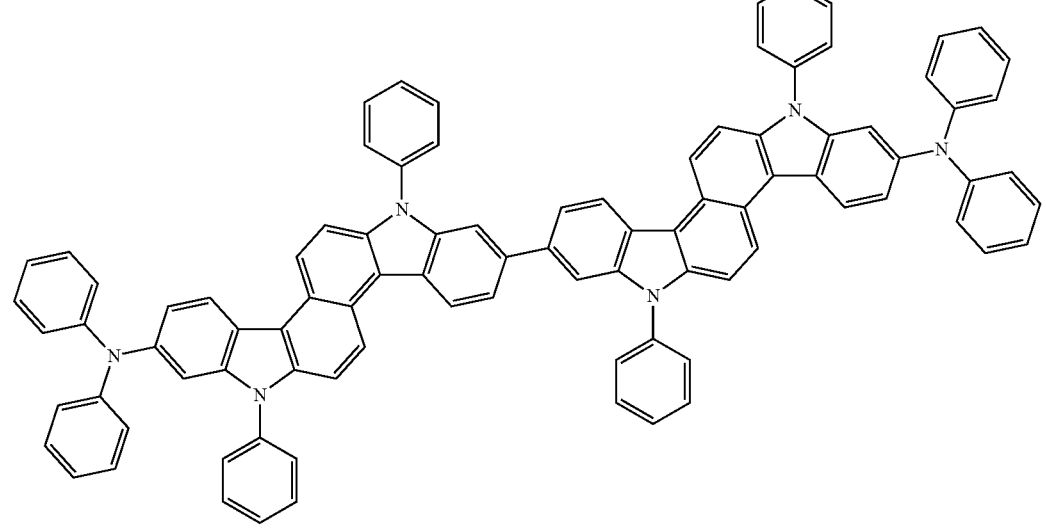

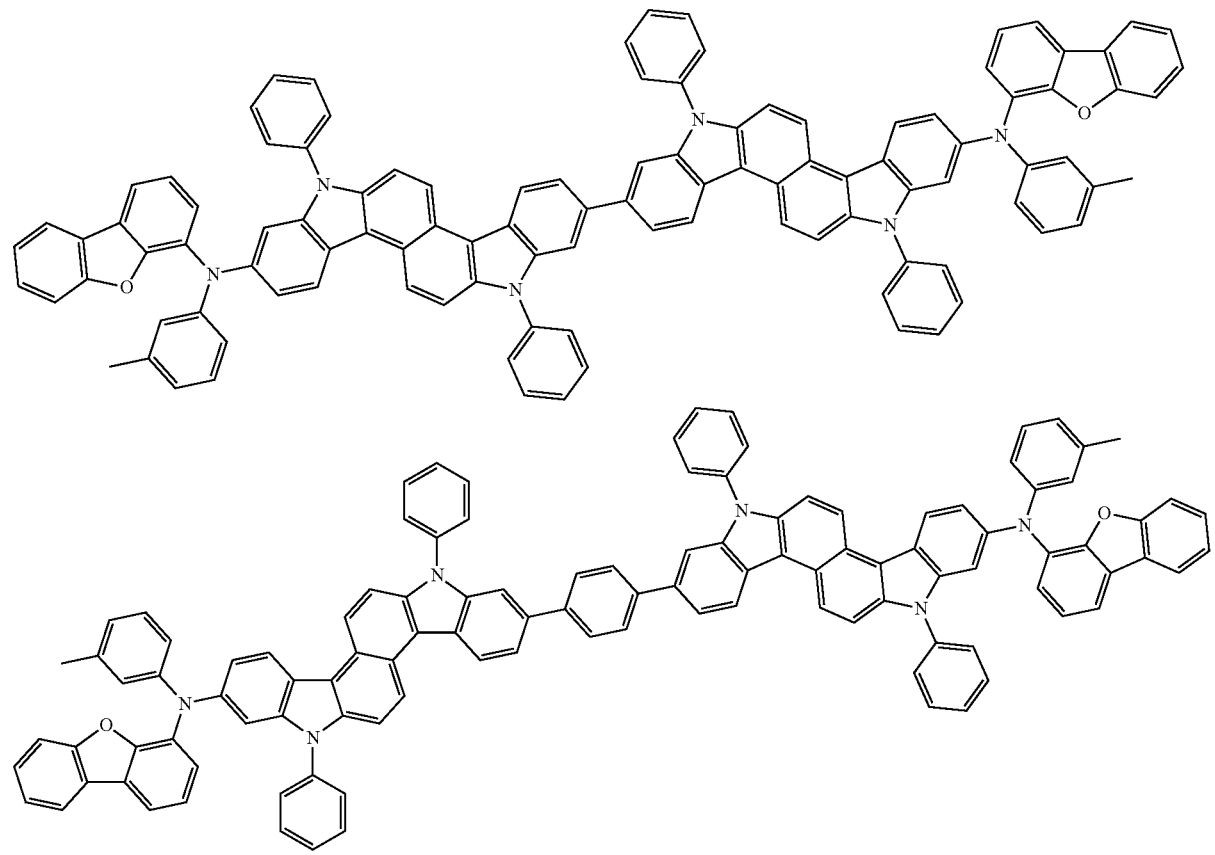

-continued
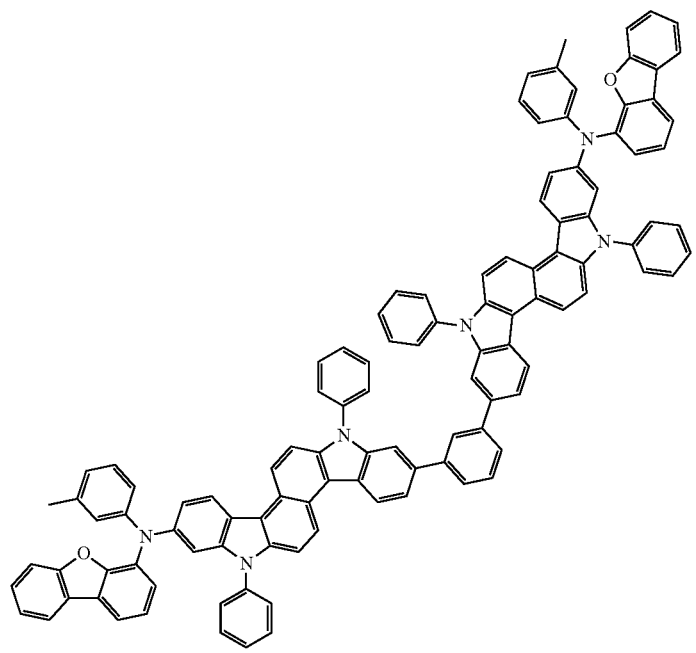
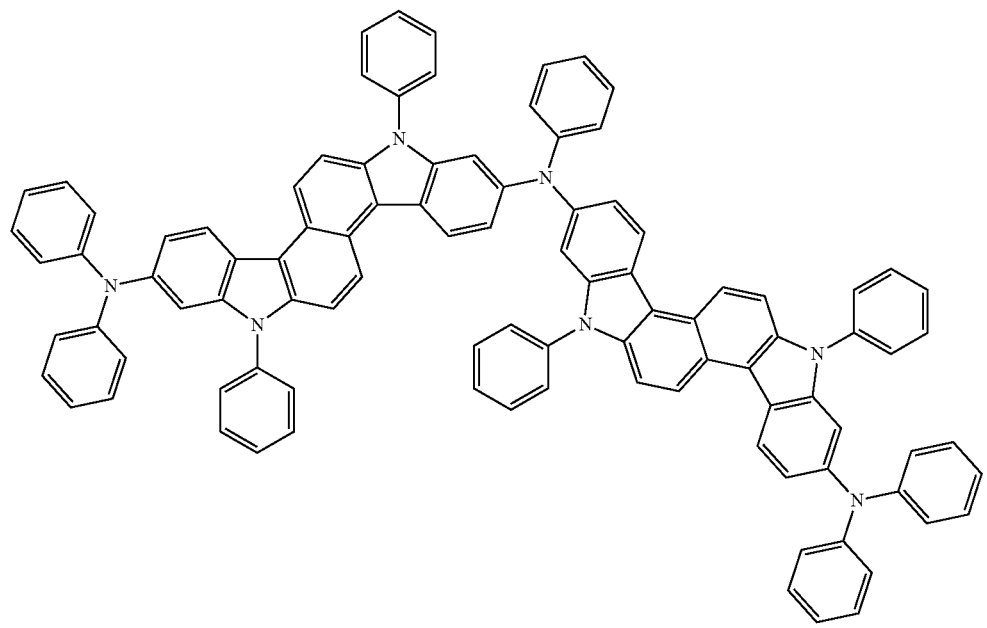

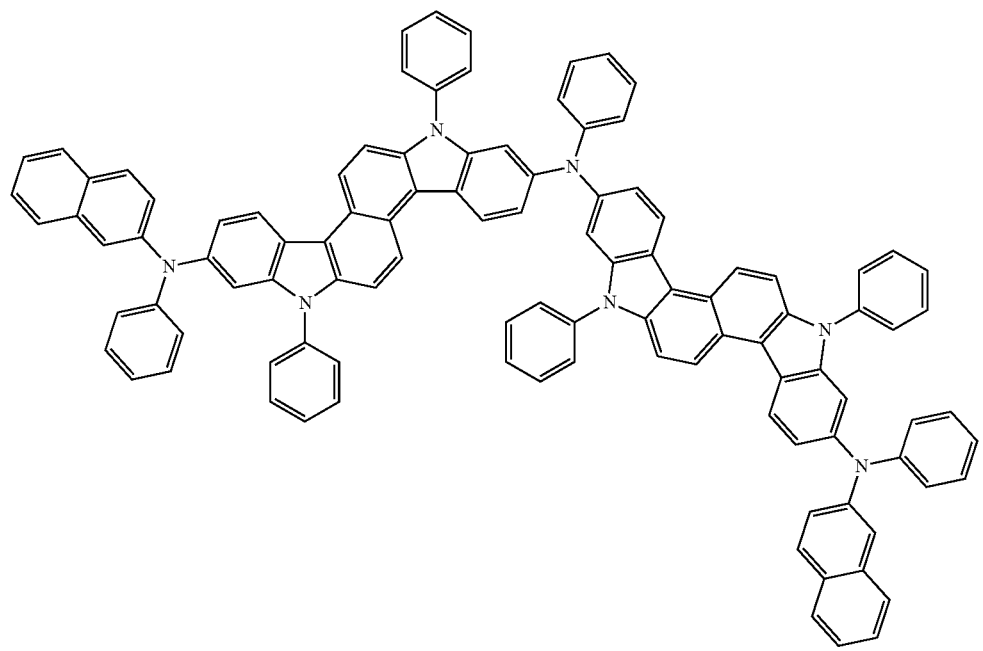
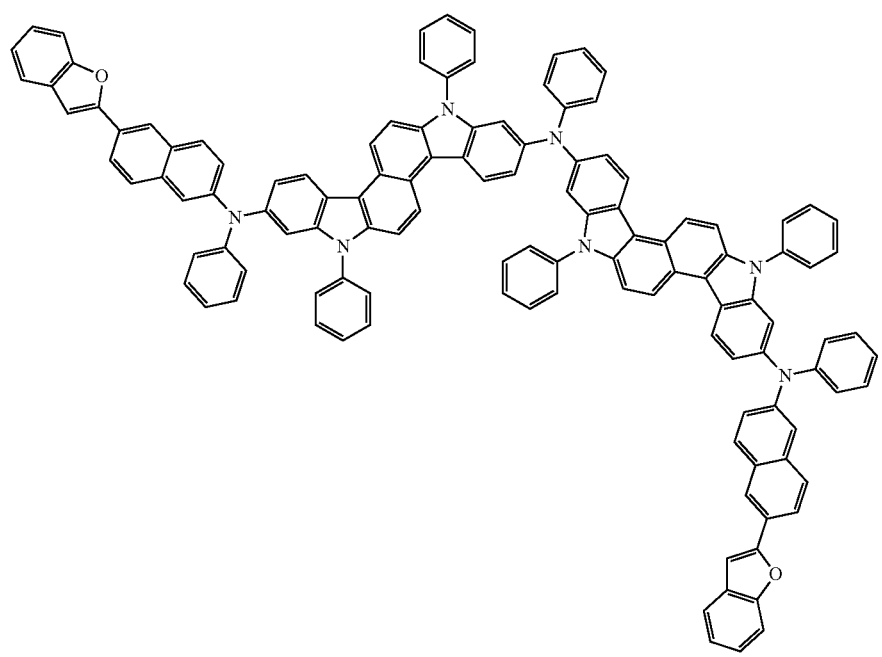

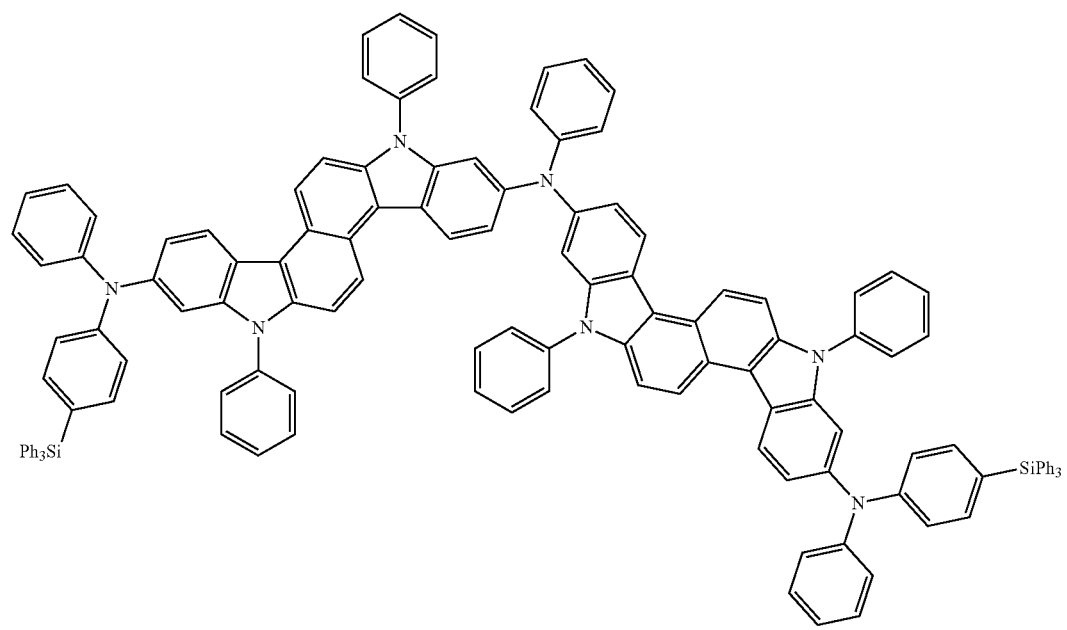
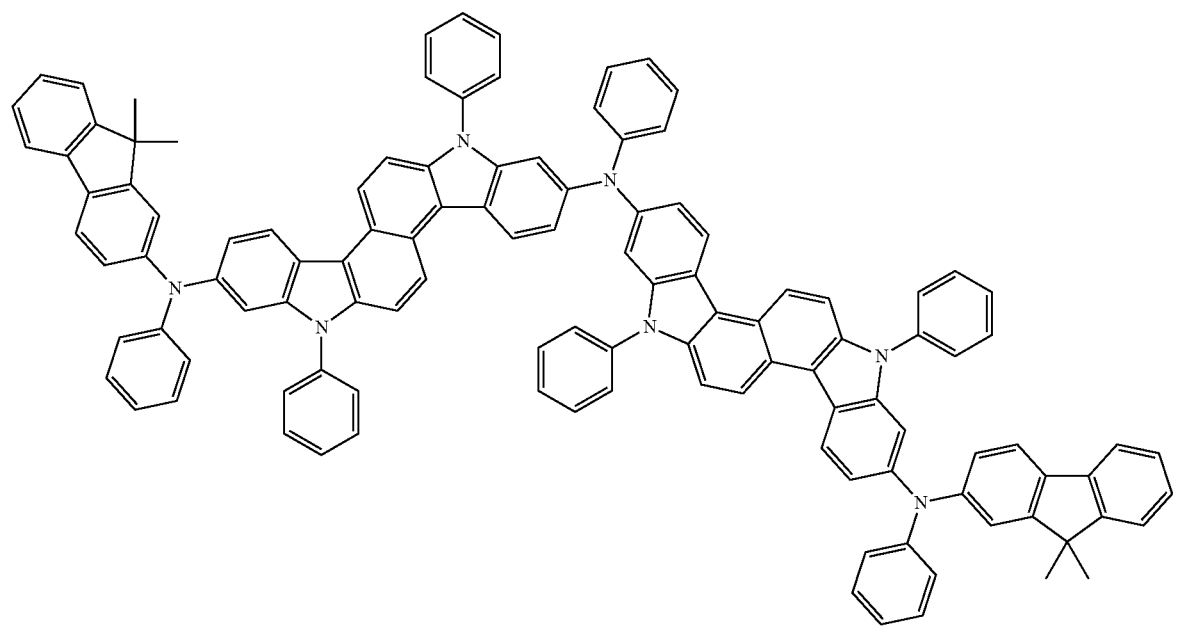

-continued
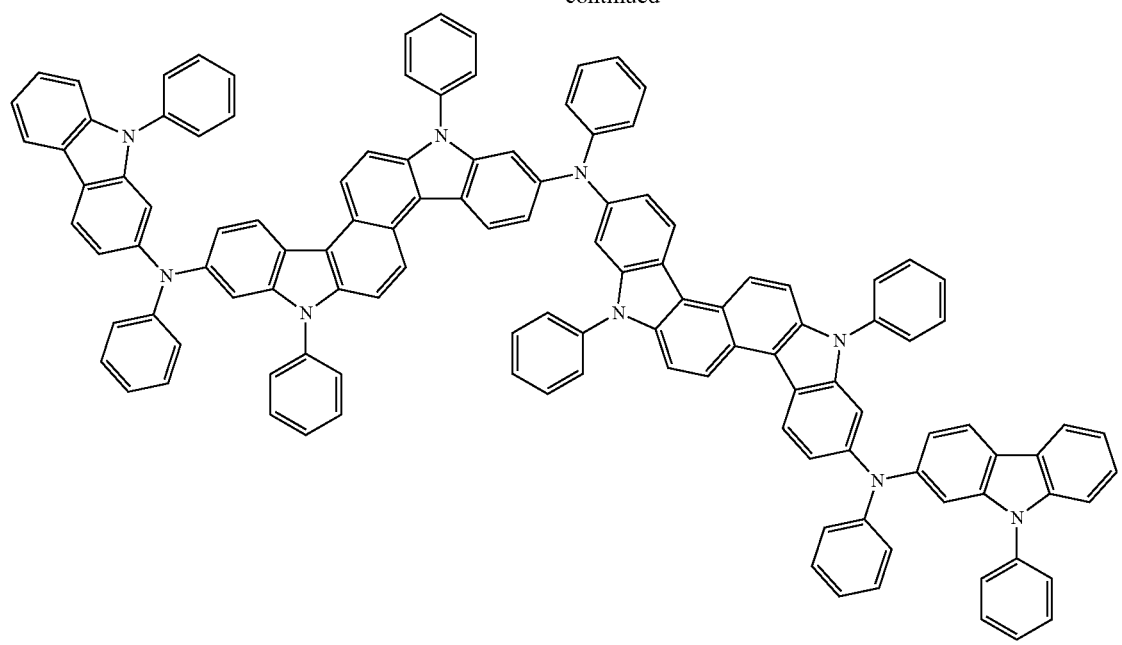
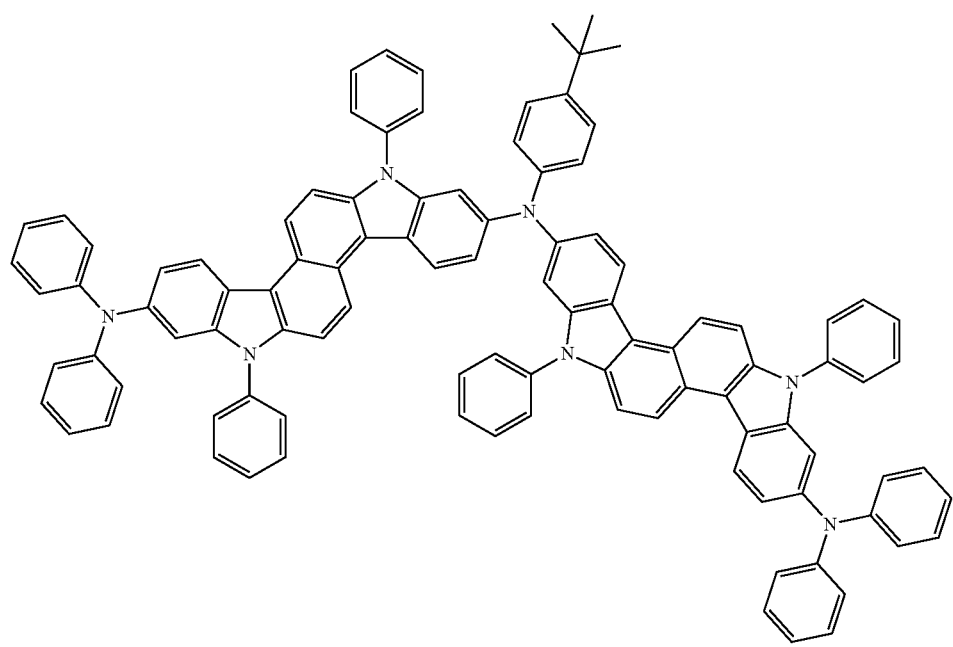

-continued
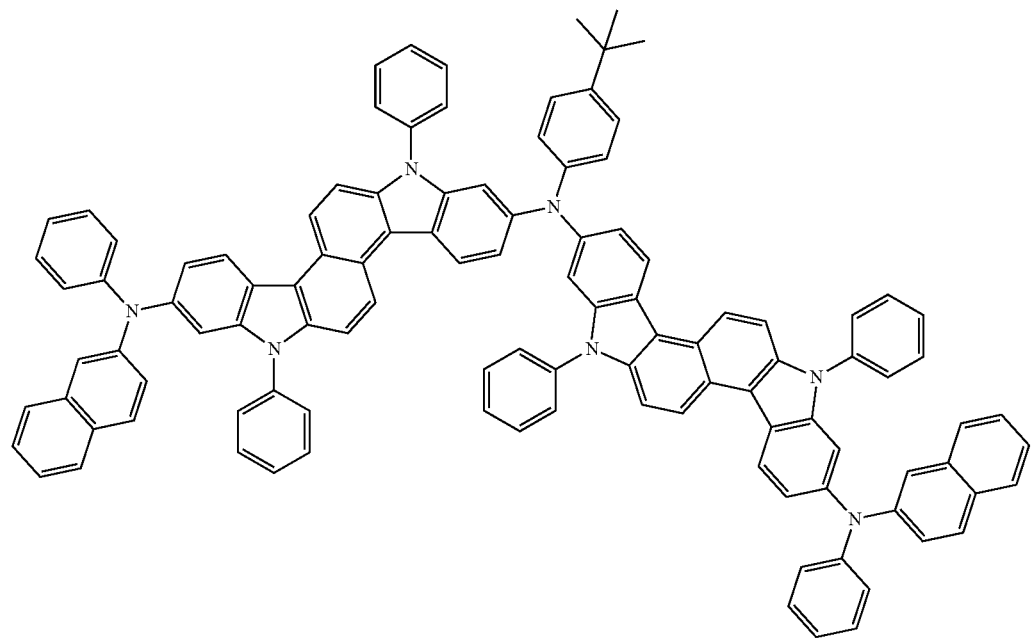
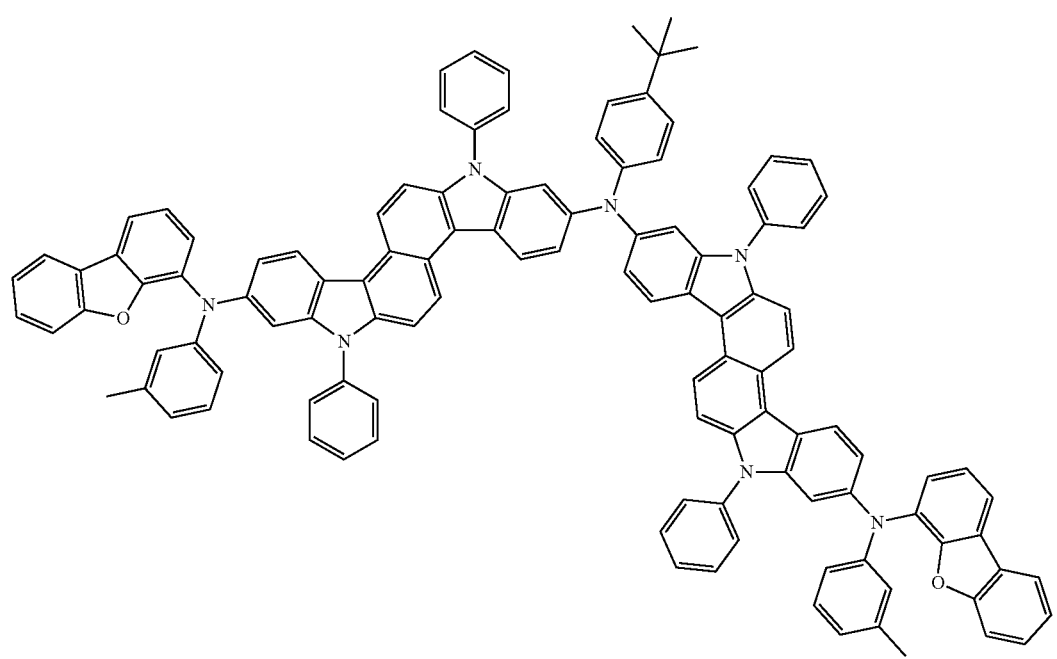

-continued
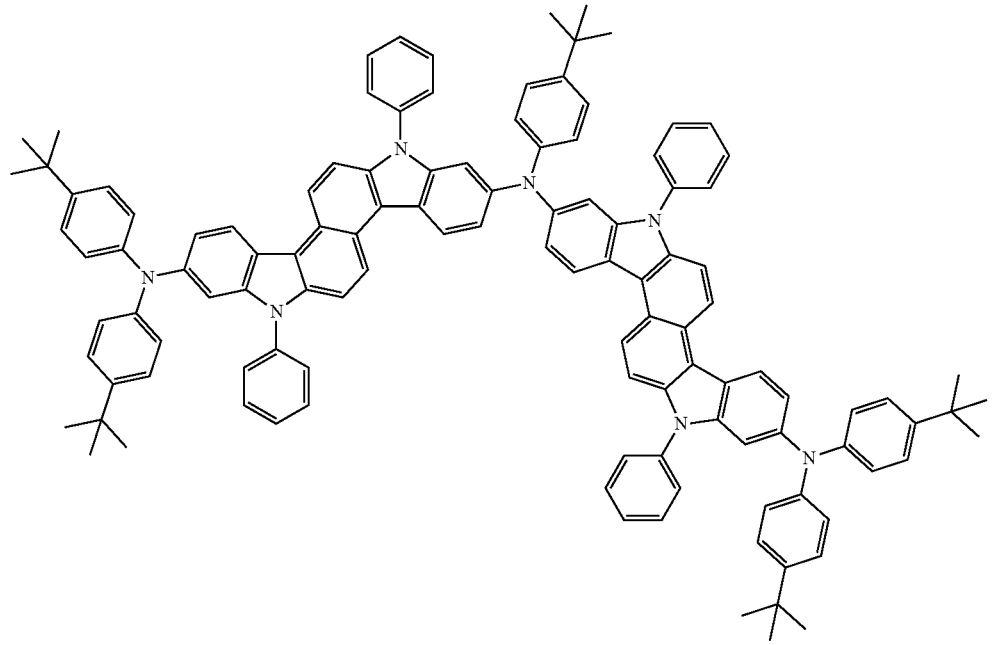
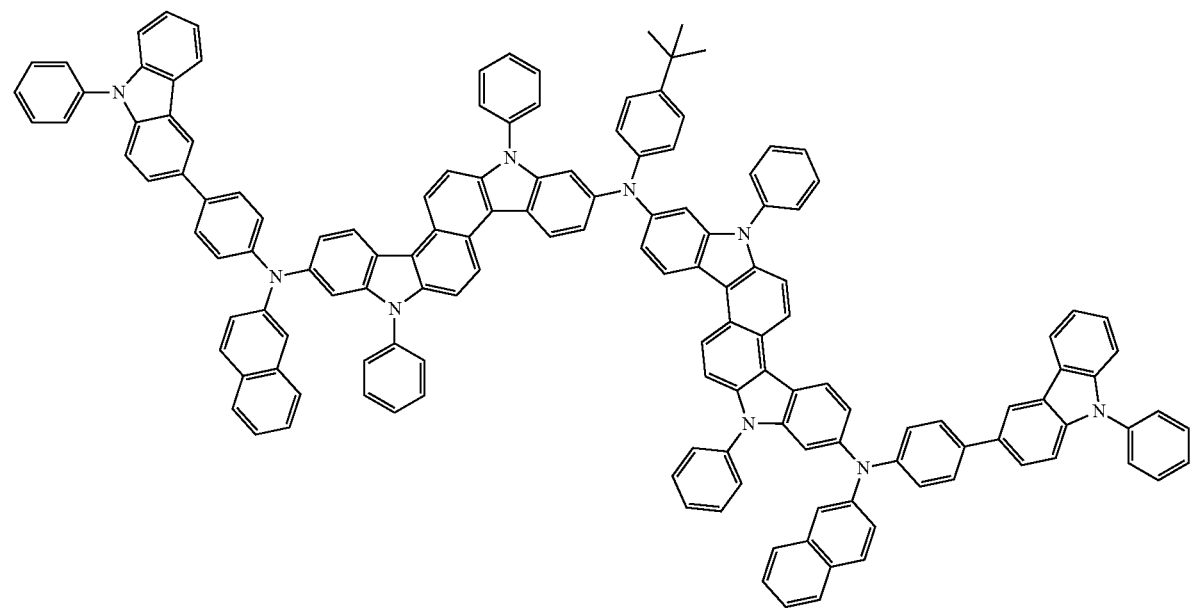

-continued
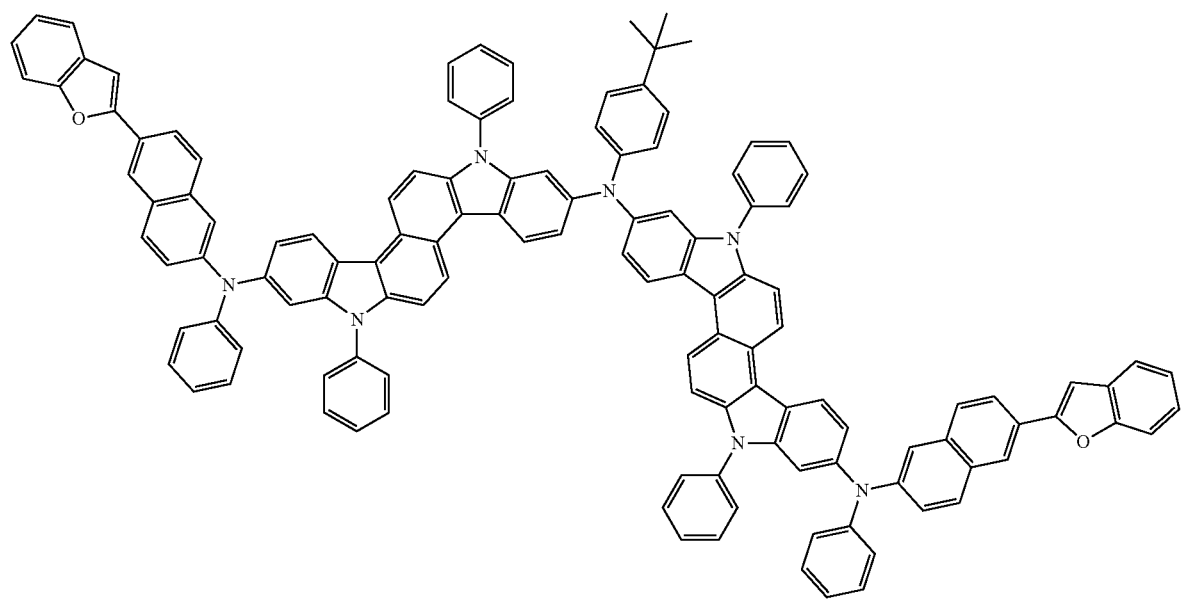
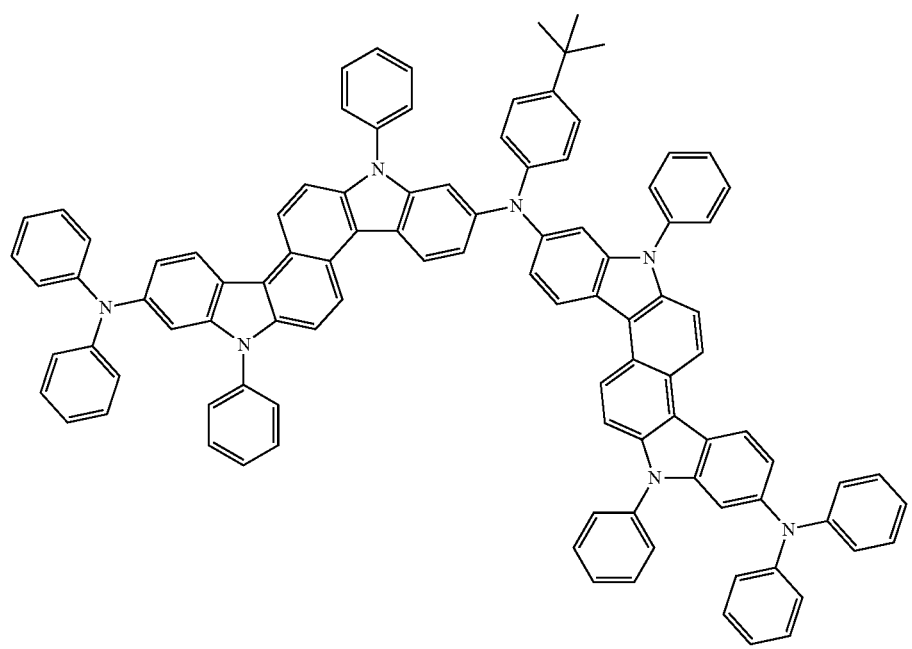

-continued
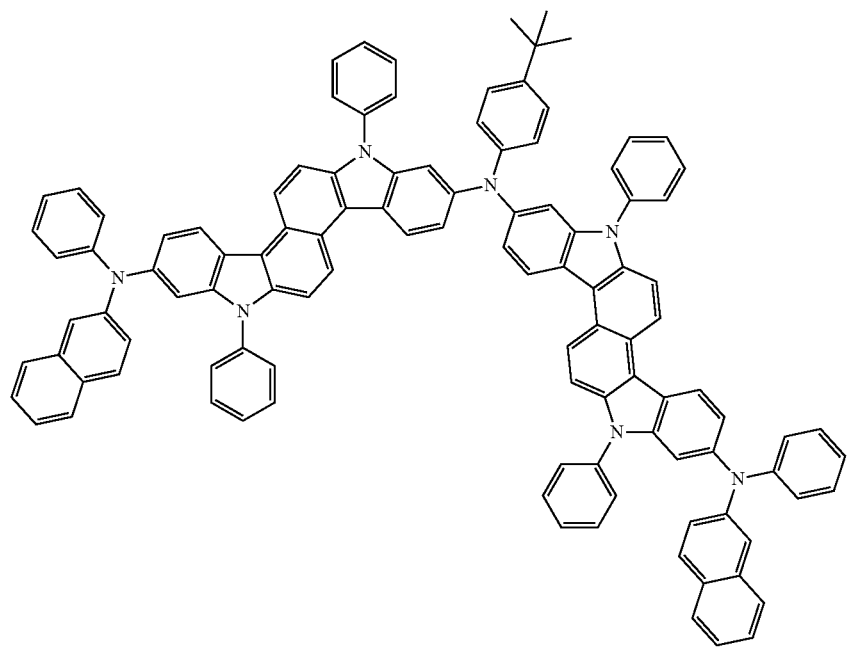
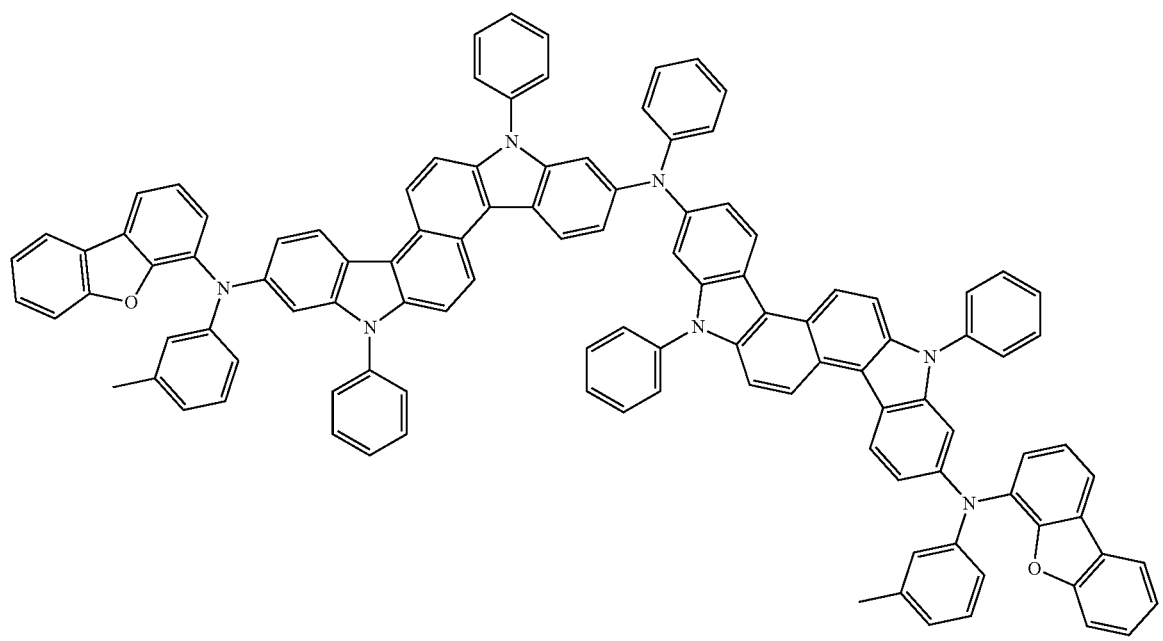

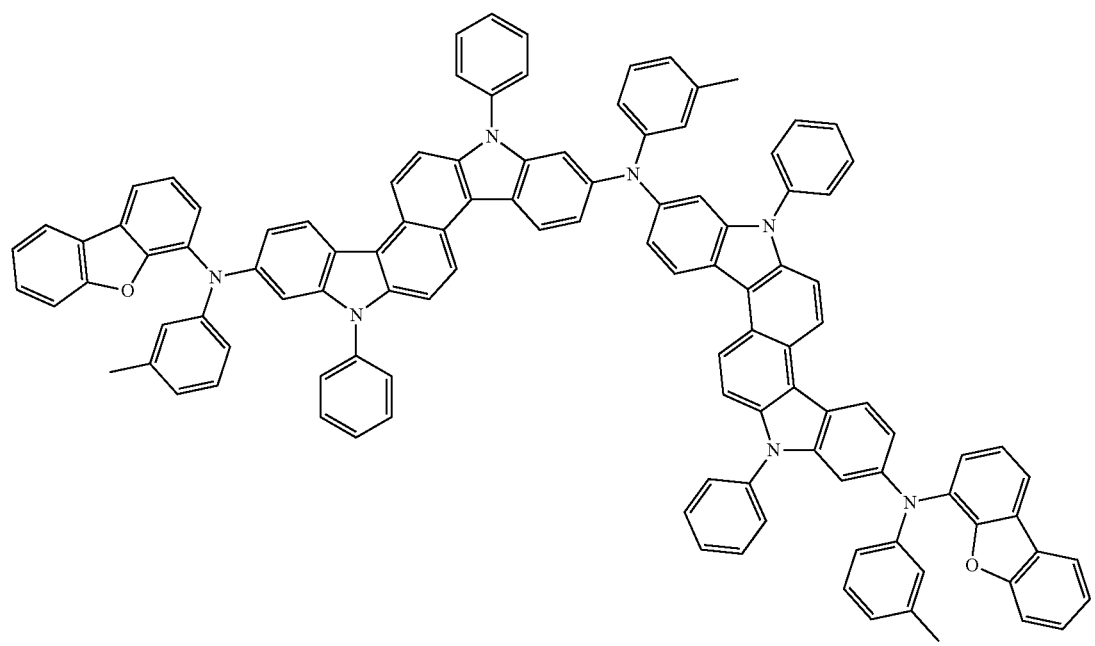
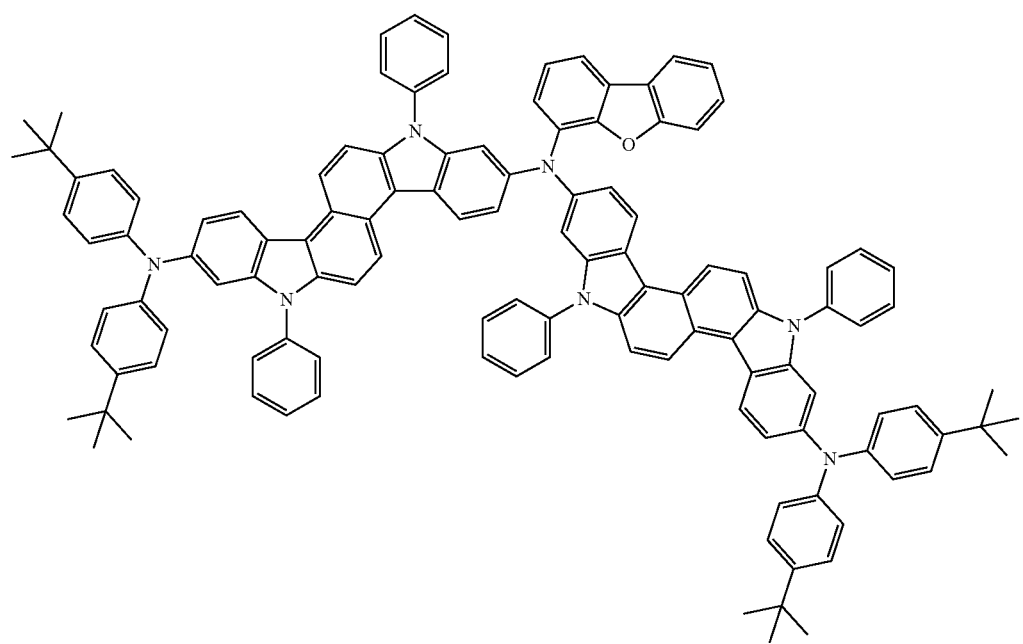

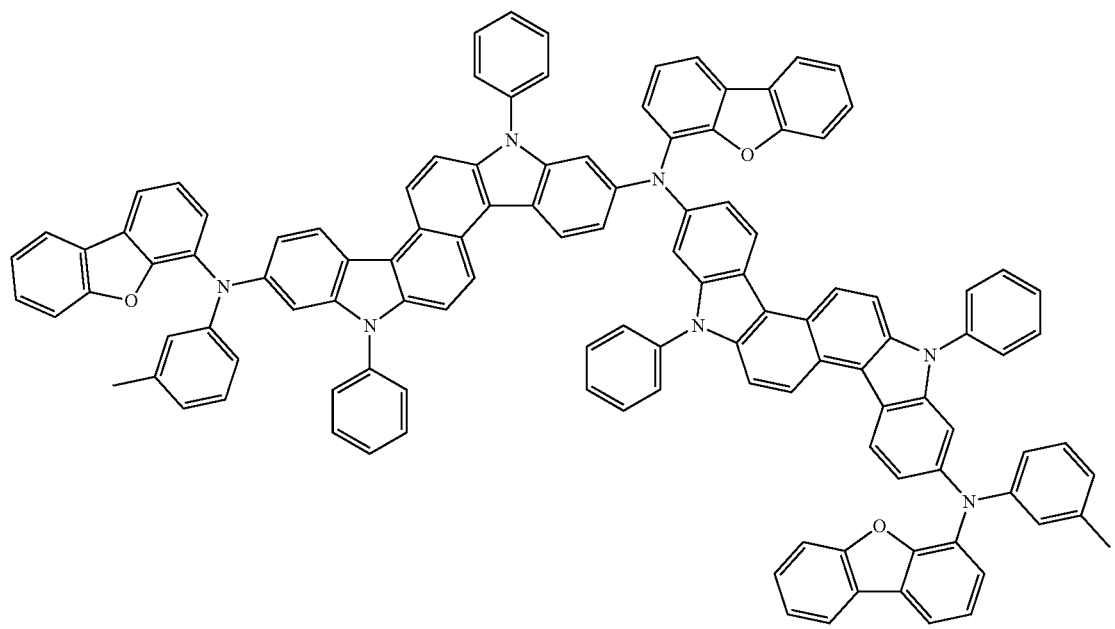
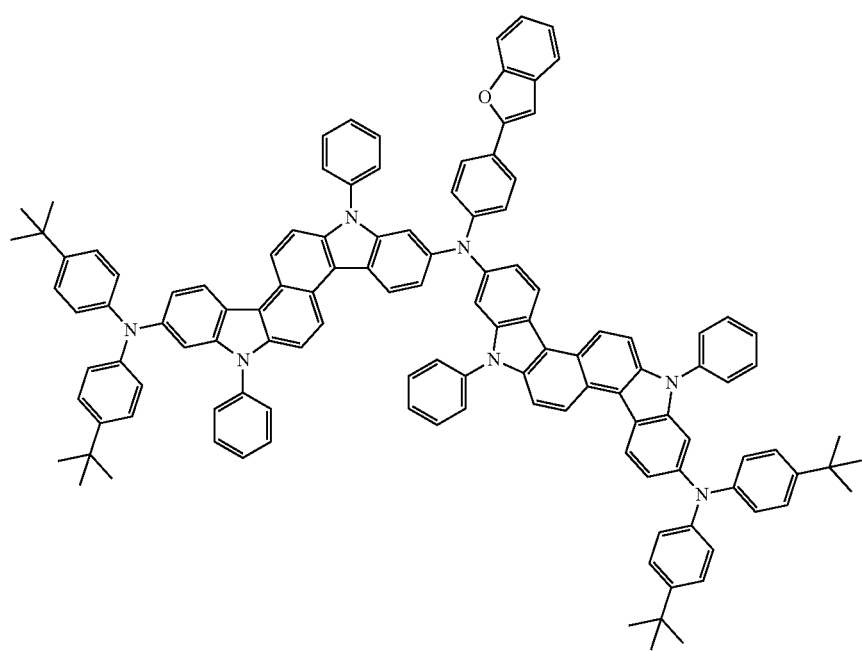

-continued
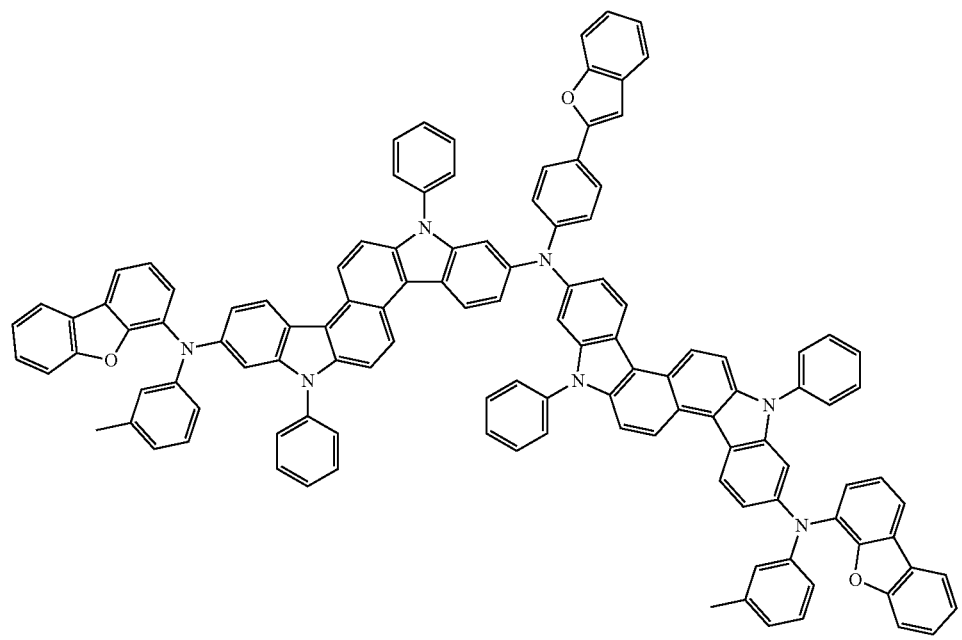
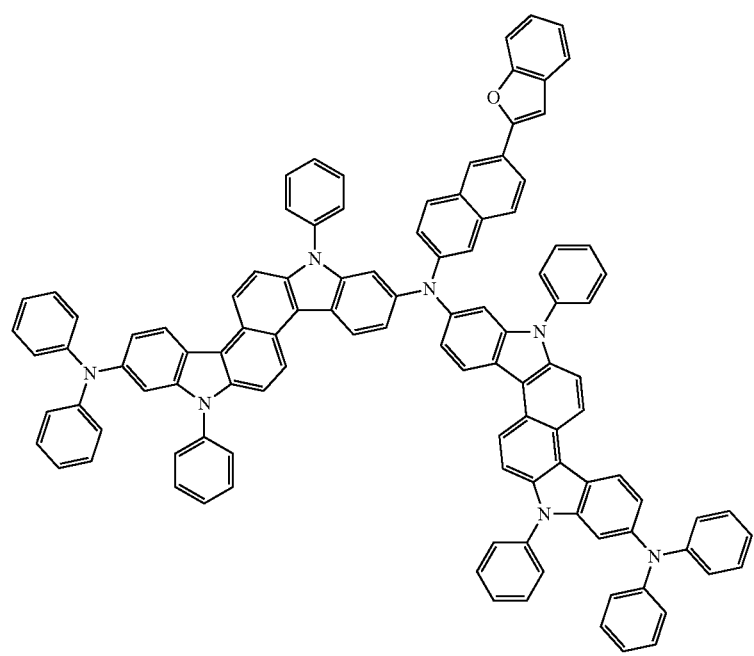

-continued
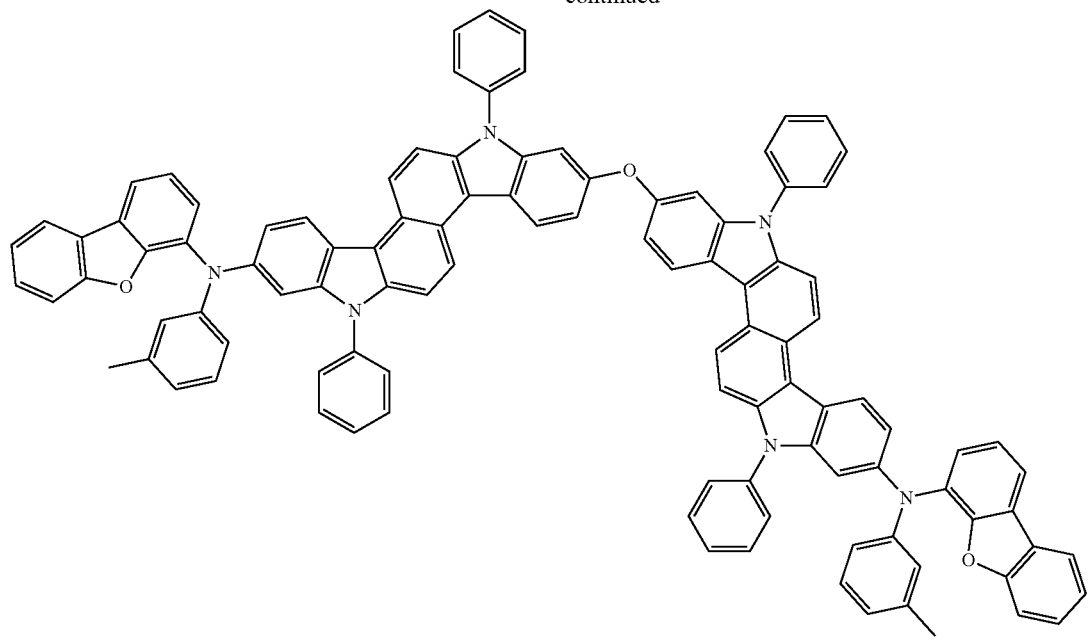
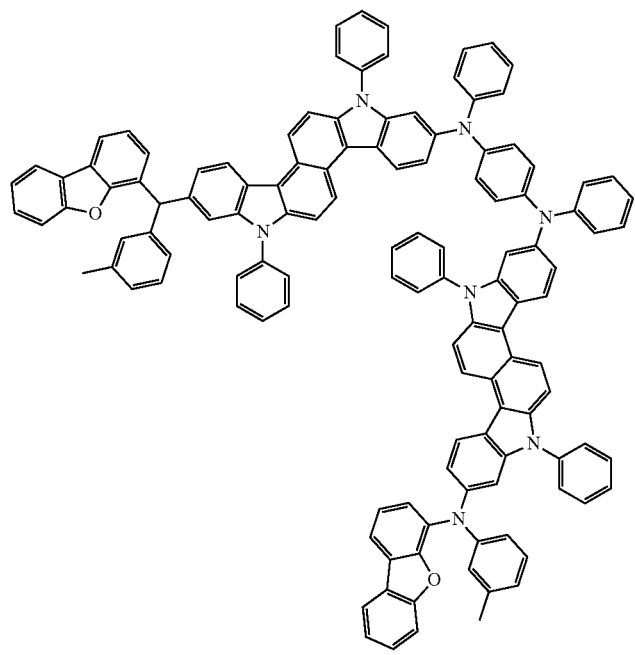

-continued
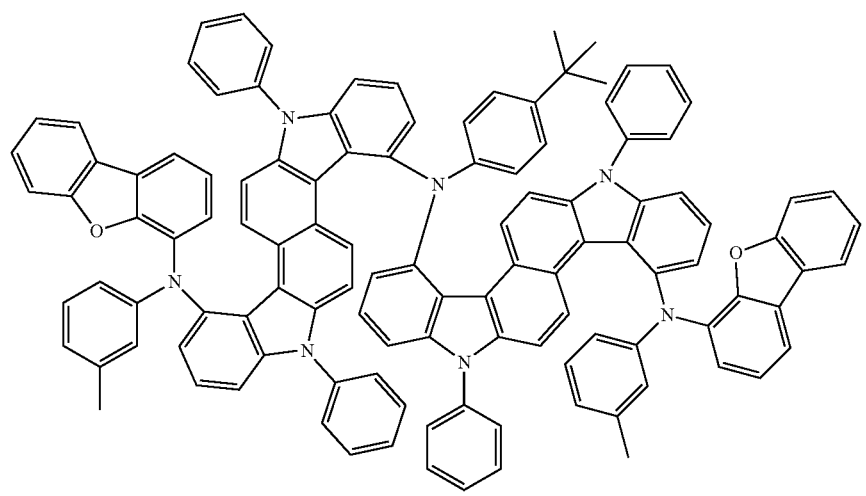
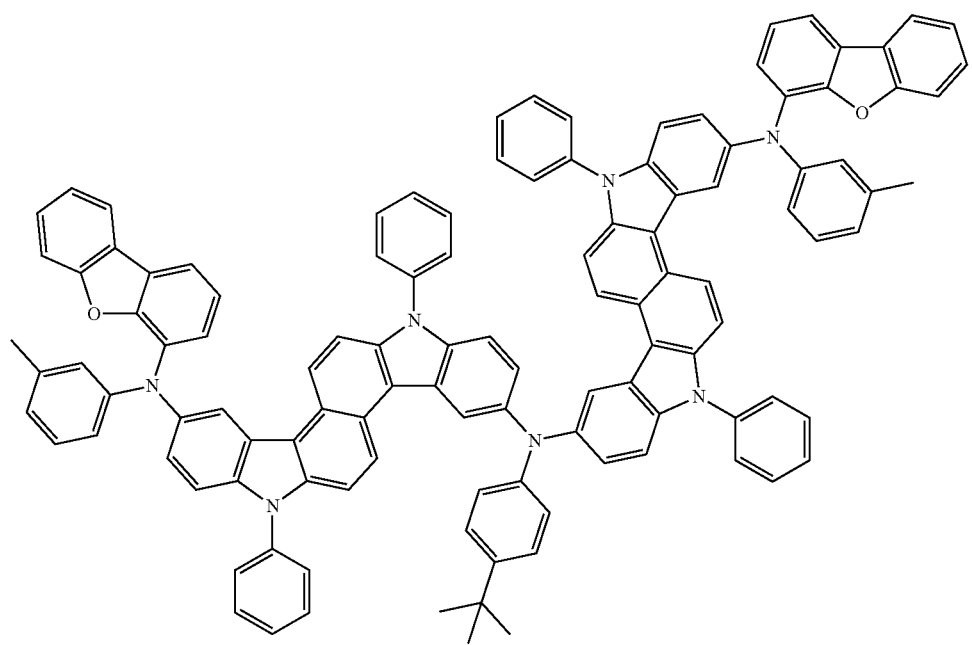

-continued

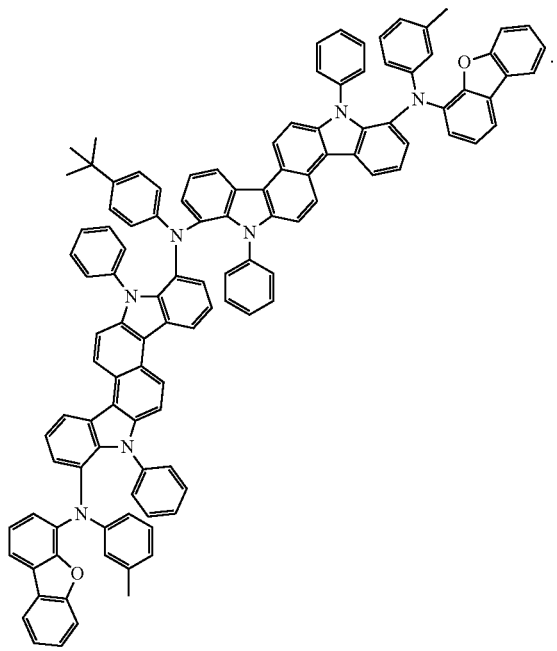

Meanwhile, the compound represented by Chemical Formula 1 may be prepared, for example, by a preparation method as shown in the following Reaction Scheme 1.

[Reaction Scheme 1]

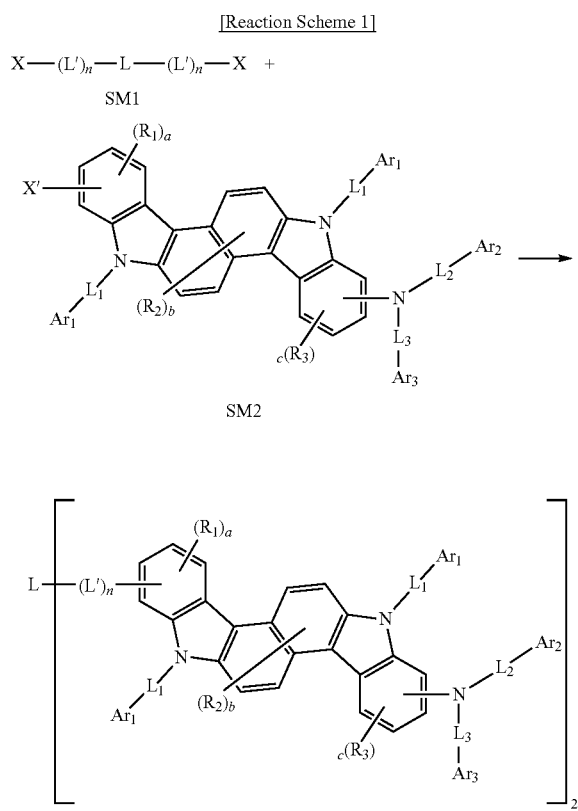

In Reaction Scheme 1, X may be hydrogen, —OH, or depending on the type of L', X' is halogen, preferably bromo, or chloro, and the definitions of other substituents are the same as described above.

Specifically, the compound represented by Chemical Formula 1 is prepared by combining the starting materials SM1 and SM2 through an amine substitution reaction or a Suzuki coupling reaction, depending on the type of X. Each of the amine substitution reaction and the Suzuki coupling reaction is preferably carried out in the presence of a palladium catalyst and a base, and a reactive group for the amine substitution reaction or the Suzuki coupling reaction can be appropriately modified, and the method for preparing the compound represented by Chemical Formula 1 may be further embodied in Preparation Examples described hereinafter.

(Coating Composition)

Meanwhile, the compound according to the present disclosure can form an organic material layer, particularly a light emitting layer of an organic light emitting device by a solution process. Specifically, the compound may be used as a dopant material of the light emitting layer. For this purpose, the present disclosure provides a coating composition including the above-mentioned compound according to the present disclosure and a solvent.

The solvent is not particularly limited as long as it is a solvent capable of dissolving or dispersing the compound according to the present disclosure. Examples of the solvent may include chlorine-based solvents such as chloroform, methylene chloride, 1,2-dichloroethane, 1,1,2-trichloroethane, chlorobenzene and o-dichlorobenzene; ether-based solvents such as tetrahydrofuran and dioxane; aromatic hydrocarbon-based solvents such as toluene, xylene, trimethylbenzene, mesitylene, 1-methylnaphthalene, and 2-methylnaphthalene; aliphatic hydrocarbon-based solvents such as cyclohexane, methylcyclohexane, n-pentane, n-hexane, n-heptane, n-octane, n-nonane and n-decane; ketone-based solvents such as acetone, methyl ethyl ketone, and cyclohexanone; ester-based solvents such as ethyl acetate, butyl acetate and ethyl cellosolve acetate; polyalcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin and 1,2-hexanediol, and derivatives thereof; alcohol-based solvents such as methanol, ethanol, propanol, isopropanol and cyclohexanol; sulfoxide-based solvents such as dimethyl sulfoxide; amide-based solvents such as N-methyl-2-pyrrolidone and N,N-dimethylformamide; benzoate-based solvents such as butylbenzoate, methyl-2-methoxybenzoate and ethylbenzoate; phthalate-based solvents such as dimethyl phthalate, diethyl phthalate, and diphenyl phthalate; tetraline; 3-phenoxy-toluene, and the like. In addition, the above-mentioned solvents may be used singly or in combination of two or more solvents. Preferably, ethyl benzoate may be used as the solvent Further, the coating composition may further include a compound used as a host material, and a description of the compound used for the host material will be given later.

Further, the viscosity of the coating composition is preferably 1 cP to 10 cP, and coating is made easy within the above range. Further, in the coating composition, the concentration of the compound according to the present disclosure is preferably 0.1 wt/v % to 20 wt/v %.

Further, the solubility (wt %) of the compound represented by Chemical Formula 1 at normal temperature/normal pressure may be 0.1 wt % or more based on the solvent cyclohexanone. Thereby, the coating composition including the compound represented by Chemical Formula 1 and the solvent may be used in a solution process.

In another embodiment of the present disclosure, there is provided a method for forming a light emitting layer using the above-mentioned coating composition. Specifically, the method includes the steps of: coating the above-mentioned light emitting layer according to the present disclosure on the anode or on the hole transport layer formed on the anode by a solution process; and heat-treating the coated coating composition.

The solution process uses the above-mentioned coating composition according to the present disclosure, and refers to spin coating, dip coating, doctor blading, inkjet printing, screen printing, spraying, roll coating, and the like, but is not limited thereto.

The heat treatment temperature in the heat treatment step is preferably from 150 to 230° C. Further, a heat treatment time may be from 1 minute to 3 hours, more preferably 10 minutes to 1 hour. Further, the heat treatment is preferably carried out in an inert gas atmosphere such as argon and nitrogen.

(Organic Light Emitting Device)

In another embodiment of the present disclosure, there is provided an organic light emitting device including the above-mentioned polymer according to the present disclosure. In one example, the present disclosure provides an organic light emitting device comprising: a first electrode; a second electrode that is provided opposite to the first electrode; and a light emitting layer that is provided between the first electrode and the second electrode, wherein the light emitting layer includes the compound represented by Chemical Formula 1.

Further, the organic light emitting device according to the present disclosure may be a normal type organic light emitting device in which an anode, one or more organic material layers and a cathode are sequentially stacked on a substrate wherein the first electrode is an anode, and the second electrode is a cathode. Further, the organic light emitting device according to the present disclosure may be an inverted type organic light emitting device in which a cathode, one or more organic material layers and an anode are sequentially stacked on a substrate wherein the first electrode is a cathode and the second electrode is an anode. For example, the structure of an organic light emitting device according to an embodiment of the present disclosure is illustrated in FIGS. 1 and 2.

FIG. 1 shows an example of an organic light emitting device comprising a substrate 1, an anode 2, a light emitting layer 3, and a cathode 4. In such a structure, the compound represented by Chemical Formula 1 may be included in the light emitting layer.

FIG. 2 shows an example of an organic light emitting device comprising a substrate 1, an anode 2, a hole injection layer 5, a hole transport layer 6, a light emitting layer 3, an electron injection and transport layer 7, and a cathode 4. In such a structure, the compound represented by Chemical Formula 1 may be included in the light emitting layer.

The organic light emitting device according to the present disclosure may be manufactured by materials and methods known in the art, except that the light emitting layer includes the compound according to the present disclosure, and is manufactured according to the above-mentioned method.

For example, the organic light emitting device according to the present disclosure can be manufactured by sequentially stacking an anode, an organic material layer and a cathode on a substrate. In this case, the organic light emitting device may be manufactured by depositing a metal, metal oxides having conductivity, or an alloy thereof on the substrate using a PVD (physical vapor deposition) method such as a sputtering method or an e-beam evaporation method to form an anode, forming organic material layers including the hole injection layer, the hole transport layer, the light emitting layer and the electron transport layer thereon, and then depositing a material that can be used as the cathode thereon.

In addition to such a method, the organic light emitting device may be manufactured by sequentially depositing a cathode material, an organic material layer and an anode material on a substrate (International Publication WO2003/012890). However, the manufacturing method is not limited thereto.

In one example, the first electrode is an anode, and the second electrode is a cathode, or alternatively, the first electrode is a cathode and the second electrode is an anode.

As the anode material, generally, a material having a large work function is preferably used so that holes can be smoothly injected into the organic material layer. Specific examples of the anode material include metals such as vanadium, chrome, copper, zinc, and gold, or an alloy thereof; metal oxides such as zinc oxides, indium oxides, indium tin oxides (ITO), and indium zinc oxides (IZO); a combination of metals and oxides, such as ZnO:Al or $SnO_2$:Sb; conductive polymers such as poly(3-methylthiophene), poly[3,4-(ethylene-1,2-dioxy)thiophene](PEDOT), polypyrrole, and polyaniline, and the like, but are not limited thereto.

As the cathode material, generally, a material having a small work function is preferably used so that electrons can be easily injected into the organic material layer. Specific examples of the cathode material include metals such as magnesium, calcium, sodium, potassium, titanium, indium, yttrium, lithium, gadolinium, aluminum, silver, tin, and lead, or an alloy thereof; a multilayered structure material such as LiF/Al or LiO$_2$/Al, and the like, but are not limited thereto.

The hole injection layer is a layer for injecting holes from the electrode, and the hole injection material is preferably a compound which has a capability of transporting the holes, thus has a hole injecting effect in the anode and an excellent hole injecting effect to the light emitting layer or the light emitting material, prevents excitons produced in the light emitting layer from moving to an electron injection layer or the electron injection material, and further is excellent in the ability to form a thin film. It is preferable that a HOMO (highest occupied molecular orbital) of the hole injection material is between the work function of the anode material and a HOMO of a peripheral organic material layer. Specific examples of the hole injection material include metal porphyrine, oligothiophene, an arylamine-based organic material, a hexanitrilehexaazatriphenylene-based organic material, a quinacridone-based organic material, a perylene-based organic material, anthraquinone, polyaniline and polythiophene-based conductive polymer, and the like, but are not limited thereto.

The hole transport layer is a layer that receives holes from a hole injection layer and transports the holes to the light emitting layer. The hole transport layer is suitably a material having large mobility to the holes, which may receive holes from the anode or the hole injection layer and transfer the holes to the light emitting layer. As the hole transport material, the compound represented by Chemical Formula 1 may be used, or an arylamine-based organic material, a conductive polymer, a block copolymer in which a conjugate portion and a non-conjugate portion are present together, and the like, but are not limited thereto.

Meanwhile, the organic light emitting device may be provided with an electron inhibition layer between the hole transport layer and the light emitting layer. The electron inhibition layer refers to a layer which is formed on the hole transport layer, and preferably, is provided in contact with the light emitting layer, and thus serves to control hole mobility, to prevent excessive movement of electrons, and to increase the probability of hole-electron bonding, thereby improving the efficiency of the organic light emitting device. The electron inhibition layer includes an electron blocking material, and as an example of such an electron blocking material, a compound represented by the Chemical Formula 1 may be used, or an arylamine-based organic material of the like may be used, but is not limited thereto.

The light emitting layer may include a host material and a dopant material. As the dopant material, the above-mentioned compound represented by Chemical Formula 1 can be used. Also, the host material may be a fused aromatic ring derivative, a heterocycle-containing compound or the like. Specific examples of the fused aromatic ring derivatives include anthracene derivatives, pyrene derivatives, naphthalene derivatives, pentacene derivatives, phenanthrene compounds, fluoranthene compounds, and the like. Examples of the heterocyclic-containing compounds include carbazole derivatives, dibenzofuran derivatives, ladder-type furan compounds, pyrimidine derivatives, and the like, but are not limited thereto.

Meanwhile, the organic light emitting device may be provided with a hole blocking layer between the light emitting layer and the electron transport layer. The hole blocking layer refers to a layer which is formed on the light emitting layer, and preferably, is provided in contact with the light emitting layer, and thus severs to control electron mobility, to prevent excessive movement of holes, and to increase the probability of hole-electron bonding, thereby improving the efficiency of the organic light emitting device. The hole blocking layer includes a hole blocking material, and as an example of such hole blocking material, a compound into which an electron-withdrawing group is introduced, such as azine derivatives including triazine; triazole derivatives; oxadiazole derivatives; phenanthroline derivatives; phosphine oxide derivatives can be used, but is not limited thereto.

The electron injection and transport layer is a layer for simultaneously performing the roles of an electron transport layer and an electron injection layer that inject electrons from an electrode and transport the received electrons up to the light emitting layer, and is formed on the light emitting layer or the hole blocking layer. The electron injection and transport material is suitably a material which can receive electrons well from a cathode and transfer the electrons to a light emitting layer, and has a large mobility for electrons. Specific examples of the electron injection and transport material include: an Al complex of 8-hydroxyquinoline; a complex including Alq$_3$; an organic radical compound; a hydroxyflavone-metal complex, a triazine derivative, and the like, but are not limited thereto. Alternatively, it may be used together with fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, a metal complex compound, a nitrogen-containing 5-membered ring derivative, and the like, but are not limited thereto.

The electron injection and transport layer may also be formed as a separate layer such as an electron injection layer and an electron transport layer. In such a case, the electron transport layer is formed on the light emitting layer or the hole blocking layer, and the above-mentioned electron injection and transport material may be used as the electron transport material included in the electron transport layer. In addition, the electron injection layer is formed on the electron transport layer, and examples of the electron injection material included in the electron injection layer include LiF, NaCl, CsF, Li$_2$O, BaO, fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, a metal complex compound, a nitrogen-containing 5-membered ring derivative, and the like.

Examples of the metal complex compound include 8-hydroxyquinolinato lithium, bis(8-hydroxyquinolinato)zinc, bis(8-hydroxyquinolinato)copper, bis(8-hydroxyquinolinato)manganese, tris(8-hydroxyquinolinato)aluminum, tris(2-methyl hydroxyquinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)chlorogallium, bis(2-methyl-8-quinolinato) (o-cresolato)gallium, bis(2-methyl-8-quinolinato)(1-naphtholato)aluminum, bis(2-methyl-8-quinolinato)(2-naphtholato)gallium, and the like, but are not limited thereto.

The organic light emitting device according to the present disclosure may be a front side emission type, a back side emission type, or a double side emission type according to the used material.

In addition, the compound according to the present disclosure may be included in an organic solar cell or an organic transistor in addition to an organic light emitting device.

The preparation of the polymer according to the present disclosure and the organic light emitting device including the same will be described in detail in the following examples. However, these examples are presented for illustrative purposes only, and are not intended to limit the scope of the present disclosure.

Preparation Example 1: Preparation of Compound 1

Step 1-1: Preparation of Intermediate Compound 1-b

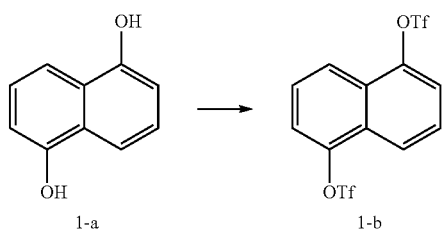 [SMILES: Oc1cccc2c(O)cccc12 ; O=S(=O)(Oc1cccc2c(OS(=O)(=O)C(F)(F)F)cccc12)C(F)(F)F]

Compound 1-a (1.0 eq.) was placed in a round bottom flask and dissolved in anhydrous $CH_2Cl_2$ (0.28 M). Pyridine (2.5 eq.) was added dropwise to the reaction solution, the bath temperature was lowered from room temperature to 0° C., and the mixture was stirred. Trifluoromethanesulfonic anhydride ($Tf_2$, 2.0 eq.) was slowly added dropwise using a dropping funnel for 30 minutes, the bath temperature was raised to room temperature, and the mixture was stirred for 4 hours. After the reaction, the reaction mixture was washed with dichloromethane and water, the organic layer was separated, water was removed with $MgSO_4$, and passed through a celite-silica pad. The passed solution was concentrated under reduced pressure, and then purified by column chromatography to obtain Intermediate Compound 1-b (yield: 90%).

m/z[M+H]$^+$=425.

Step 1-2: Preparation of Intermediate Compound 1-c

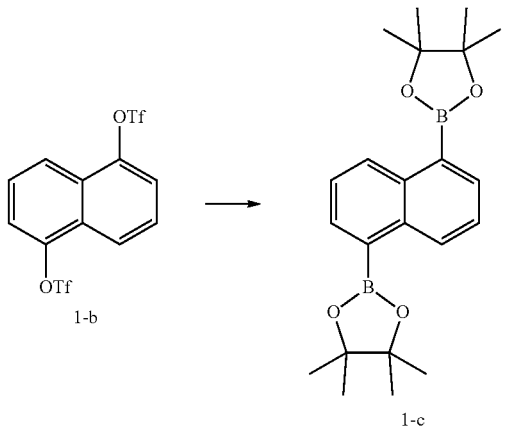

Compound 1-b (1.0 eq.) and bis(pinacolato)diborane ($B_2pin_2$, 2.2 eq.) and KOAc (6.0 eq.) were placed in a round bottom flask and dissolved in anhydrous dioxane (0.2 M). After raising the bath temperature from room temperature to 100° C., (1,1'-bis(diphenylphosphino)ferrocene)palladium (II) dichloride (Pd(dppf)Cl$_2$, 10 mol %) was added dropwise thereto, and the mixture was stirred for 2 hours. After the reaction, the reaction mixture was washed with dichloromethane and water, the organic layer was separated, water was removed with $MgSO_4$, and passed through a celite-silica pad. The passed solution was concentrated under reduced pressure, and then purified by column chromatography to obtain Intermediate Compound 1-c (yield: 87%).

m/z[M+H]$^+$=381.

Step 1-3: Preparation of Intermediate Compound 1-e

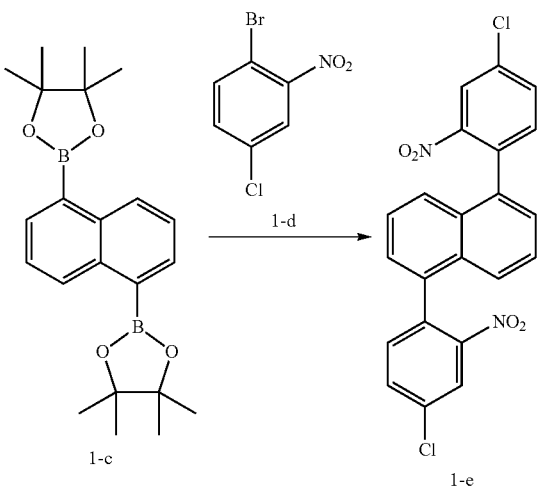

Compound 1-c (1.0 eq.), Compound 1-d (2.2 eq.), (tetrakis(triphenylphosphine)palladium(0)) (Pd(PPh$_3$)$_4$, 12 mol %) were placed in a round bottom flask and dissolved in anhydrous PhMe (toluene, 0.21 M). After raising the bath temperature to 110° C., Cs$_2$CO$_3$ (5.0 eq.) dissolved in H$_2$O was added dropwise to the reaction solution. Then, the mixture was stirred overnight at a bath temperature of 110° C. After the reaction, the reaction mixture was washed with dichloromethane and water, the organic layer was separated, water was removed with $MgSO_4$, and passed through a celite-silica pad. The passed solution was concentrated under reduced pressure, and then purified by column chromatography to obtain Intermediate Compound 1-e (yield: 99%).

m/z[M+H]$^+$=439.

Step 1-4: Preparation of Intermediate Compound 1-f

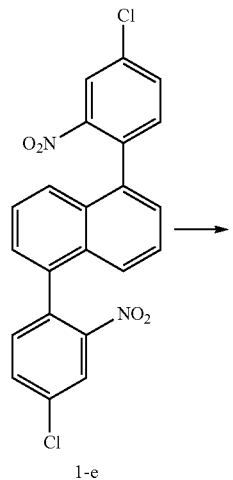

1-e

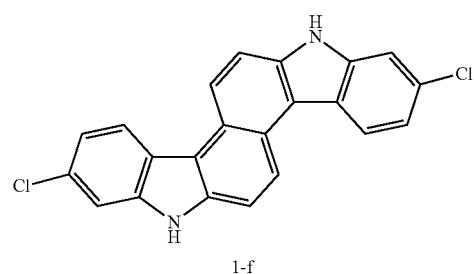

1-f

Compound 1-e (1.0 eq.) and PPh₃ (5.0 eq.) were placed in a round bottom flask and dissolved in anhydrous 1,2-dichlorobenzene (0.075 M). The solution was stirred overnight under a bath temperature of 180° C. After the reaction, the reaction mixture was stirred and then cooled to room temperature, and then washed with dichloromethane and water, the organic layer was separated, water was removed with MgSO₄, and passed through a celite-silica pad. The passed solution was concentrated under reduced pressure, and then purified by column chromatography to obtain Intermediate Compound 1-f (yield: 85%).

m/z[M+H]⁺=375.

Step 1-5: Preparation of Intermediate Compound 1-h

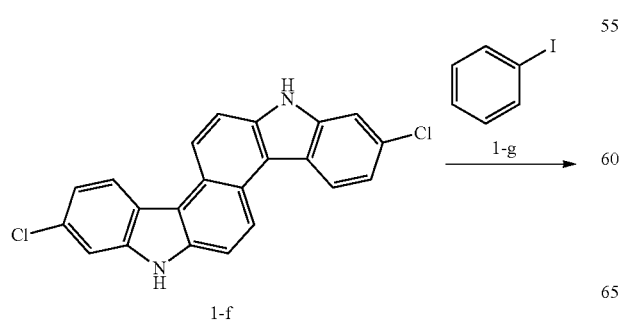

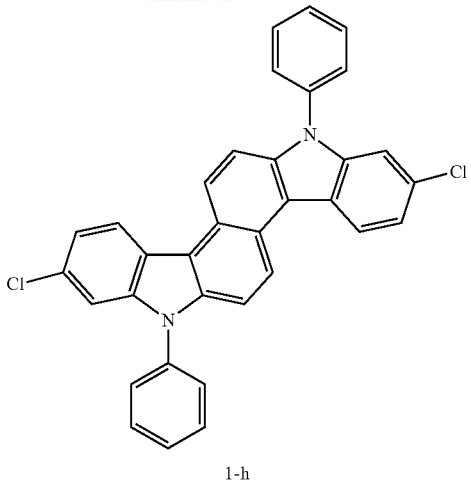

1-h

Compound 1-f (1.0 eq.) and sodium tert-butoxide (NaOt-Bu, 6.05 eq.) were placed in a round bottom flask and dissolved in anhydrous PhMe (0.03 M). Then, Compound 1-g (7.1 eq.) was added dropwise to the reaction solution. Next, bis(tri-tert-butylphosphine)palladium(0)(Pd(P(t-Bu)₃)₂, 20 mol %) was added dropwise to the reaction product under a bath temperature of 110° C., and the mixture was stirred for 22 hours. After the reaction, the reaction mixture was washed with dichloromethane and water, the organic layer was separated, water was removed with MgSO₄, and passed through a celite-silica pad. The passed solution was concentrated under reduced pressure, and then purified by column chromatography to obtain Intermediate Compound 1-h (yield: 85%).

m/z[M+H]⁺=527.

Step 1-6: Preparation of Intermediate Compound 1-k

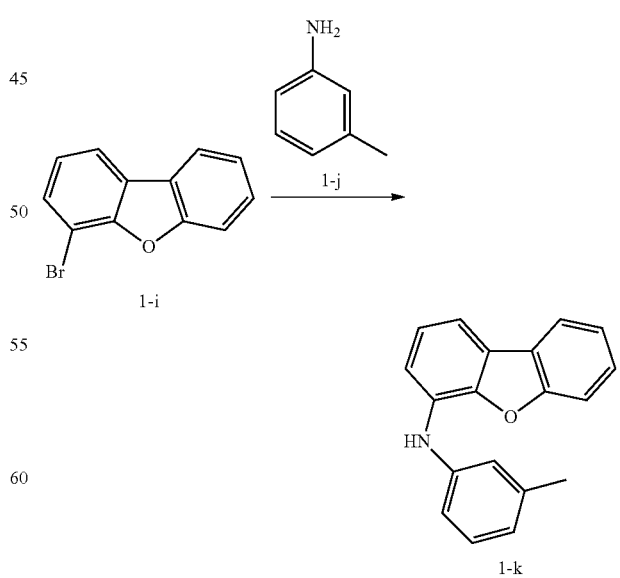

Compound 1-i (1.0 eq.), Compound 1-j (1.2 eq.) and NaOt-Bu (2.0 eq.) were placed in a round bottom flask and dissolved in anhydrous toluene. After raising the bath temperature to 110° C., Pd((t-Bu)₃P)₂ (3 mol %) was added dropwise thereto, and the solution was stirred for 4 hours. After the reaction, the reaction mixture was washed with dichloromethane and water, the organic layer was separated, water was removed with MgSO₄, and passed through a Celite-Silica pad. The passed solution was concentrated under reduced pressure, and then purified by column chromatography to obtain Intermediate Compound 1-k (yield: 81%).

m/z [M+H]⁺=274.

Step 1-7: Preparation of Intermediate Compound 1-l

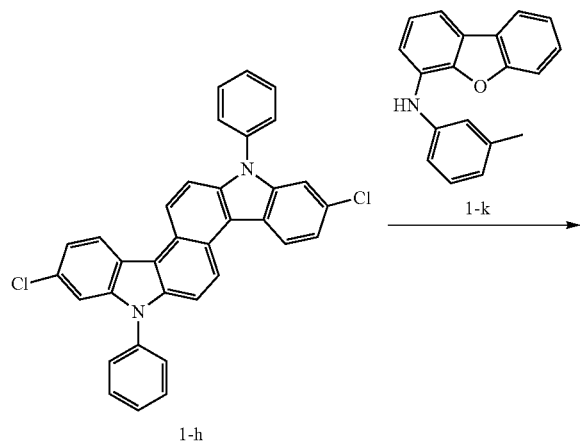

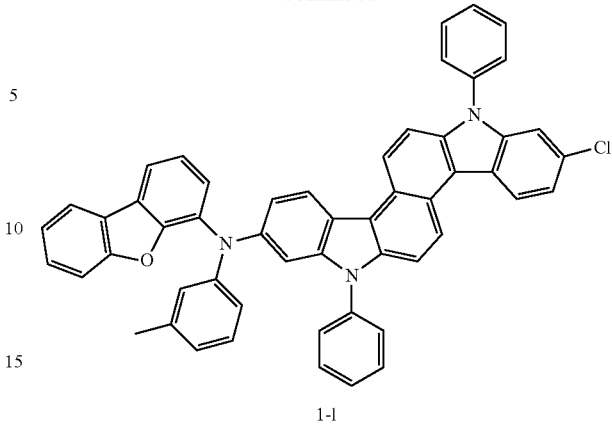

Compound 1-h (1.0 eq.), Compound 1-k (1.03 eq.), tri-tert-butylphosphonium tetrafluoroborate (P(t-Bu)₃HBF₄, 5 mol %), and NaOt-Bu (1.1 eq.) were placed in a round bottom flask and dissolved in anhydrous PhMe (0.02 M). Tris(dibenzylideneacetone)dipalladium(0)(Pd₂(dba)₃, 2.5 mol %) was added dropwise to the reaction solution under a bath temperature of 105° C., and the mixture was stirred for 4 hours. After the reaction, the reaction mixture was washed with dichloromethane and water, the organic layer was separated, water was removed with MgSO₄, and passed through a Celite-Silica pad. The passed solution was concentrated under reduced pressure, and then purified by column chromatography to obtain Intermediate Compound 1-l (yield: 78%).

m/z[M+H]⁺=764.

Step 1-8: Synthesis of Compound 1

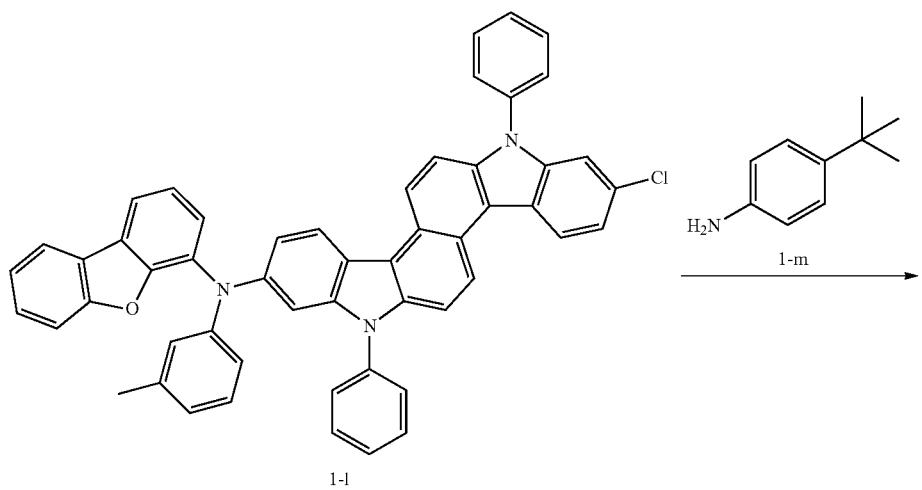

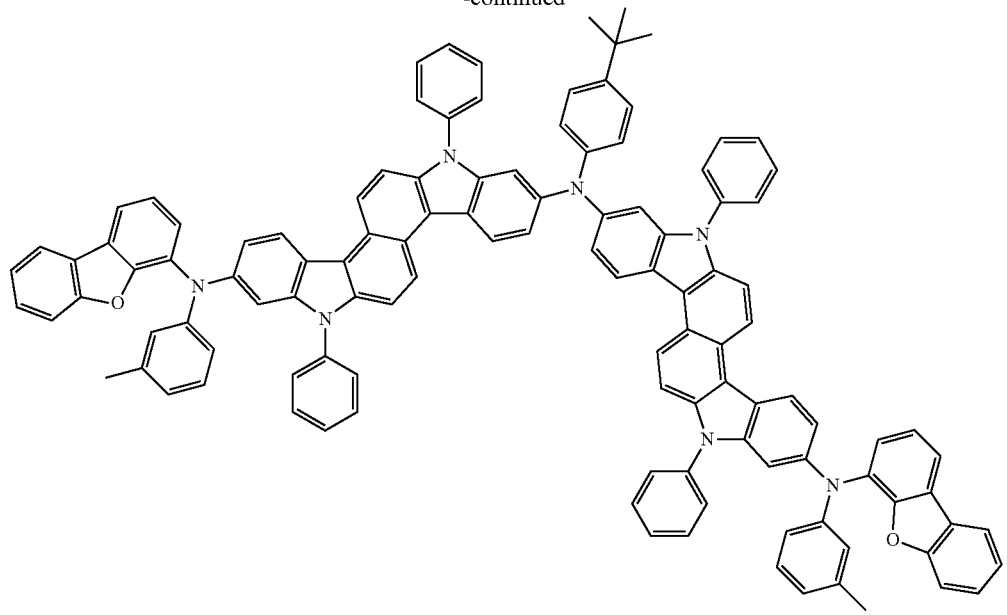

1

Compound 1-l (1.0 eq.), Compound 1-m (2.2 eq.), P(t-Bu)$_3$HBF$_4$ (10 mol %), and NaOt-Bu (2.2 eq.) were placed in a round bottom flask and dissolved in anhydrous PhMe (0.02 M). Pd$_2$(dba)$_3$ (5 mol %) was added dropwise to the reaction solution under a bath temperature of 105° C. and the mixture was stirred overnight. After the reaction, the reaction mixture was stirred and then cooled to room temperature. An excess of n-hexane was added dropwise to the reaction mixture to precipitate the product. The precipitate was washed with MeOH and H$_2$O and filtered to obtain a filter cake. A sufficiently dried filter cake was added to 1,2-dichlorobenzene and dissolved under heating. The dissolved reactant was passed through a celite-silica pad. An excess of n-hexane was added dropwise to the passed solution to precipitate the product. The precipitate was washed with n-hexane and MeOH and filtered to obtain a filter cake, which was sufficiently dried to synthesize Compound 1 (yield: 82%).

m/z[M+H]$^+$=1605.

Preparation Example 2: Synthesis of Compound 2

Step 2-1: Synthesis of Compound 2

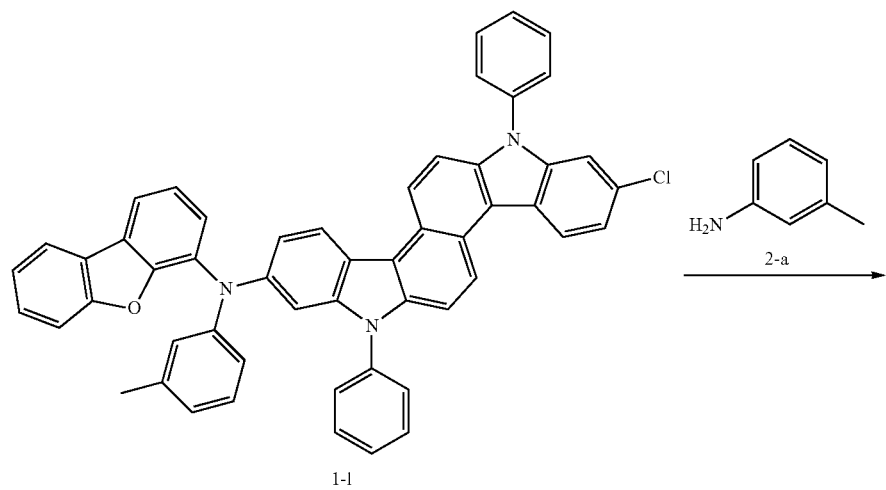

1-l

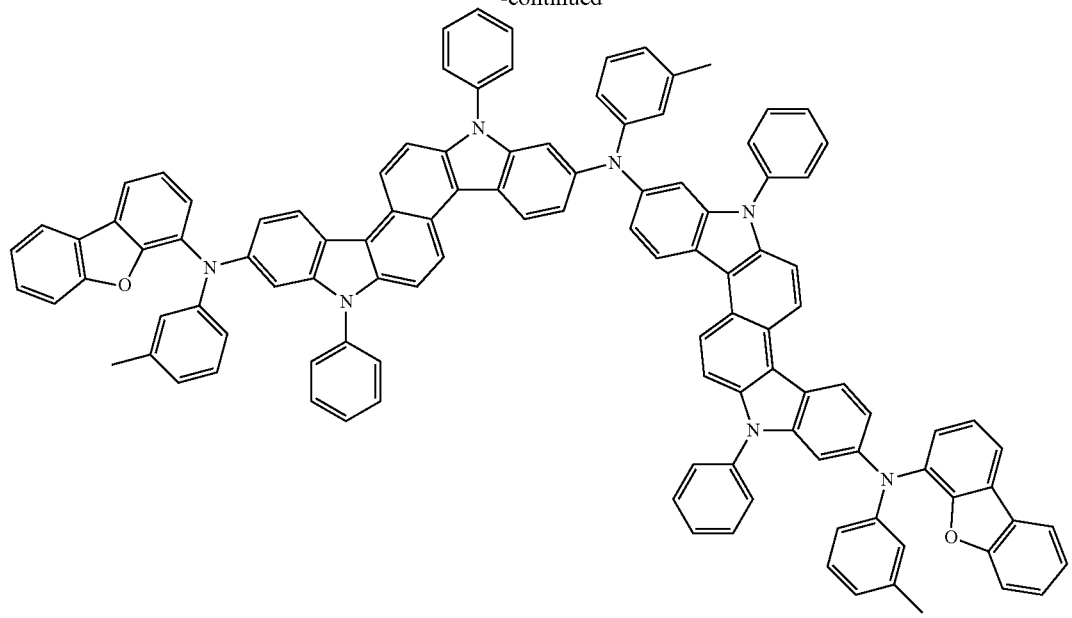
2
Compound 2 (yield: 85%) was prepared in the same manner as in step 1-8, except that Compound 2-a was used instead of Compound 1-m.
m/z[M+H]$^+$=1563.
Preparation Example 3: Synthesis of Compound 3
Step 3-1: Synthesis of Compound 3
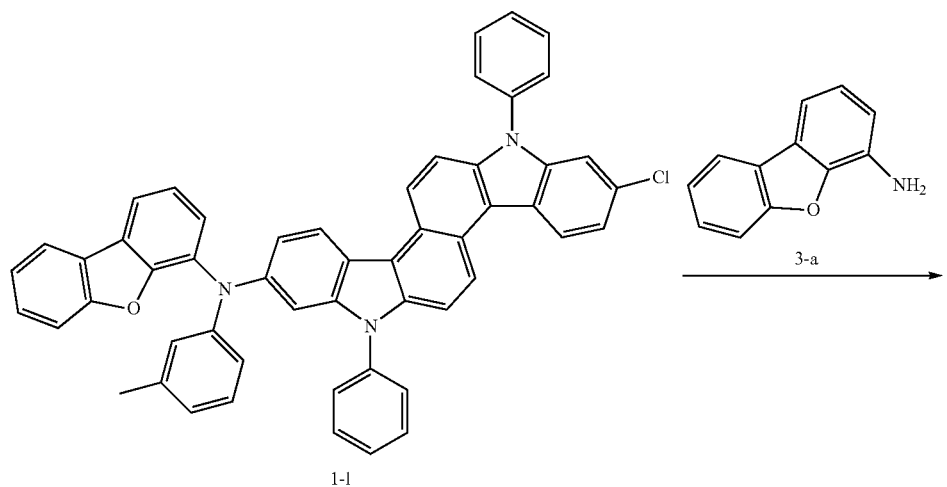

-continued
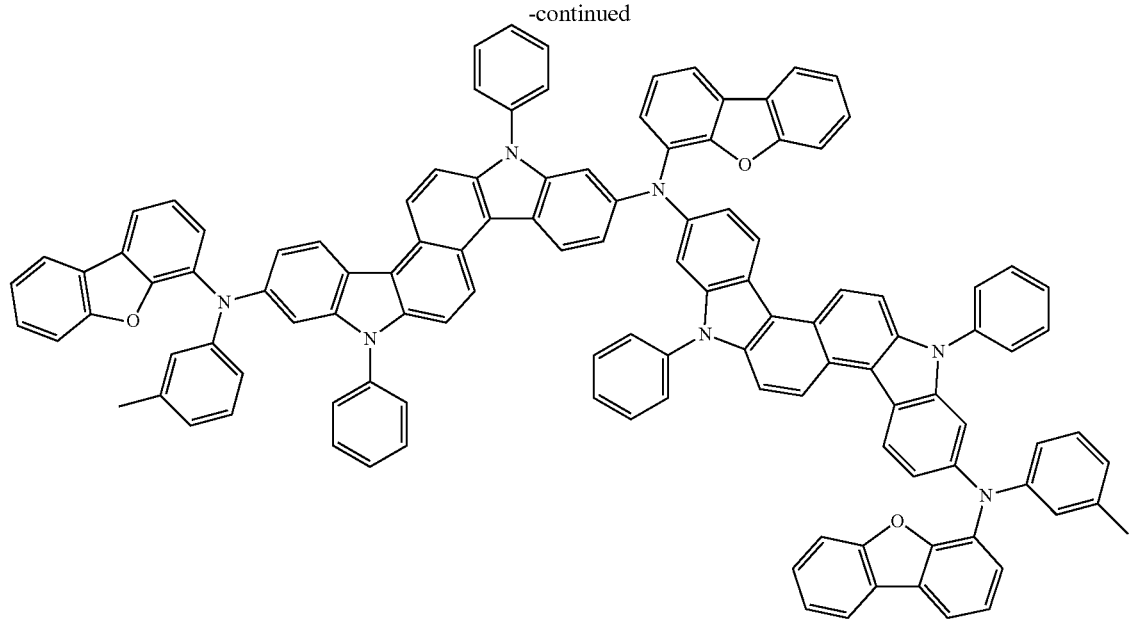
3
Compound 3 (yield: 69%) was prepared in the same manner as in step 1-8, except that Compound 3-a was used instead of Compound 1-m.
m/z[M+H]$^+$=1639.
Preparation Example 4: Synthesis of Compound 4
Step 4-1: Synthesis of Compound 4
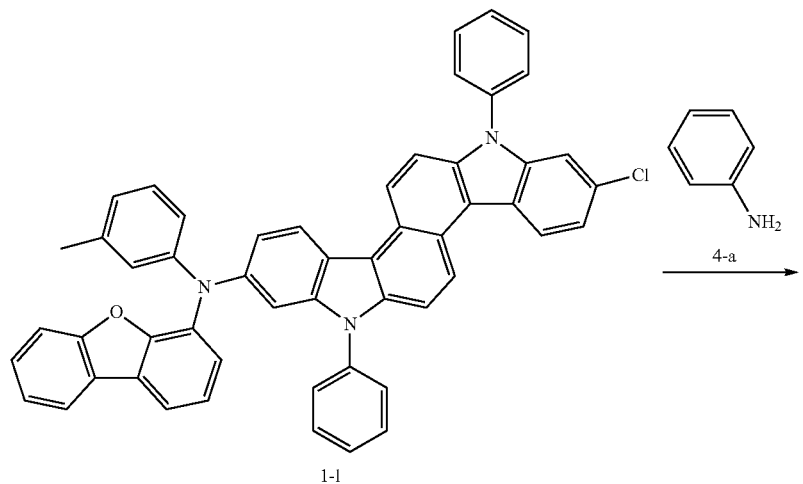

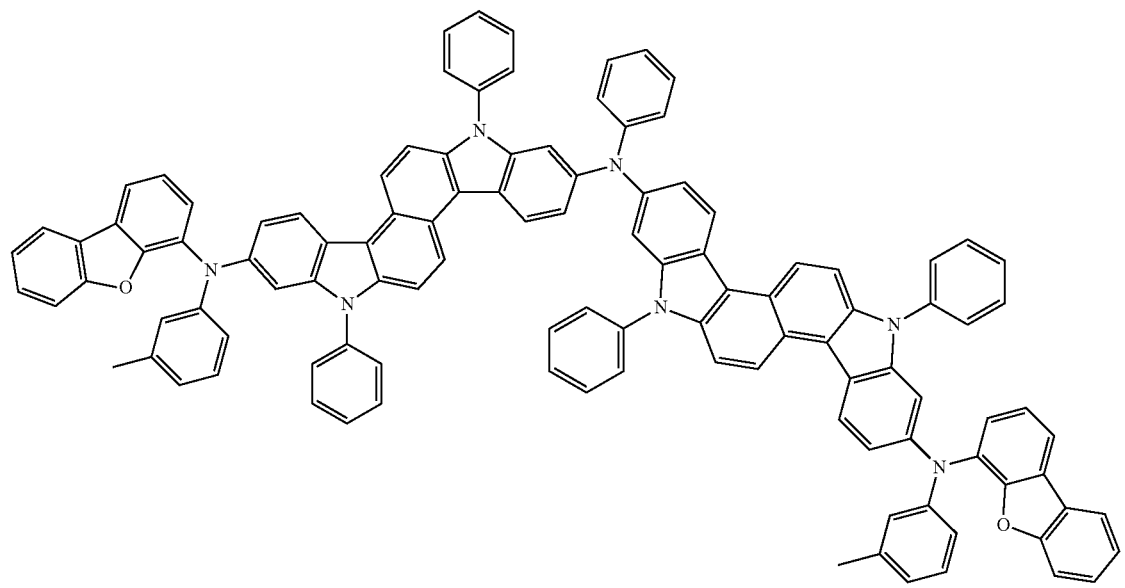

4

Compound 4 (yield: 82%) was prepared in the same manner as in step 1-8, except that Compound 4-a was used instead of Compound 1-m.
m/z[M+H]$^+$=1549.

Preparation Example 5: Synthesis of Compound 5

Step 5-1: Synthesis of Intermediate Compound 5-c

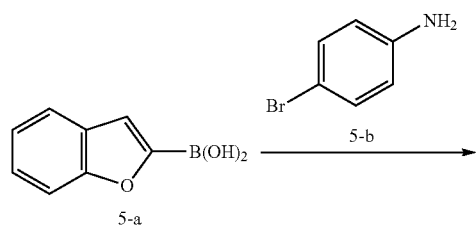

-continued

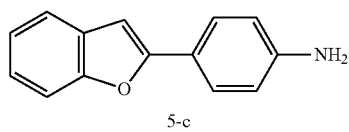

Compound 5-a (1.0 eq.) and Compound 5-b (1.03 eq.) were placed in a round bottom flask and dissolved in anhydrous THF (0.3 M). K$_2$CO$_3$ (1.3 eq.) dissolved in H$_2$O was added dropwise to the reaction solution. Pd(PPh$_3$)$_4$ (1.5 mol %) was added dropwise thereto under a bath temperature of 110° C., and the mixture was stirred overnight. After the reaction, the reaction mixture was washed with dichloromethane and water, the organic layer was separated, water was removed with MgSO$_4$, and passed through a celite-silica pad. The passed solution was concentrated under reduced pressure, and then purified by column chromatography to obtain Intermediate Compound 5-c (yield: 87%).
m/z[M+H]$^+$=210.

Step 5-2: Synthesis of Compound 5
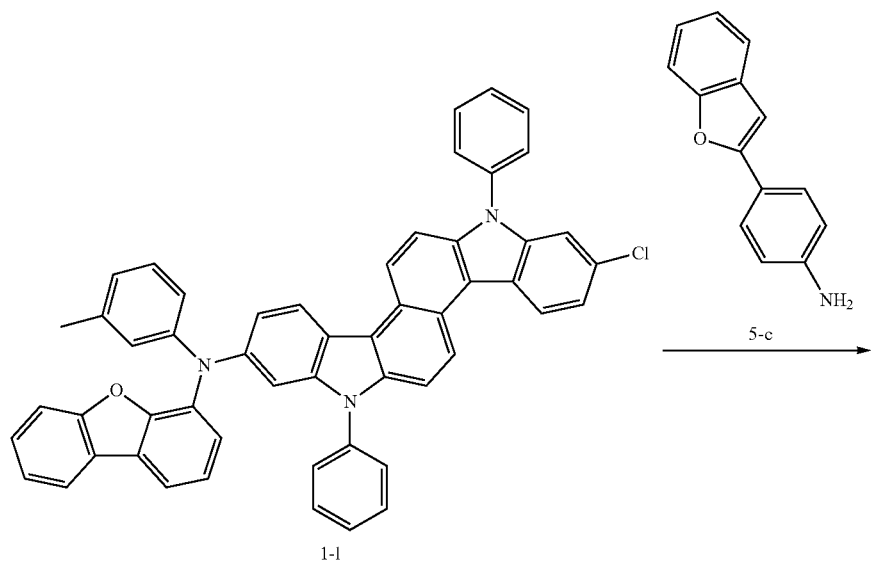
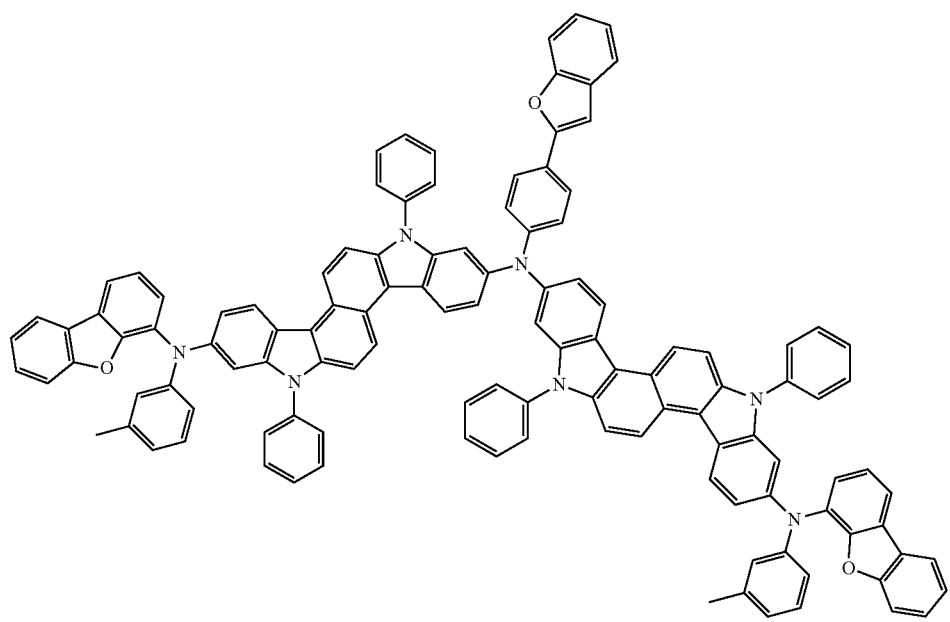

Compound 5 (yield: 75%) was prepared in the same manner as in step 1-8, except that Compound 5-c was used instead of Compound 1-m.

m/z[M+H]$^+$=1665

Preparation Example 6: Synthesis of Compound 6

Step 6-1: Synthesis of Intermediate Compound 6-b

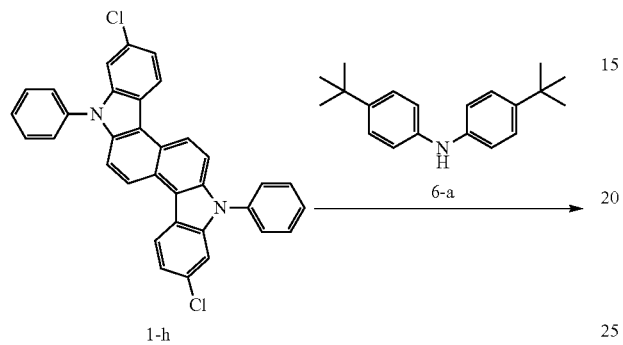

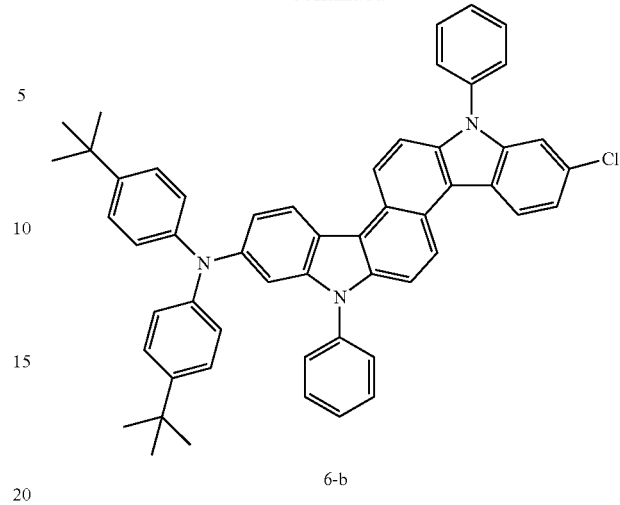

Compound 6-b (yield: 75%) was prepared in the same manner as in step 1-7, except that Compound 6-a was used instead of Compound 1-k.

m/z[M+H]$^+$=772

Step 6-2: Synthesis of Compound 6

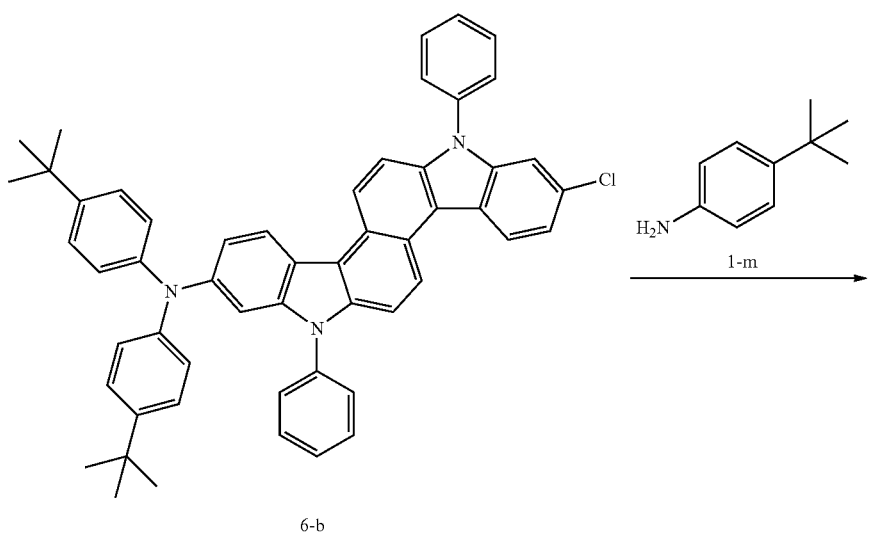

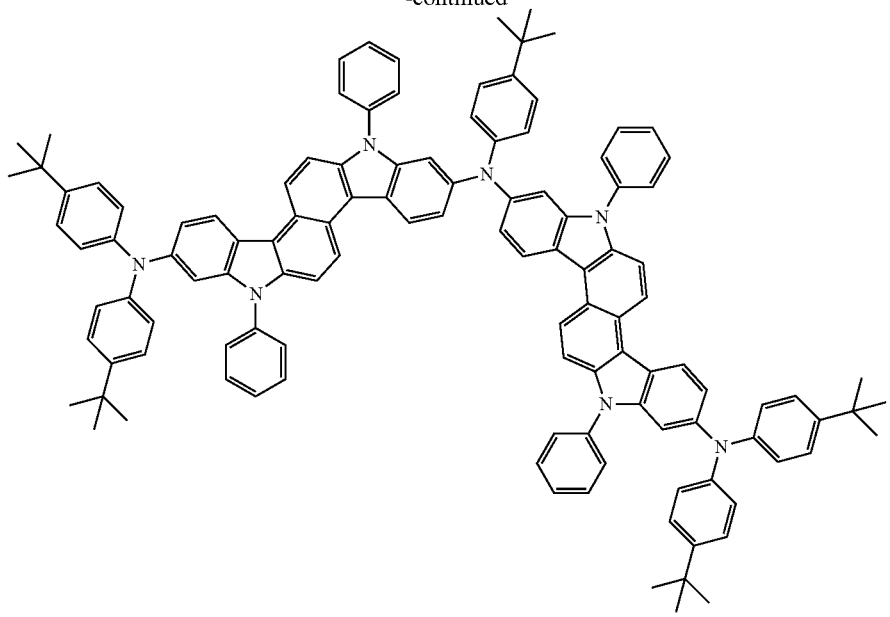
6
Compound 6 (yield: 81%) was prepared in the same manner as in step 1-8, except that Compound 6-b was used instead of Compound 1-l.
m/z[M+H]⁺=1621
Preparation Example 7: Synthesis of Compound 7
Step 7-1: Synthesis of Compound 7
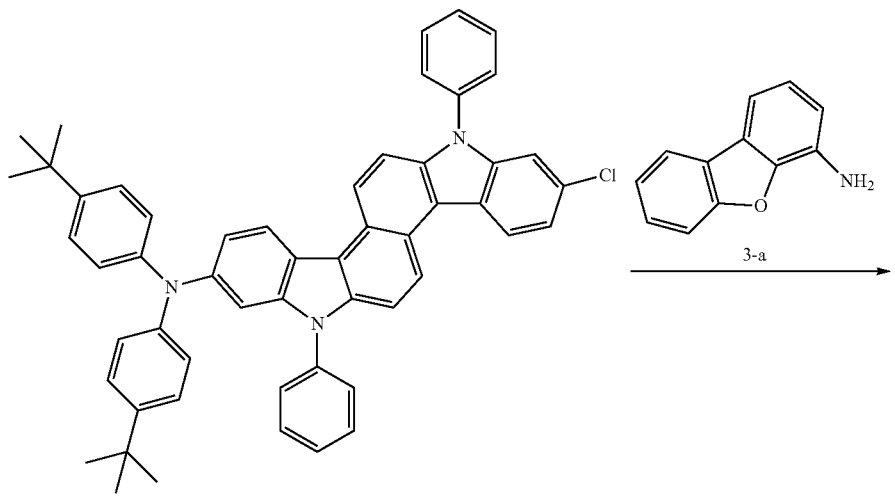

-continued
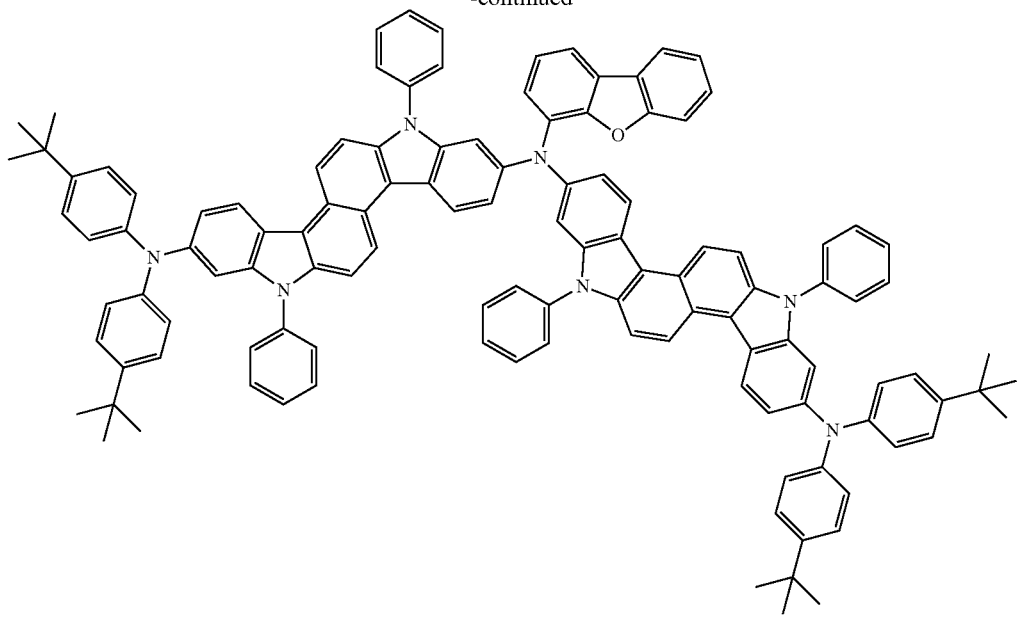
7
Compound 7 (yield: 67%) was prepared in the same manner as in step 3-1, except that Compound 6-b was used instead of Compound 1-l.
m/z[M+H]⁺=1655
Preparation Example 8: Synthesis of Compound 8
Step 8-1: Synthesis of Compound 8
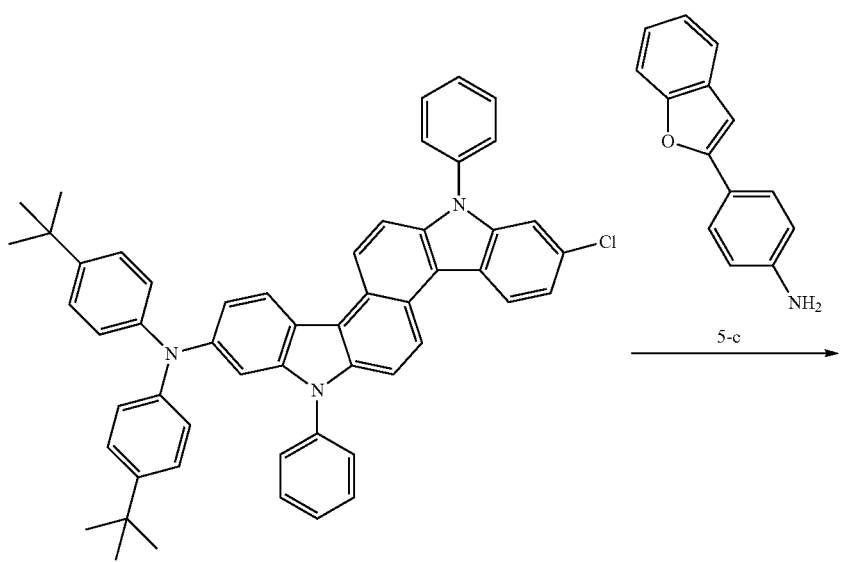

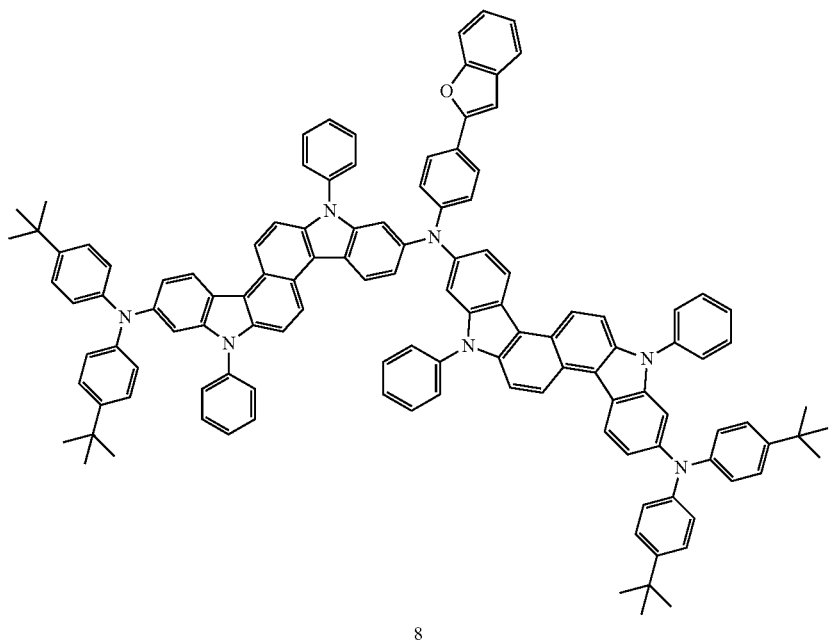

8

Compound 8 (yield: 77%) was prepared in the same manner as in step 5-2, except that Compound 6-b was used instead of Compound 1-1.

m/z[M+H]$^+$=1681

Preparation Example 9: Synthesis of Compound 9

Step 9-1: Synthesis of Intermediate Compound 9-c

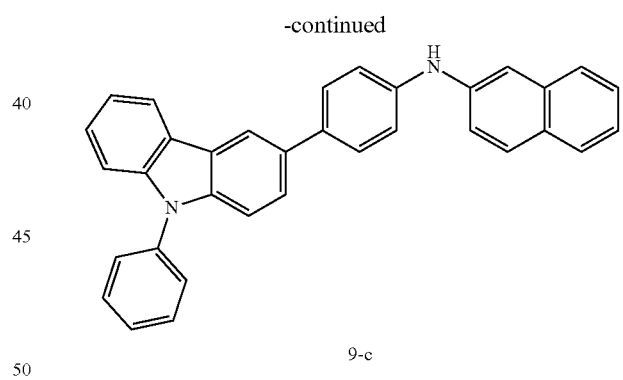

9-c

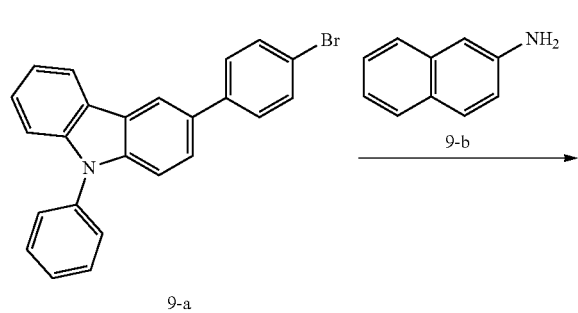

9-a

Compound 9-a (1.0 eq.), Compound 9-b (1.2 eq.) and NaOt-Bu (2.0 eq.) were placed in a round bottom flask and dissolved in anhydrous toluene. After raising the bath temperature to 110° C., Pd((t-Bu)$_3$P)$_2$ (3 mol %) was added dropwise thereto, and the mixture was stirred for 4 hours. After the reaction, the reaction mixture was washed with dichloromethane and water, the organic layer was separated, water was removed with MgSO$_4$, and passed through a celite-silica pad. The passed solution was concentrated under reduced pressure, and then purified by column chromatography to obtain Intermediate Compound 9-c (yield: 89%).

m/z[M+H]$^+$=461.

Step 9-2: Synthesis of Intermediate Compound 9-d
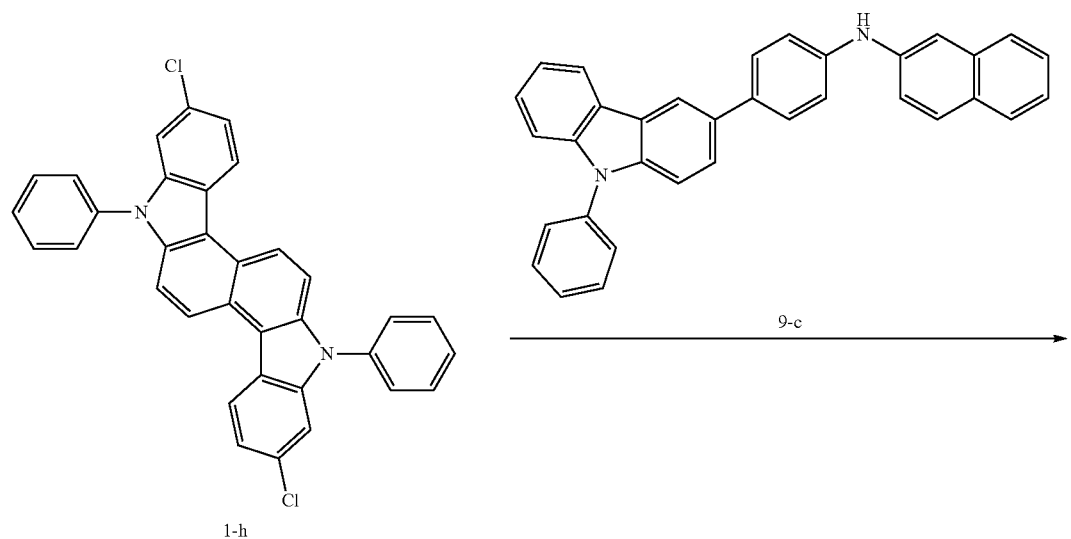
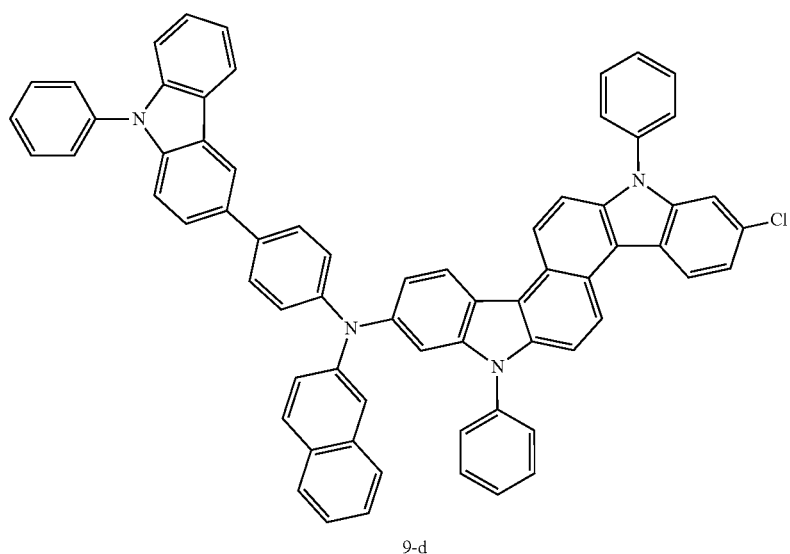

Compound 9-d (yield: 68%) was prepared in the same manner as in step 1-7, except that Compound 9-c was used instead of Compound 1-k.
m/z[M+H]⁺=951
Preparation Example 9-3: Synthesis of Compound 9
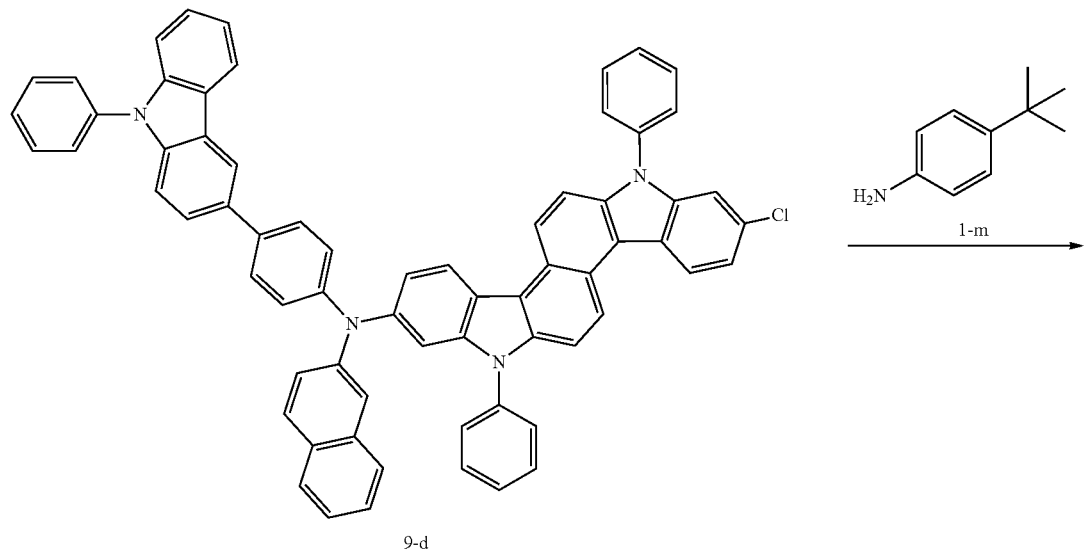
9-d
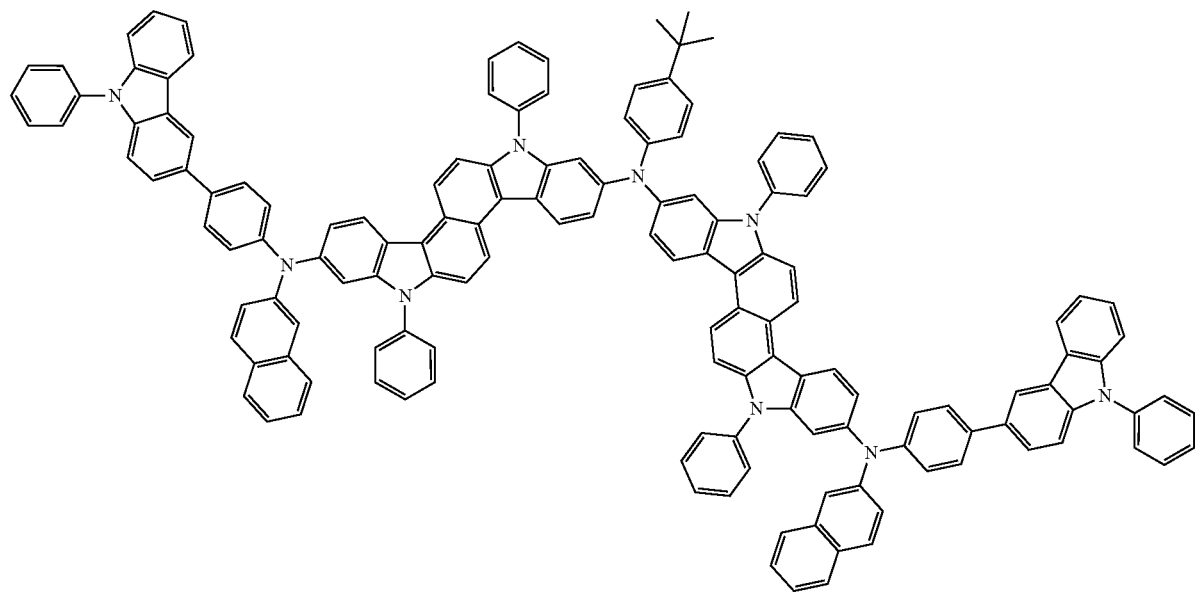
9

Compound 9 (yield: 79%) was prepared in the same manner as in step 1-8, except that Compound 9-d was used instead of Compound 1-h.

m/z[M+H]$^+$=1979

Preparation Example 10: Synthesis of Compound 10

Step 10-1: Synthesis of Intermediate Compound 10-b

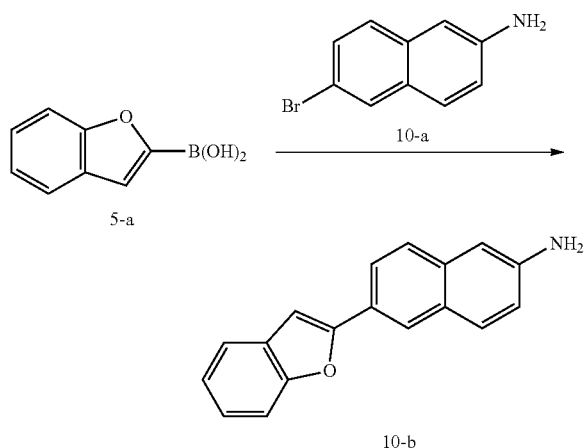

Compound 5-a (1.0 eq.) and Compound 10-a (1.03 eq.) were placed in a round bottom flask and dissolved in anhydrous THF (0.3 M). K$_2$CO$_3$ (1.3 eq.) dissolved in H$_2$O was added dropwise to the reaction solution. Pd(PPh$_3$)$_4$ (1.5 mol %) was added dropwise thereto under a bath temperature of 110° C., and the mixture was stirred overnight. After the reaction, the reaction mixture was washed with dichloromethane and water, the organic layer was separated, water was removed with MgSO$_4$, and passed through a Celite-Silica pad. The passed solution was concentrated under reduced pressure, and then purified by column chromatography to obtain Intermediate Compound 10-b (yield: 96%).

m/z[M+H]$^+$=260.

Step 10-2: Synthesis of Intermediate Compound 10-d

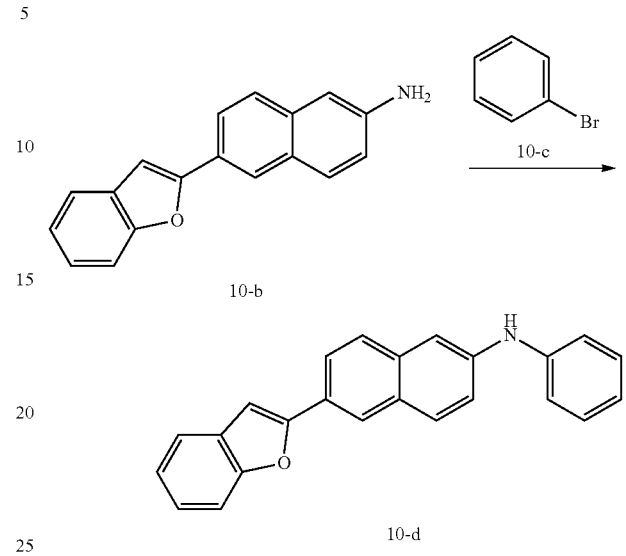

Compound 10-b (1.0 eq.), Compound 10-c (1.2 eq.) and NaOt-Bu (2.0 eq.) were placed in a round bottom flask and dissolved in anhydrous toluene. After raising the bath temperature to 110° C., Pd((t-Bu)$_3$P)$_2$ (3 mol %) was added dropwise thereto, and the mixture was stirred for 4 hours. After the reaction, the reaction mixture was washed with dichloromethane and water, the organic layer was separated, water was removed with MgSO$_4$, and passed through a celite-silica pad. The passed solution was concentrated under reduced pressure, and then purified by column chromatography to obtain Intermediate Compound 10-d (yield: 84%).

m/z[M+H]$^+$=336.

Step 10-3: Synthesis of Intermediate Compound 10-e

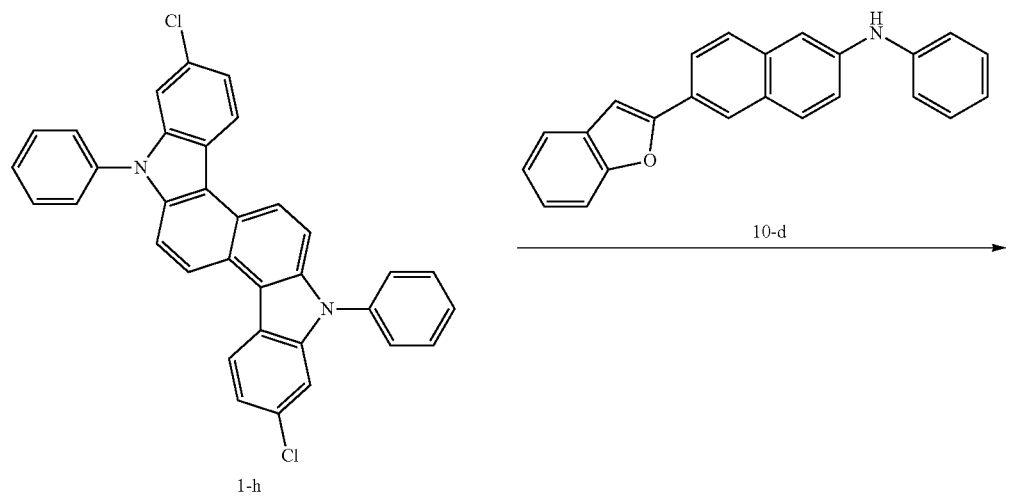

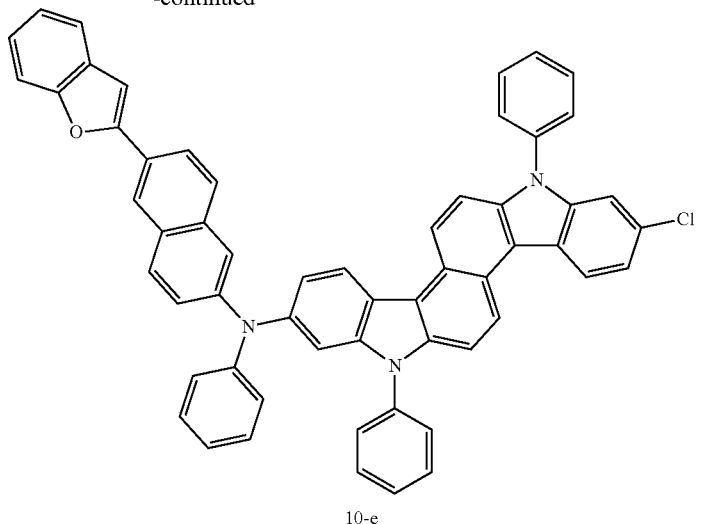
10-e
Compound 10-e (yield: 70%) was prepared in the same manner as in step 1-7, except that Compound 10-d was used instead of Compound 1-k.
m/z[M+H]$^+$=826
Preparation Example 10-4: Synthesis of Compound 10
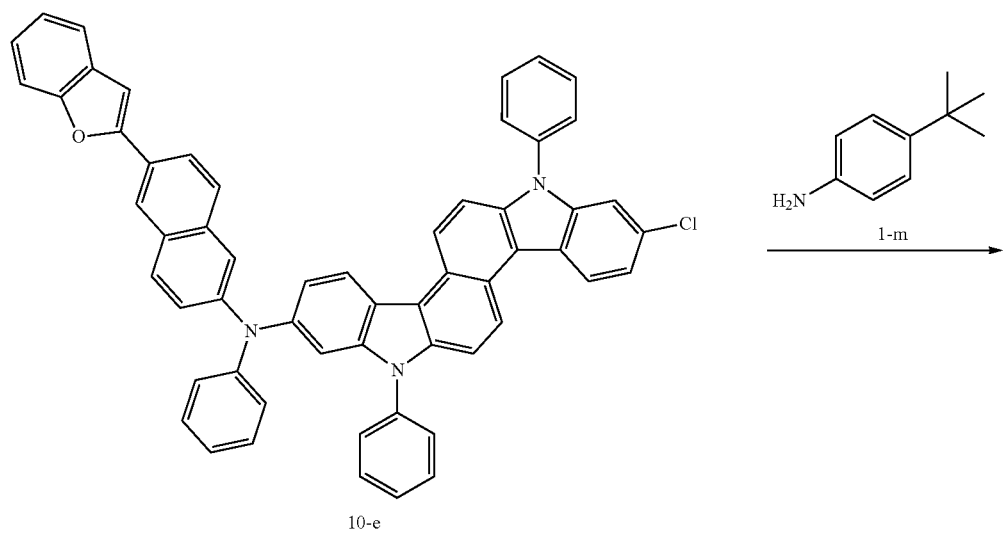

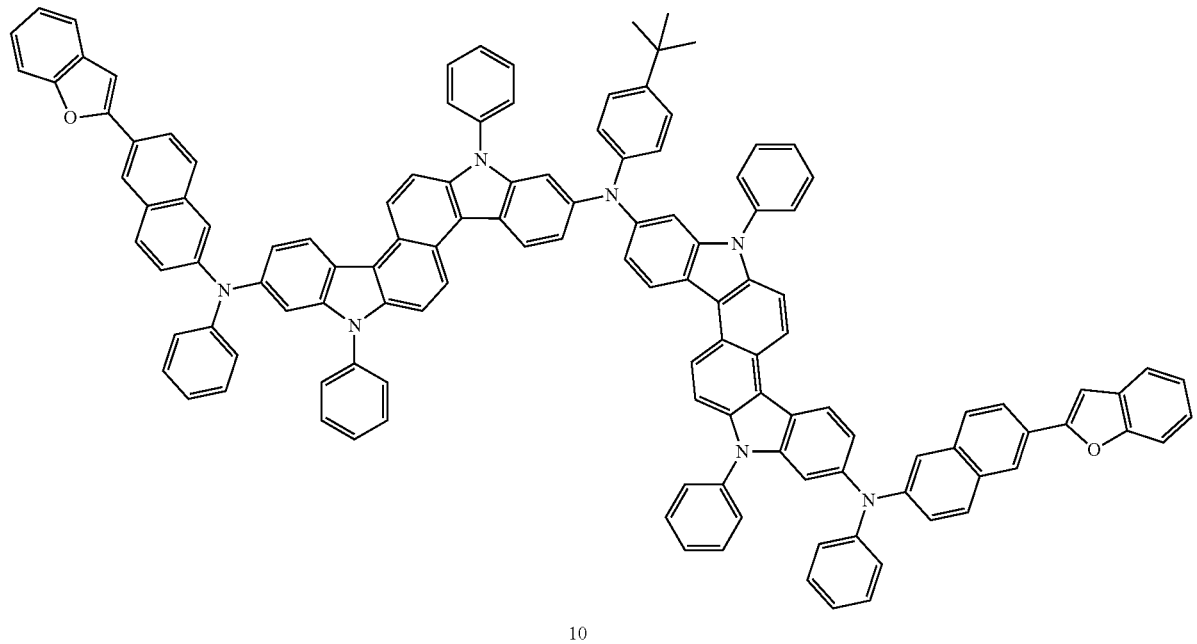
10
Compound 10 (yield: 87%) was prepared in the same manner as in step 1-8, except that Compound 10-e was used instead of Compound 1-l.
m/z[M+H]⁺=1729
Preparation Example 11: Synthesis of Compound 11
Step 11-1: Synthesis of Intermediate Compound 11-b
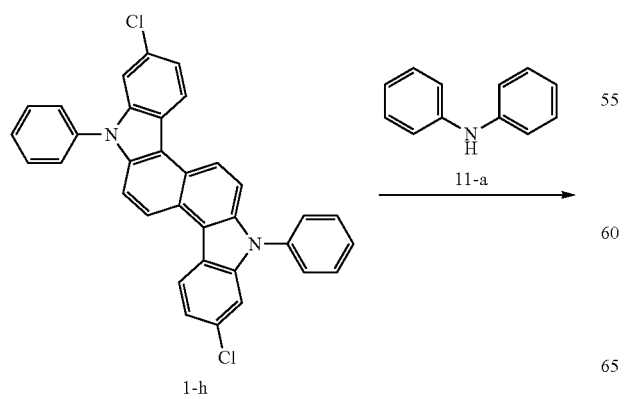
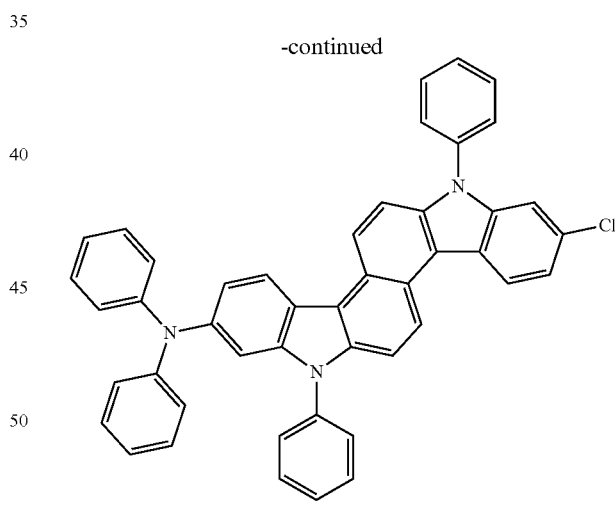
Compound 11-b (yield: 79%) was prepared in the same manner as in step 1-7, except that Compound 11-a was used instead of Compound 1-k.
m/z[M+H]⁺=660

Step 11-2: Synthesis of Compound 11
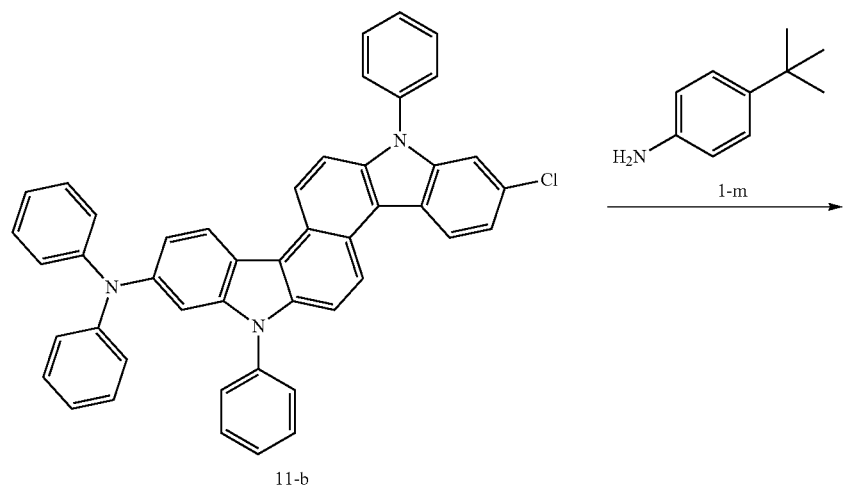
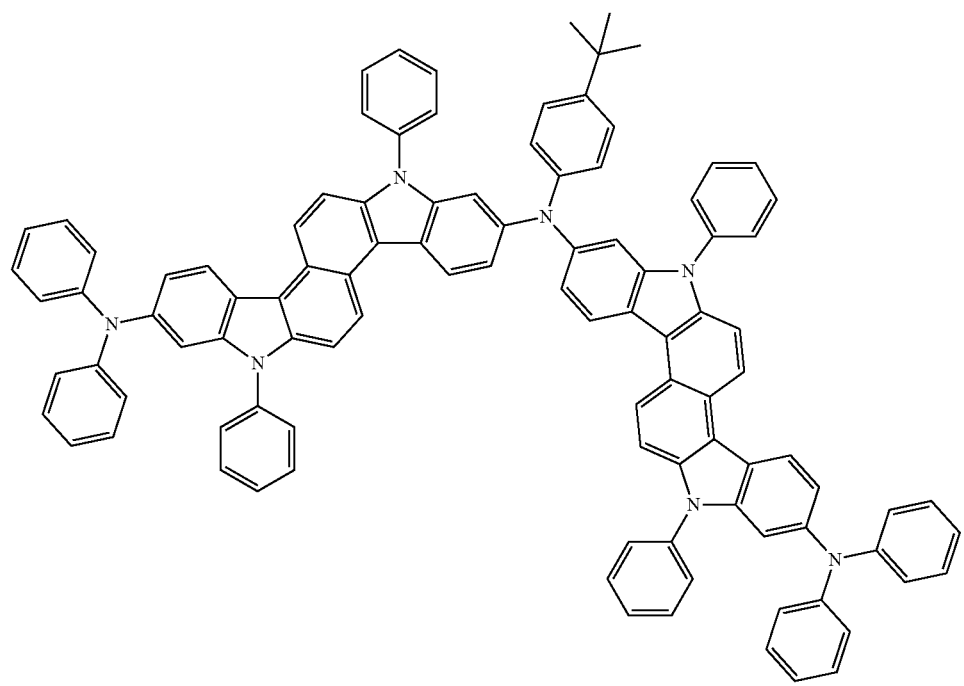

Compound 11 (yield: 81%) was prepared in the same manner as in step 1-8, except that Compound 11-b was used instead of Compound 1-1.
m/z[M+H]⁺=1397
Preparation Example 12: Synthesis of Compound 12
Step 12-1: Synthesis of Compound 12
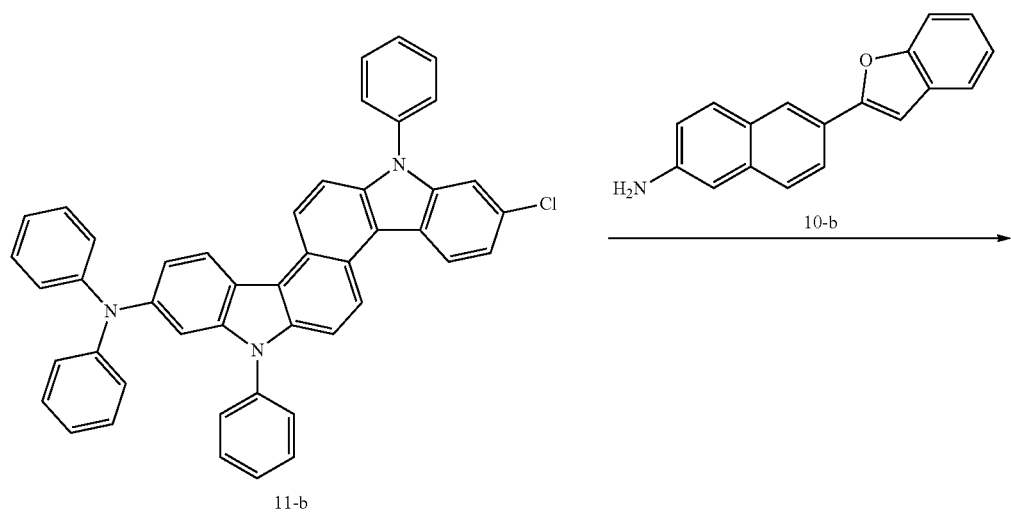
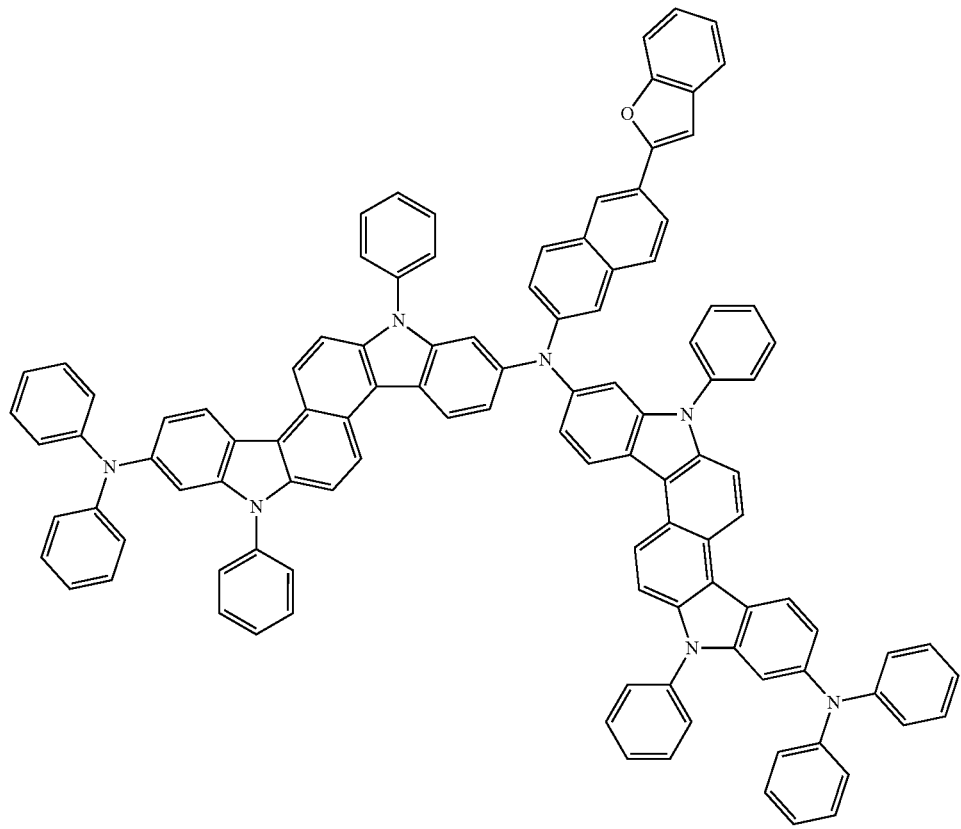

Compound 11-b (1.0 eq.), Compound 10-b (2.2 eq.), P(t-Bu)$_3$HBF$_4$ (10 mol %), and NaOt-Bu (2.2 eq.) were placed in a round bottom flask and dissolved in anhydrous PhMe (0.02 M). Pd$_2$(dba)$_3$ (5 mol %) was added dropwise to the reaction solution under a bath temperature of 105° C., and the mixture was stirred overnight. After the reaction, the reaction mixture was stirred and then cooled to room temperature. An excess of n-hexane was added dropwise to the reaction mixture to precipitate the product. The precipitate was washed with MeOH and H$_2$O and filtered to obtain a filter cake. A sufficiently dried filter cake was added to 1,2-dichlorobenzene and dissolved under heating. The dissolved reactant was passed through a celite-silica pad. An excess of n-hexane was added dropwise to the passed solution to precipitate the product. The precipitate was washed with n-hexane and MeOH and filtered to obtain a filter cake, which was sufficiently dried to synthesize Compound 12 (yield: 79%).

m/z[M+H]$^+$=1507.

Preparation Example 13: Synthesis of Compound 13

Step 13-1: Synthesis of Intermediate Compound 13-b

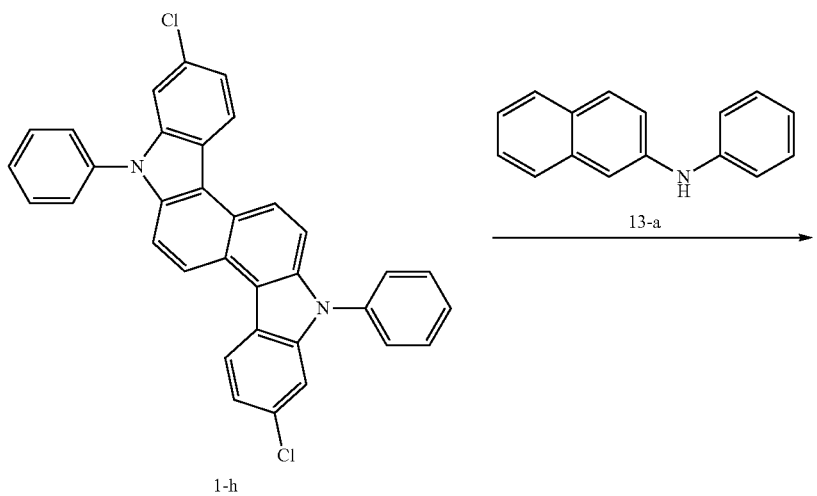

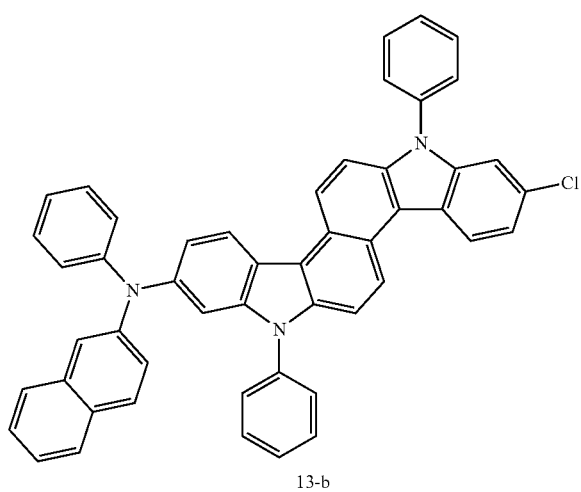

Compound 13-b (yield: 74%) was prepared in the same manner as in step 1-7, except that Compound 13-a was used instead of Compound 1-k.
m/z[M+H]⁺=710
Step 13-2: Synthesis of Compound 13
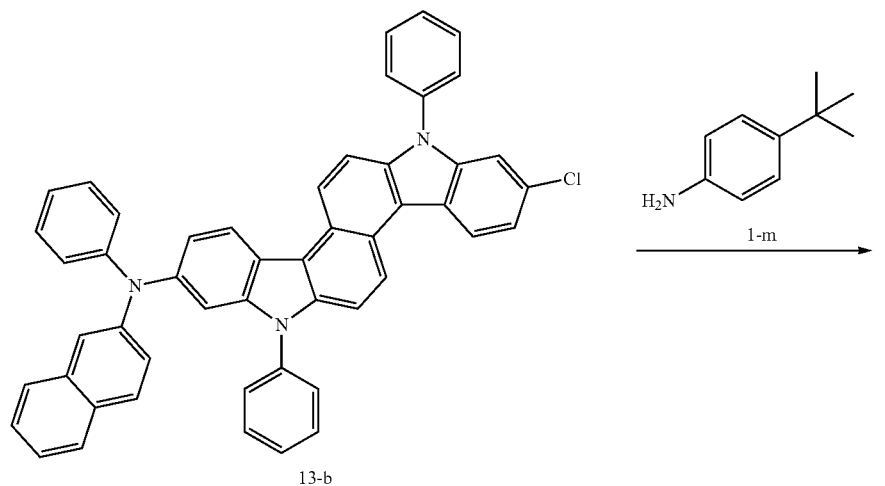

Compound 13 (yield: 88%) was prepared in the same manner as in step 1-8, except that Compound 13-b was used instead of Compound 1-l.

m/z[M+H]$^+$=1497

Preparation Example 14: Synthesis of Compound 14

Step 14-1: Synthesis of Intermediate Compound 14-a

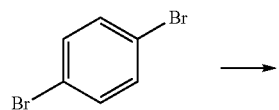

→

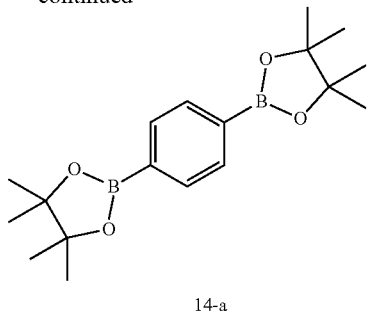

14-a 1,4-Dibromobenzene (1.0 eq.), B$_2$pin$_2$ (2.4 eq.) and KOAc (12.0 eq.) were placed in a round bottom flask and dissolved in anhydrous dioxane (0.3M). After raising the bath temperature to 120° C., Pd(dppf)Cl$_2$ (18 mol %) was added dropwise thereto, and the mixture was stirred overnight. After the reaction, the reaction mixture was washed with dichloromethane and water, the organic layer was separated, water was removed with MgSO$_4$, and passed through a celite-silica pad. The passed solution was concentrated under reduced pressure, and then purified by column chromatography to obtain Intermediate Compound 14-a (yield: 70%).

m/z[M+H]$^+$=331.

Step 14-2: Synthesis of Compound 14

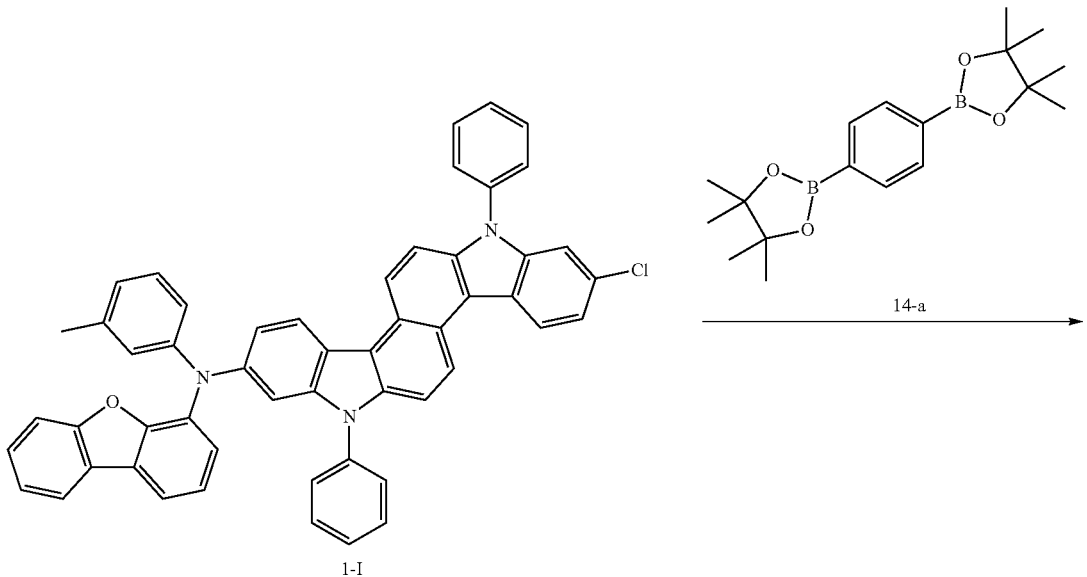

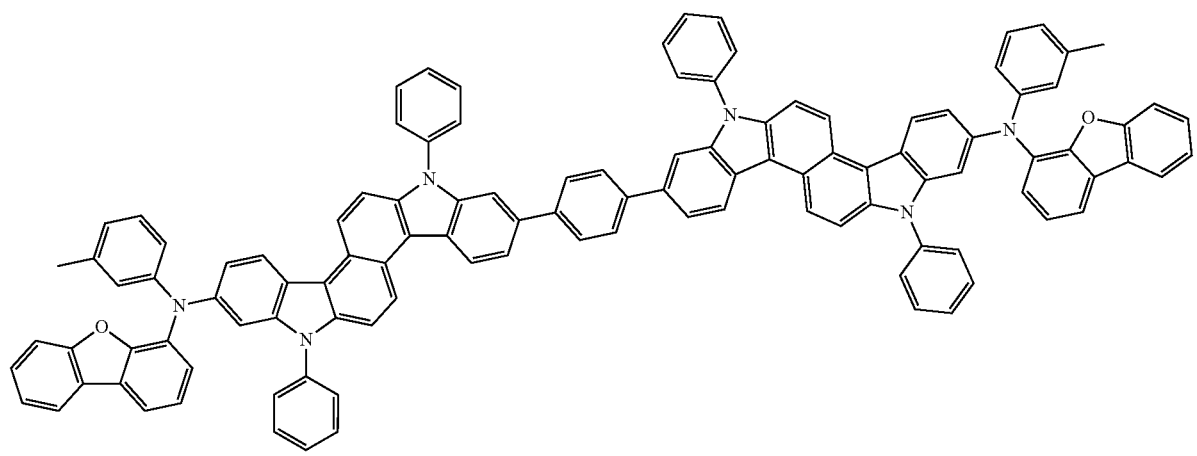

14

Compound 14-a (1.0 eq.) and Compound 1-1 (2.2 eq.) were placed in a round bottom flask and dissolved in anhydrous THF (0.3 M). $K_2CO_3$ (20 eq.) dissolved in $H_2O$ was added dropwise to the reaction solution. $Pd(PPh_3)_4$ (6 mol %) was added dropwise thereto under a bath temperature of 110° C., and the mixture was stirred overnight. After the reaction, the reaction mixture was stirred and then cooled to room temperature. An excess of n-hexane was added dropwise to the reaction mixture to precipitate the product. The precipitate was washed with MeOH and $H_2O$ and filtered to obtain a filter cake. A sufficiently dried filter cake was added to 1,2-dichlorobenzene and dissolved under heating. The dissolved reactant was passed through a celite-silica pad. An excess of n-hexane was added dropwise to the passed solution to precipitate the product. The precipitate was washed with n-hexane and MeOH and filtered to obtain a filter cake, which was sufficiently dried to synthesize Compound 14 (yield: 91%).

m/z[M+H]⁺=1534.

Preparation Example 15: Synthesis of Compound 15

Step 15-1: Synthesis of Intermediate Compound 15-a

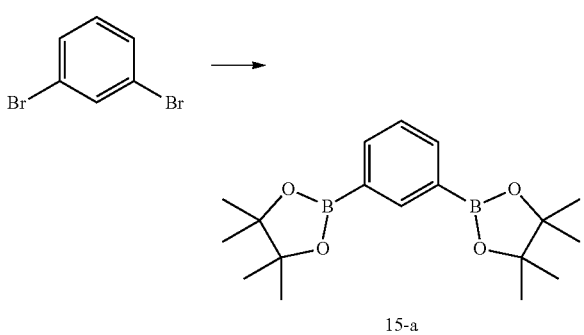

Compound 15-a (yield: 89%) was prepared in the same manner as in step 14-1, except that 1,3-dibromobenzene was used instead of 1,4-dibromobenzene.

m/z[M+H]⁺=331

Step 15-2: Synthesis of Compound 15
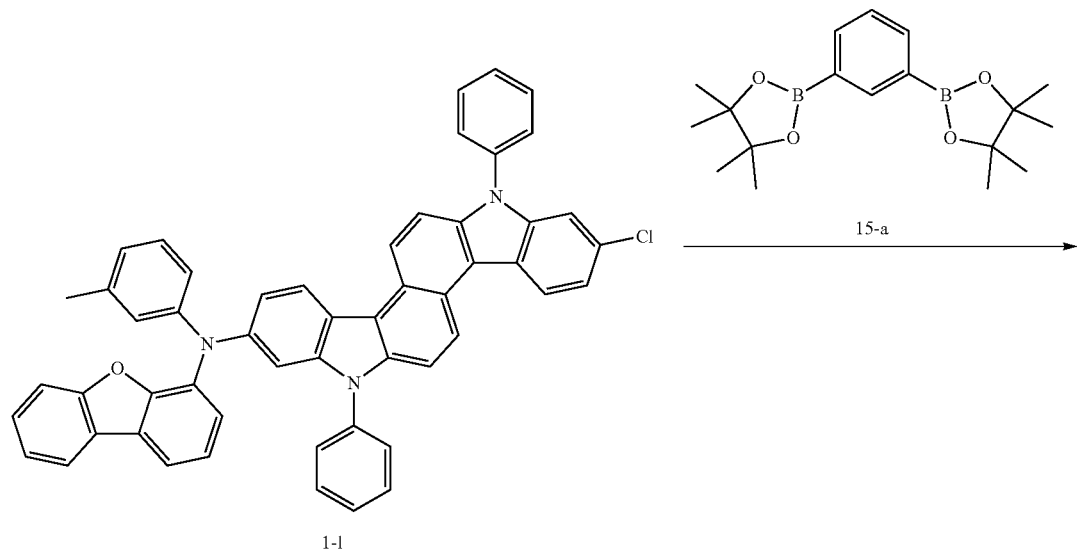
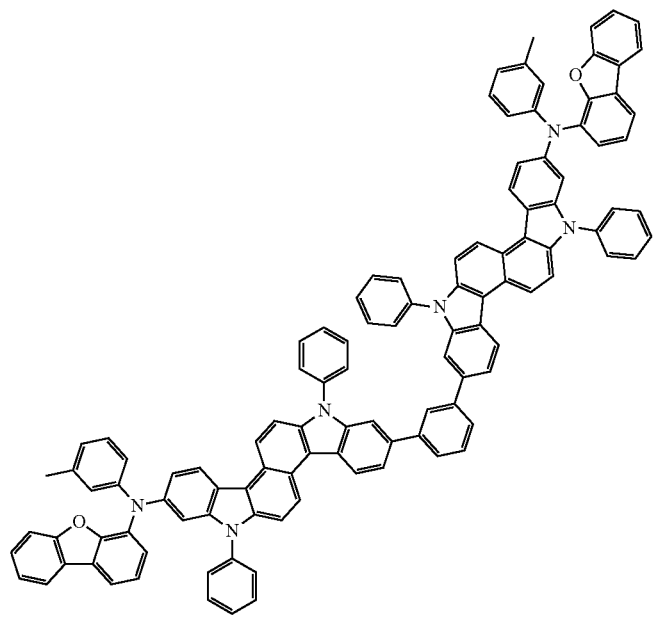

Compound 15 (yield: 86%) was prepared in the same manner as in step 14-2, except that Compound 15-a was used instead of Compound 14-a.
m/z[M+H]$^+$=1534
Preparation Example 16: Synthesis of Compound 16
Step 16-1: Synthesis of Intermediate Compound 16-a
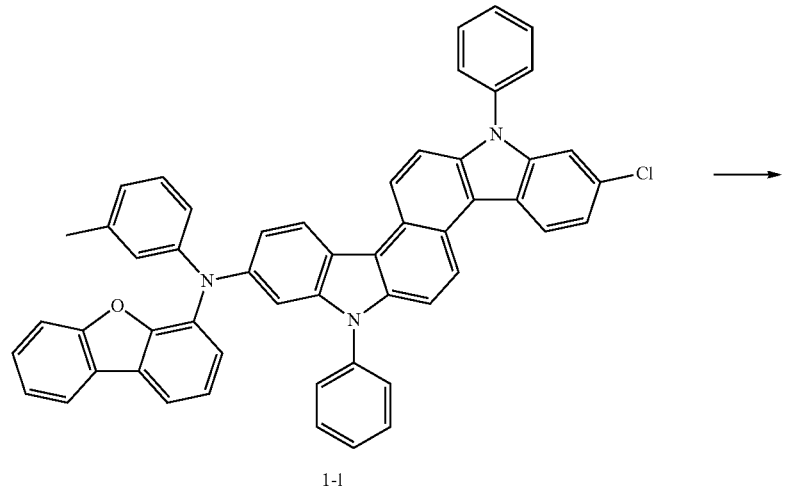
1-1
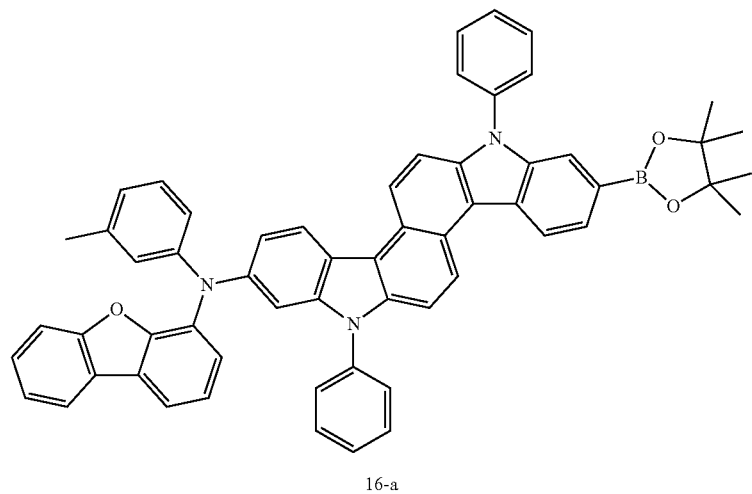
16-a Compound 1-l (1.0 eq.), B₂pin₂ (1.2 eq.) and KOAc (6.0 eq.) were placed in a round bottom flask and dissolved in anhydrous dioxane (0.3 M). After raising the bath temperature to 120° C., Pd(dppf)Cl₂ (9 mol %) was added dropwise thereto, and the mixture was stirred overnight. After the reaction, the reaction mixture was washed with dichloromethane and water, the organic layer was separated, water was removed with MgSO₄, and passed through a celite-silica pad. The passed solution was concentrated under reduced pressure, and then purified by column chromatography to obtain Intermediate Compound 16-a (yield: 64%).
m/z[M+H]⁺=856.

Step 16-2: Synthesis of Compound 16

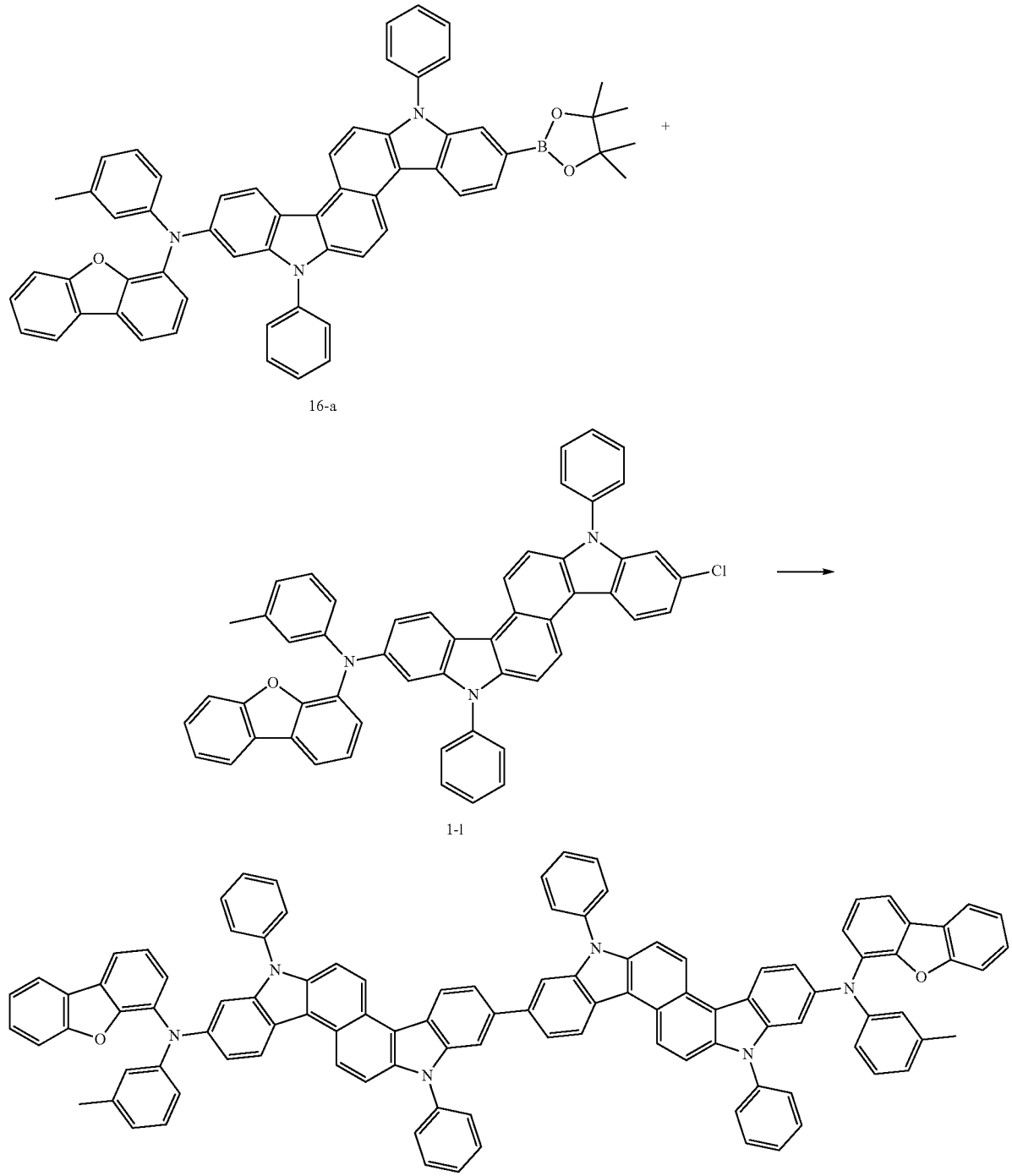

Compound 16-a (1.0 eq.) and Compound 1-l (1.03 eq.) were placed in a round bottom flask and dissolved in anhydrous THF (0.3 M). K$_2$CO$_3$ (1.3 eq.) dissolved in H$_2$O was added dropwise to the reaction solution. Pd(PPh$_3$)$_4$ (1.5 mol %) was added dropwise thereto under a bath temperature of 110° C., and the mixture was stirred overnight. After the reaction, the reaction mixture was stirred and then cooled to room temperature. An excess of n-hexane was added dropwise to the reaction mixture to precipitate the product. The precipitate was washed with MeOH and H$_2$O and filtered to obtain a filter cake. A sufficiently dried filter cake was added to 1,2-dichlorobenzene and dissolved under heating. The dissolved reactant was passed through a celite-silica pad. An excess of n-hexane was added dropwise to the passed solution to precipitate the product. The precipitate was washed with n-hexane and MeOH and filtered to obtain a filter cake, which was sufficiently dried to synthesize Compound 16 (yield: 91%).

m/z[M+H]$^+$=1458.

Preparation Example 17: Synthesis of Compound 17

Step 17-1: Synthesis of Intermediate Compound 17-a

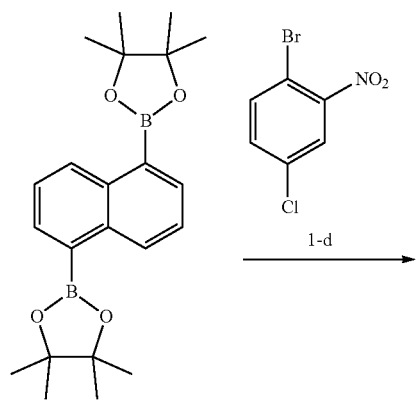

Compound 1-c (1.0 eq.), Compound 1-d (1.03 eq.) and Pd(PPh$_3$)$_4$ (6 mol %) were placed in a round bottom flask and dissolved in anhydrous PhMe (0.3 M). After raising the bath temperature to 80° C., Cs$_2$CO$_3$ (2.2 eq.) dissolved in H$_2$O was added dropwise to the reaction solution. The reaction solution was stirred for 6 hours under a bath temperature of 80° C. After the reaction, the reaction mixture was washed with dichloromethane and water, the organic layer was separated, water was removed with MgSO$_4$, and passed through a celite-silica pad. The passed solution was concentrated under reduced pressure, and then purified by column chromatography to obtain Intermediate Compound 17-a (yield: 55%).

m/z[M+H]$^+$=410.

Step 17-2: Synthesis of Intermediate Compound 17-c

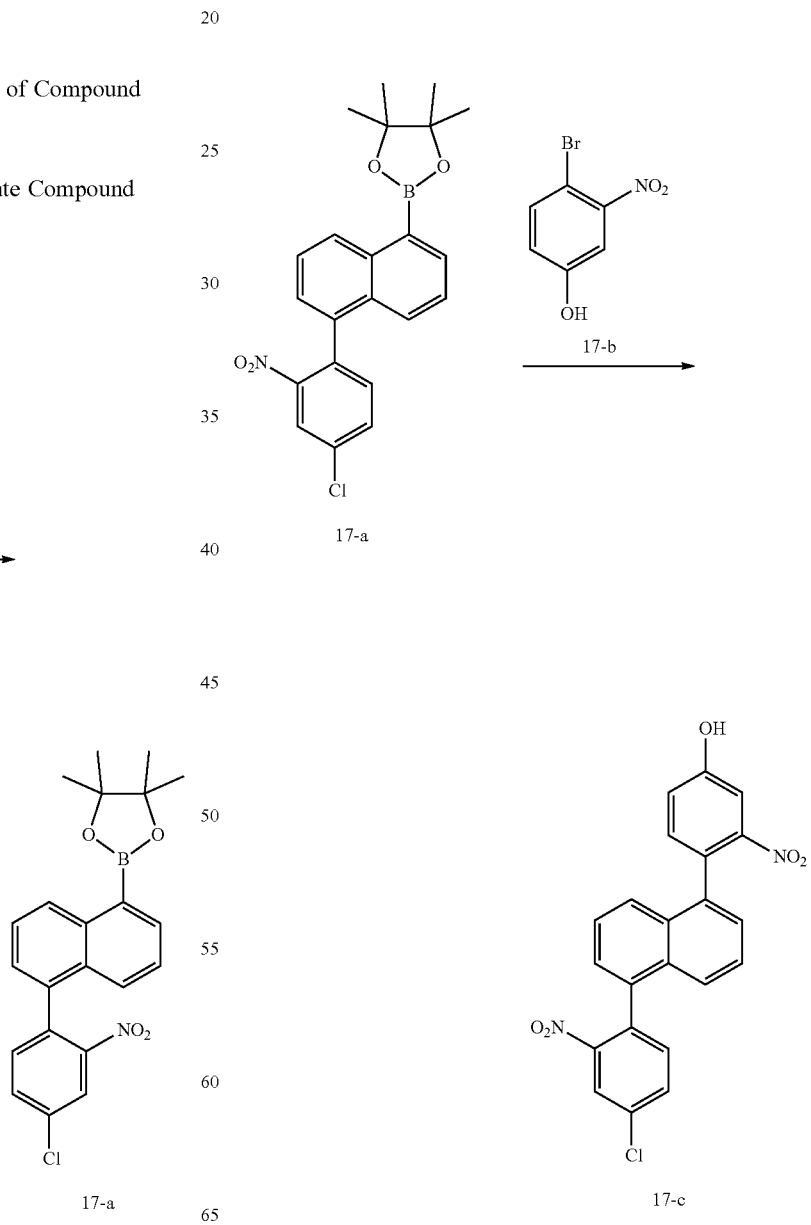

Compound 17-a (1.0 eq.), Compound 17-b (1.03 eq.) and Pd(PPh$_3$)$_4$ (6 mol %) were placed in a round bottom flask and dissolved in anhydrous PhMe (0.3 M). After raising the bath temperature to 110° C., Cs$_2$CO$_3$ (2.2 eq.) dissolved in H$_2$O was added dropwise to the reaction solution. The reaction solution was stirred overnight under a bath temperature of 110° C. After the reaction, the reaction mixture was washed with dichloromethane and water, the organic layer was separated, water was removed with MgSO$_4$, and passed through a celite-silica pad. The passed solution was concentrated under reduced pressure, and then purified by column chromatography to obtain Intermediate Compound 17-c (yield: 91%).

m/z[M+H]$^+$=421.

Step 17-3: Synthesis of Intermediate Compound 17-d

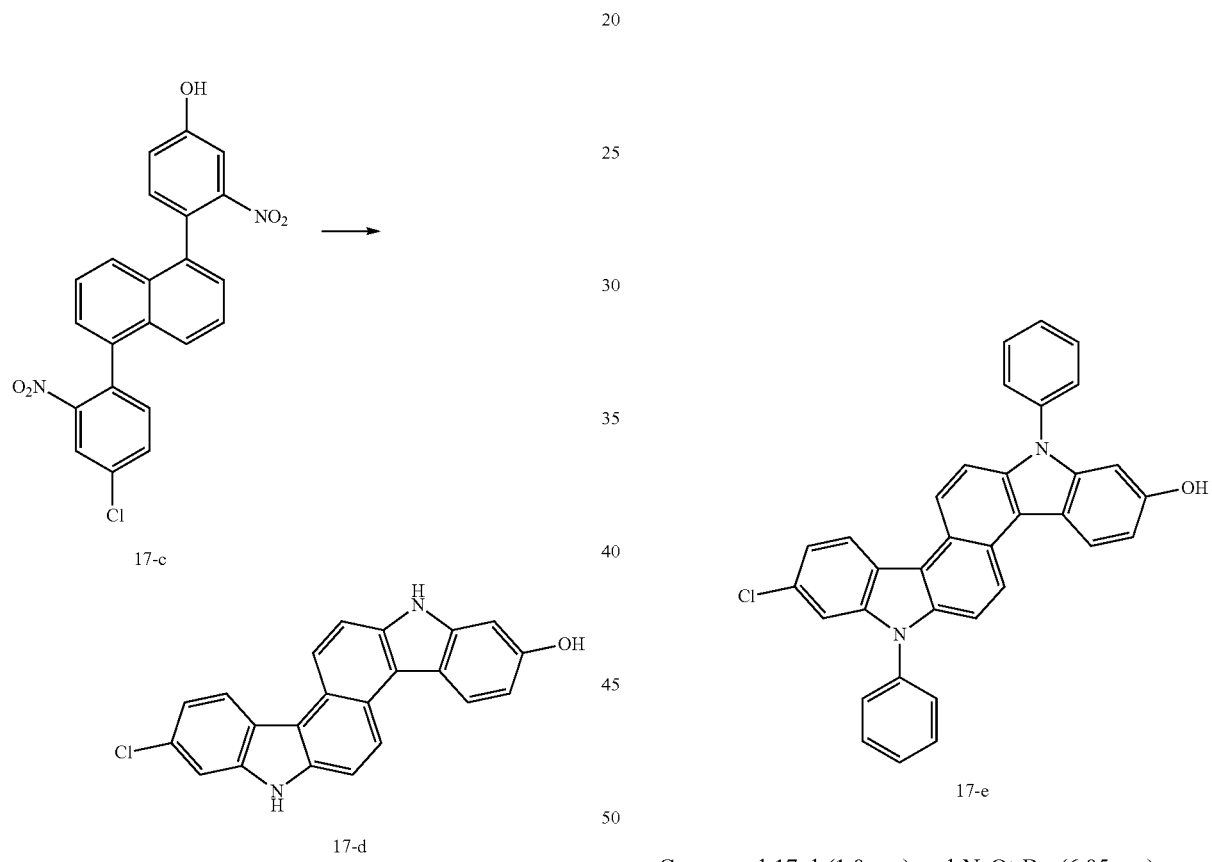

Compound 17-c (1.0 eq.) and PPh$_3$ (5.0 eq.) were placed in a round bottom flask and dissolved in anhydrous 1,2-dichlorobenzene (0.075 M). The reaction solution was stirred overnight under a bath temperature of 180° C. After the reaction, the reaction mixture was stirred and then cooled to room temperature. After the reaction, the reaction mixture was washed with dichloromethane and water, the organic layer was separated, water was removed with MgSO$_4$, and passed through a celite-silica pad. The passed solution was concentrated under reduced pressure, and then purified by column chromatography to obtain Intermediate Compound 17-d (yield: 79%).

m/z[M+H]$^+$=357.

Step 17-4: Synthesis of Intermediate Compound 17-e

Compound 17-d (1.0 eq.) and NaOt-Bu (6.05 eq.) were placed in a round bottom flask and dissolved in anhydrous PhMe (0.03 M). Then, Compound 1-g (7.1 eq.) was added dropwise to the reaction solution. Pd(P(t-Bu)$_3$)$_2$ (20 mol %) was added dropwise to the reaction solution under a bath temperature of 110° C., and stirred for 22 hours. After the reaction, the reaction mixture was washed with dichloromethane and water, the organic layer was separated, water was removed with MgSO$_4$, and passed through a celite-silica pad. The passed solution was concentrated under reduced pressure, and then purified by column chromatography to obtain Intermediate Compound 17-e (yield: 87%).

m/z[M+H]$^+$=509.

Step 17-5: Synthesis of Intermediate Compound 17-f
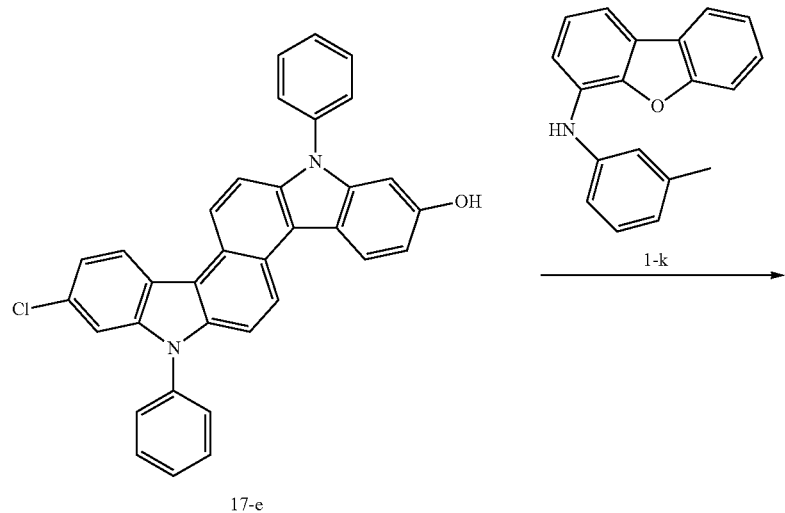
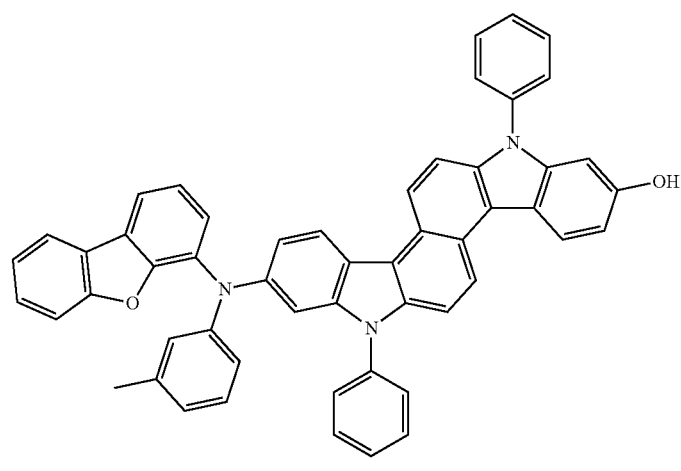

Compound 17-e (1.0 eq.), Compound 1-k (1.03 eq.), P(t-Bu)$_3$HBF$_4$ (5 mol %), and NaOt-Bu (1.1 eq.) were placed in a round bottom flask and dissolved in anhydrous PhMe (0.02 M). Pd$_2$(dba)$_3$ (2.5 mol %) was added dropwise to the reaction solution under a bath temperature of 105° C., and the mixture was stirred for 4 hours. After the reaction, the reaction mixture was washed with dichloromethane and water, the organic layer was separated, water was removed with MgSO$_4$, and passed through a celite-silica pad. The passed solution was concentrated under reduced pressure, and then purified by column chromatography to obtain Intermediate Compound 17-f (yield: 89%).

m/z[M+H]$^+$=746.

Step 17-6: Synthesis of Compound 17

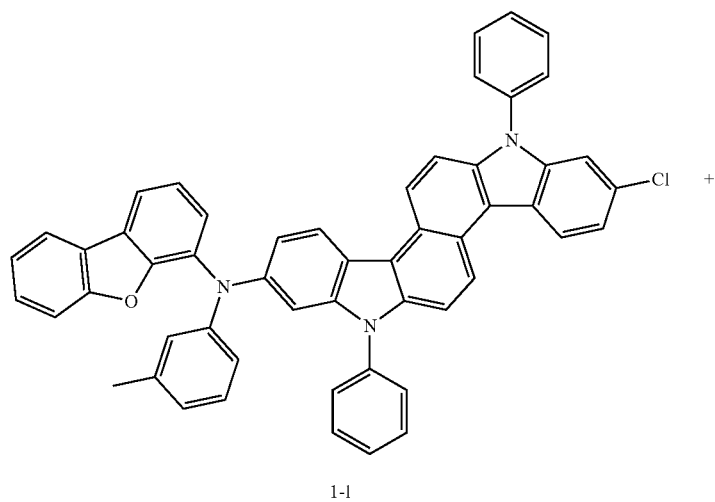

1-l

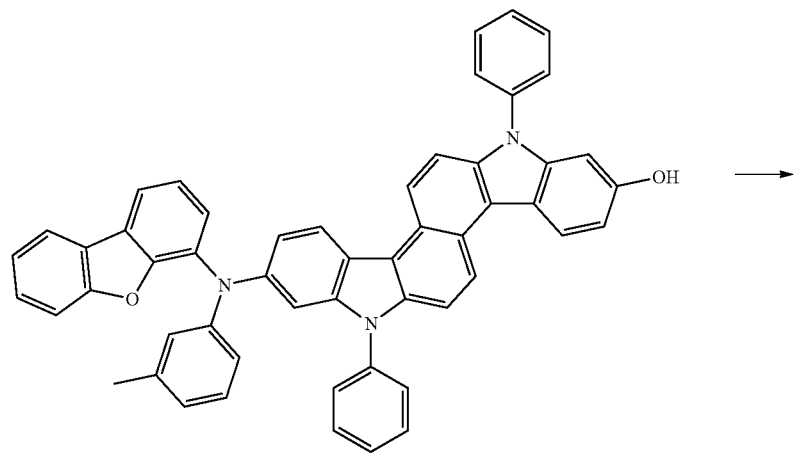

17-f

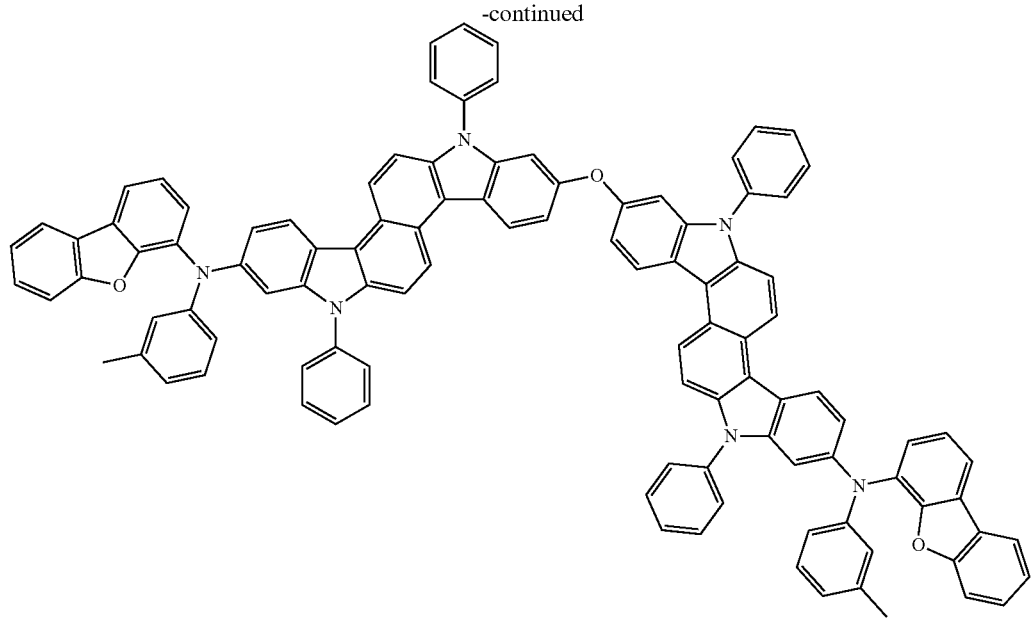

17

Compound 1-l (1.0 eq.), Compound 17-f (1.5 eq.), CuBr (0.1 eq.) and $Cs_2CO_3$ (2.5 eq.) were placed in a round bottom flask and dissolved in anhydrous DMF (0.3 M). 2,2,6,6-tetramethyl-3,5-5 heptanedione (0.8 eq.) was added dropwise to the reaction solution, and the mixture was stirred for 36 hours under a bath temperature of 135° C. After the reaction, the reaction mixture was stirred and then cooled to room temperature. An excess of n-hexane was added dropwise to the reaction mixture to precipitate the product. The precipitate was washed with MeOH and $H_2O$ and filtered to obtain a filter cake. A sufficiently dried filter cake was added to 1,2-dichlorobenzene and dissolved under heating. The dissolved reactant was passed through a celite-silica pad. An excess of n-hexane was added dropwise to the passed solution to precipitate the product. The precipitate was washed with n-hexane and MeOH and filtered to obtain a filter cake, which was sufficiently dried to synthesize Compound 17 (yield: 72%).

m/z[M+H]$^+$=1474.

Preparation Example 18: Synthesis of Compound 18

Step 18-1: Synthesis of Compound 18

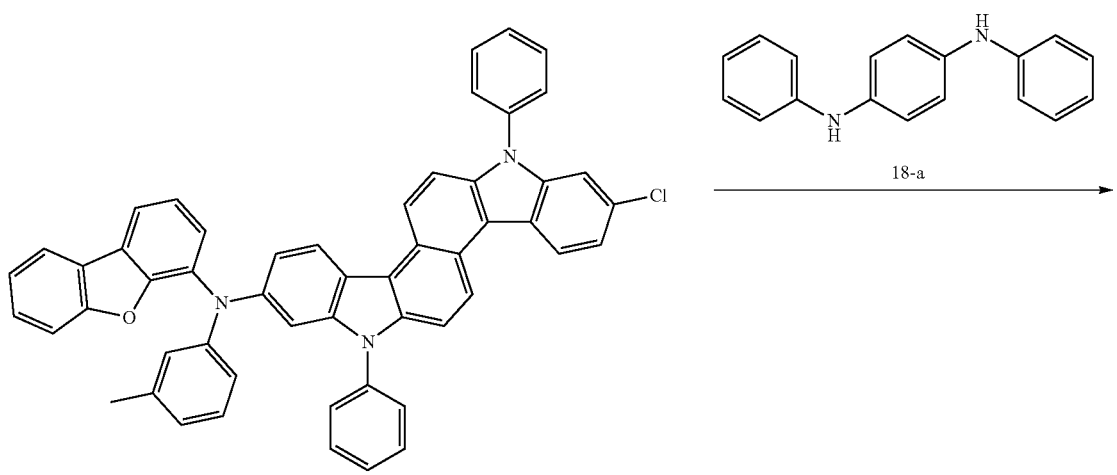

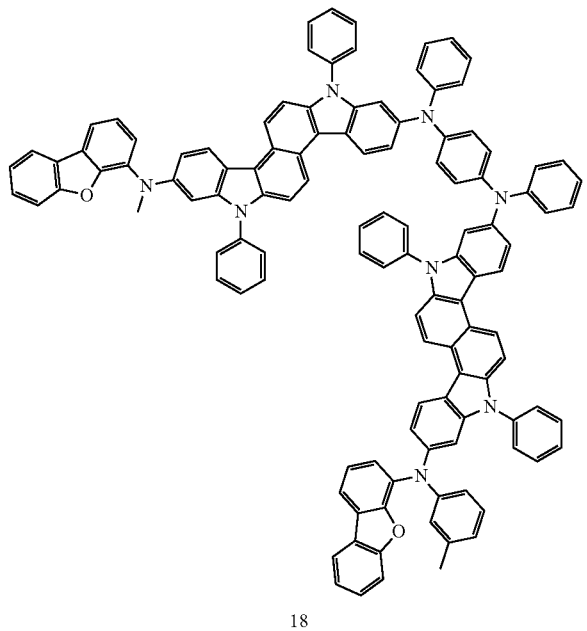
18
Compound 18 (yield: 71%) was prepared in the same manner as in step 1-8, except that Compound 18-a was used instead of Compound 1-m.
m/z[M+H]$^+$=1716
Preparation Example 19: Synthesis of Compound 19
Step 19-1: Synthesis of Intermediate Compound 19-b
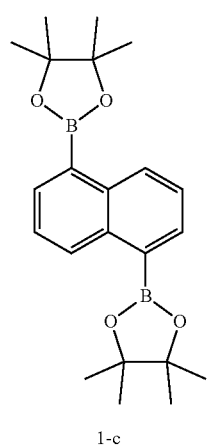
1-c
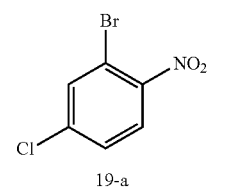
19-a
-continued
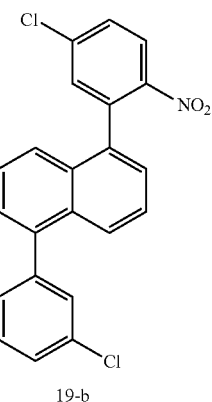
19-b
Compound 19-b (yield: 87%) was prepared in the same manner as in step 1-3, except that Compound 19-a was used instead of Compound 1-d.
m/z[M+H]$^+$=439

Step 19-2: Synthesis of Intermediate Compound 19-c

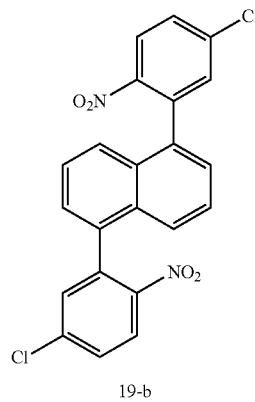

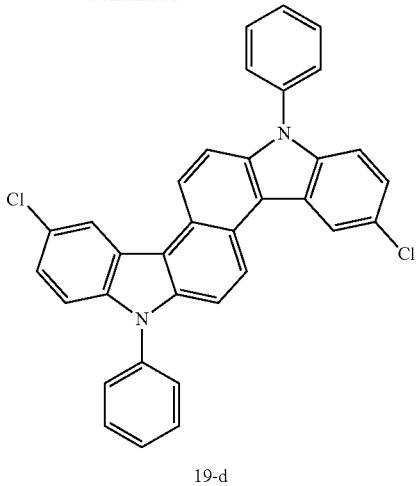

Compound 19-d (yield: 86%) was prepared in the same manner as in step 1-5, except that Compound 19-c was used instead of Compound 1-f.

m/z[M+H]$^+$=527

Step 19-4: Synthesis of Intermediate Compound 19-e

Compound 19-c (yield: 79%) was prepared in the same manner as in step 1-4, except that Compound 19-b was used instead of Compound 1-e.

m/z[M+H]$^+$=375

Step 19-3: Synthesis of Intermediate Compound 19-d

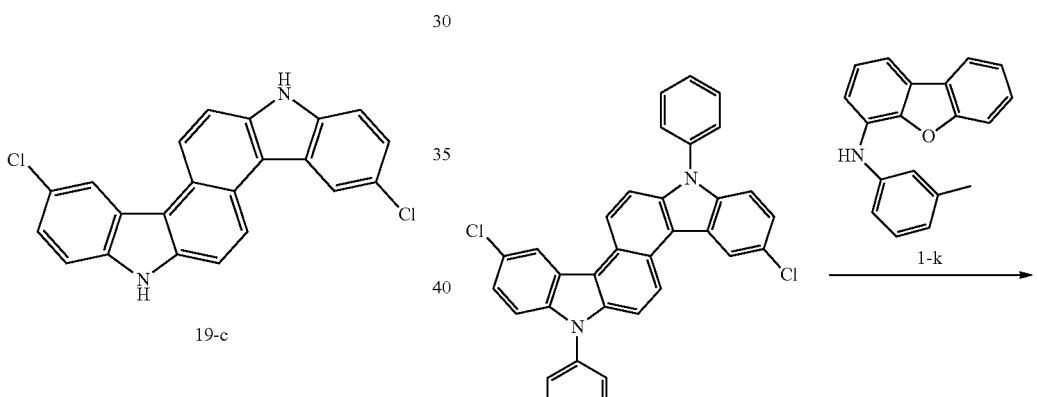

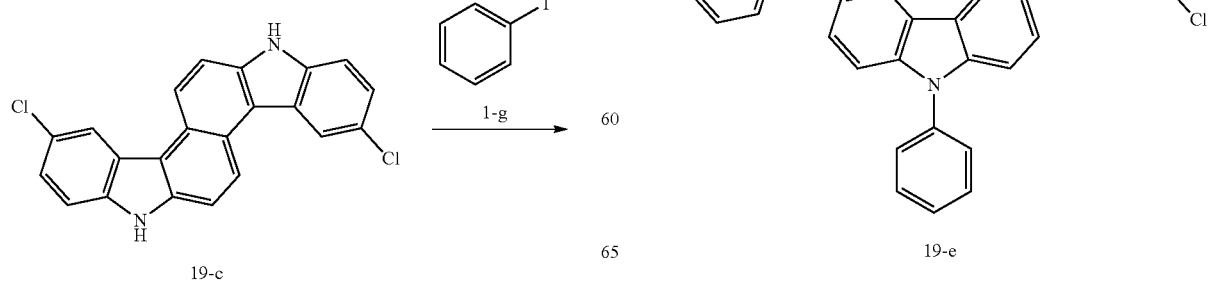

Compound 19-e (yield: 82%) was prepared in the same manner as in step 1-7, except that Compound 19-d was used instead of Compound 1-h.
m/z[M+H]⁺=764
Step 19-5: Synthesis of Compound 19
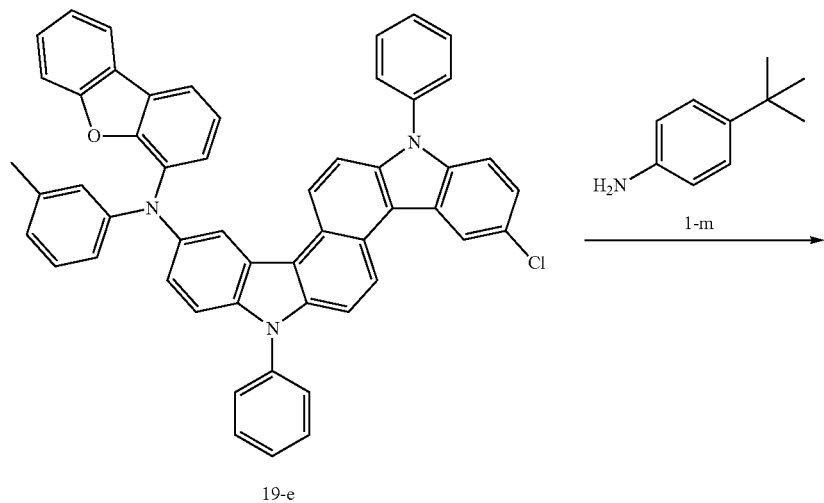
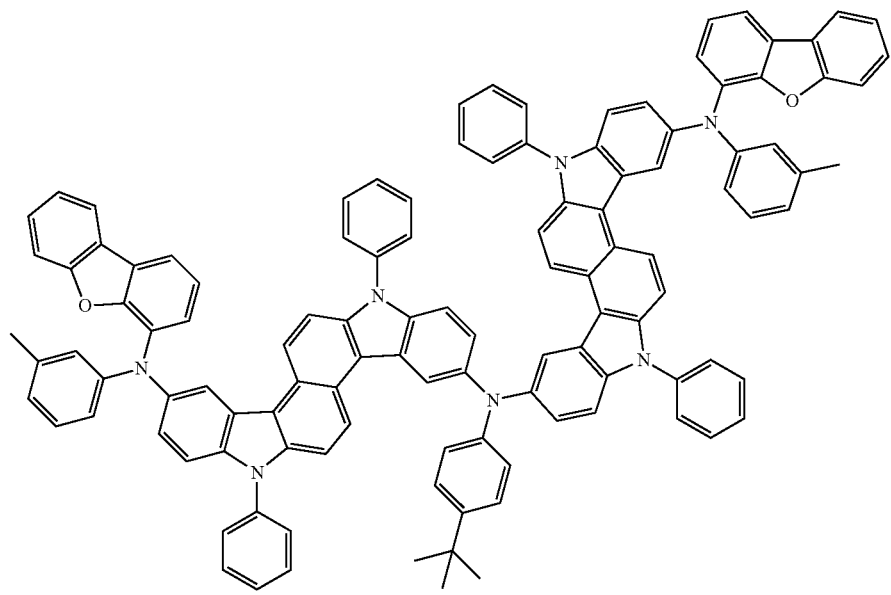

Compound 19 (yield: 81%) was prepared in the same manner as in step 1-8, except that Compound 19-e was used instead of Compound 1-l.

m/z[M+H]$^+$=1605

Preparation Example 20: Synthesis of Compound 20

Step 20-1: Synthesis of Intermediate Compound 20-b

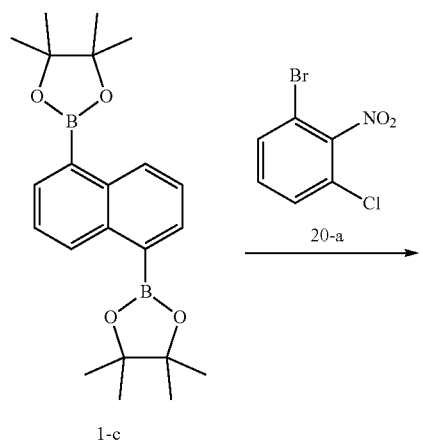

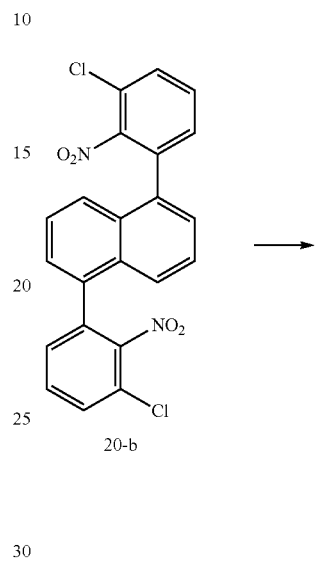

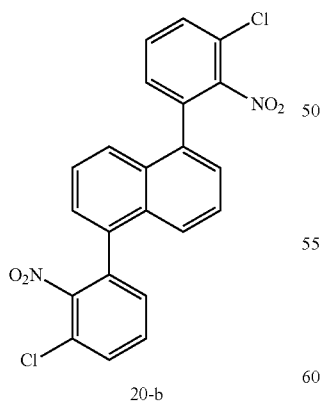

Compound 20-b (yield: 89%) was prepared in the same manner as in step 1-3, except that Compound 20-a was used instead of Compound 1-d.

m/z[M+H]$^+$=439

Step 20-2: Synthesis of Intermediate Compound 20-c

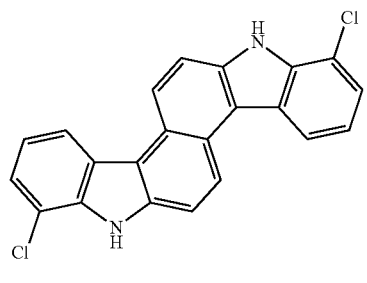

Compound 20-c (yield: 81%) was prepared in the same manner as in step 1-4, except that Compound 20-b was used instead of Compound 1-e.

m/z[M+H]$^+$=375

Step 20-3: Synthesis of Intermediate Compound 20-d
Step 20-4: Synthesis of Intermediate Compound 20-e
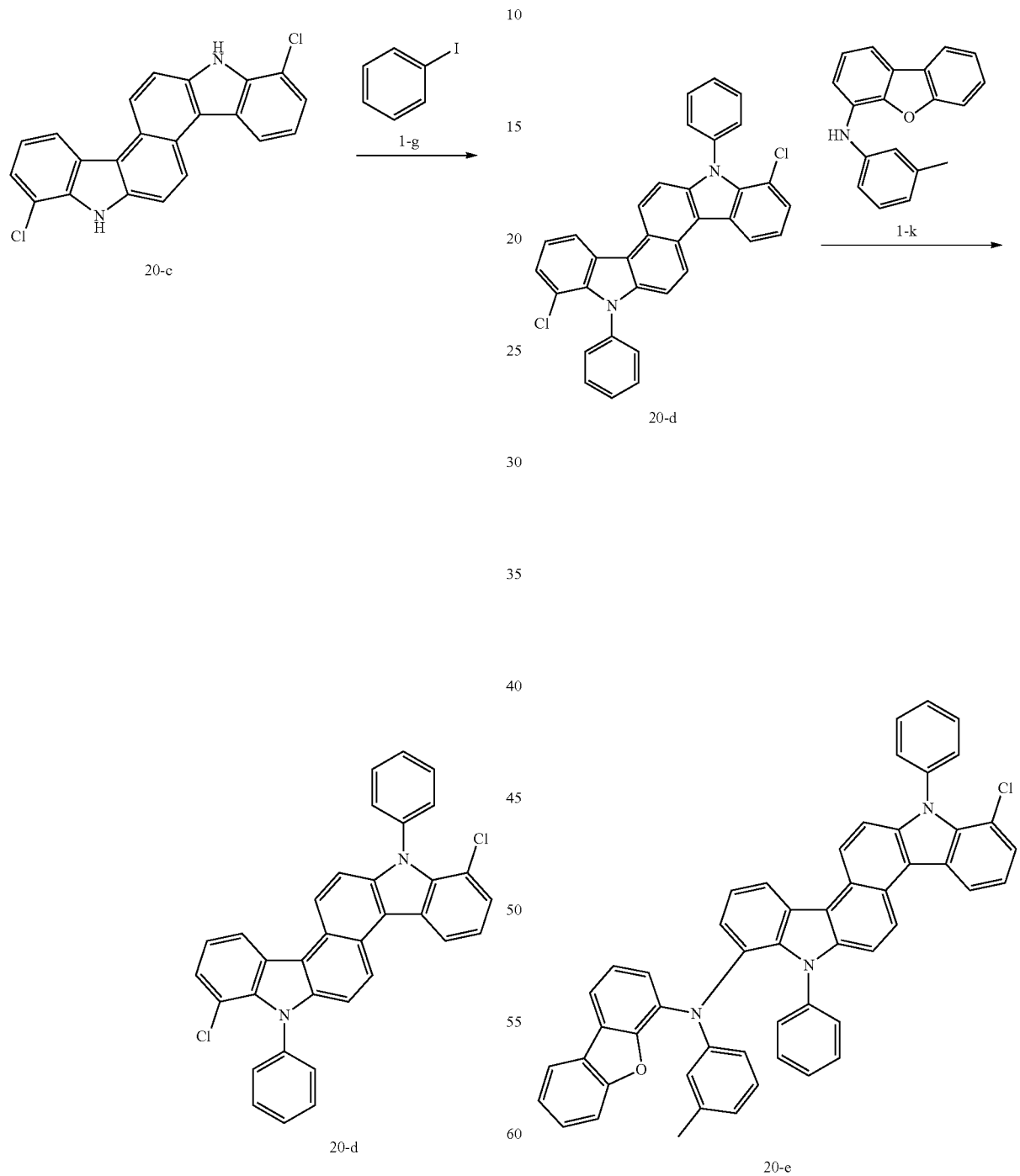
Compound 20-d (yield: 82%) was prepared in the same manner as in step 1-5, except that Compound 20-c was used instead of Compound 1-f.
m/z[M+H]$^+$=527
Compound 20-e (yield: 79%) was prepared in the same manner as in step 1-7, except that Compound 20-d was used instead of Compound 1-h.
m/z[M+H]$^+$=764

Step 20-5: Synthesis of Compound 20
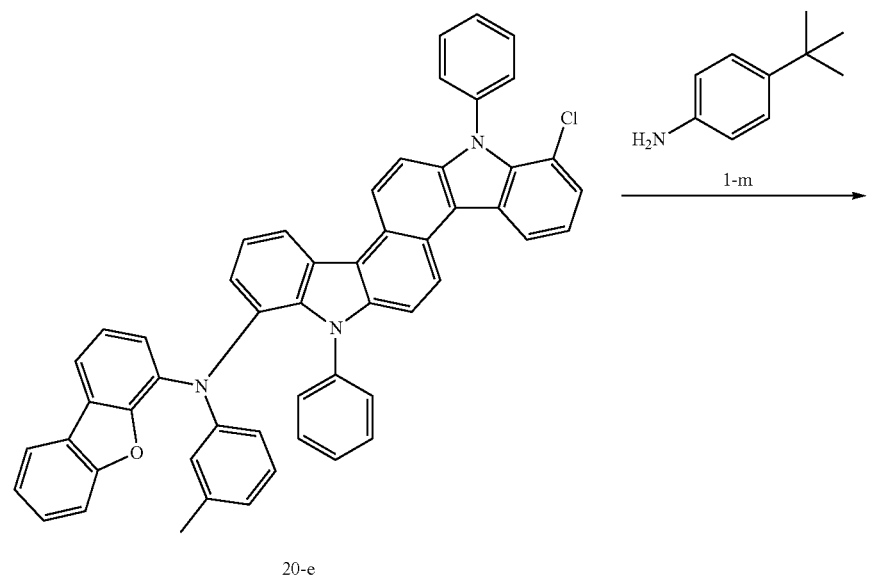
20-e
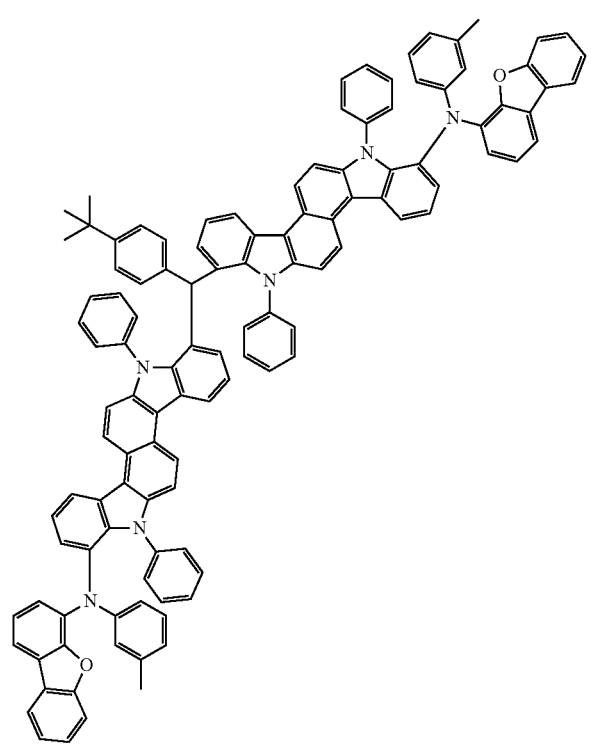
20

Compound 20 (yield: 83%) was prepared in the same manner as in step 1-8, except that Compound 20-e was used instead of Compound 1-l.

m/z[M+H]$^+$=1605

Preparation Example 21: Synthesis of Compound 21

Step 21-1: Synthesis of Intermediate Compound 21-b

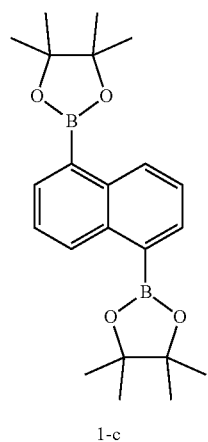

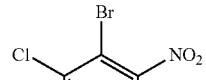

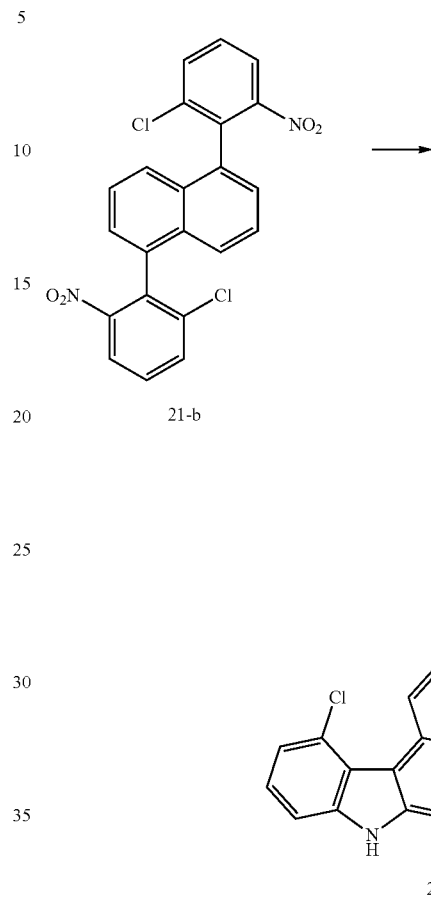

Compound 21-b (yield: 89%) was prepared in the same manner as in step 1-3, except that Compound 21-a was used instead of Compound 1-d.

m/z[M+H]$^+$=439

Step 21-2: Synthesis of Intermediate Compound 21-c

Compound 21-c (yield: 81%) was prepared in the same manner as in step 1-4, except that Compound 21-b was used instead of Compound 1-e.

m/z[M+H]$^+$=375

Step 21-3: Synthesis of Intermediate Compound 21-d

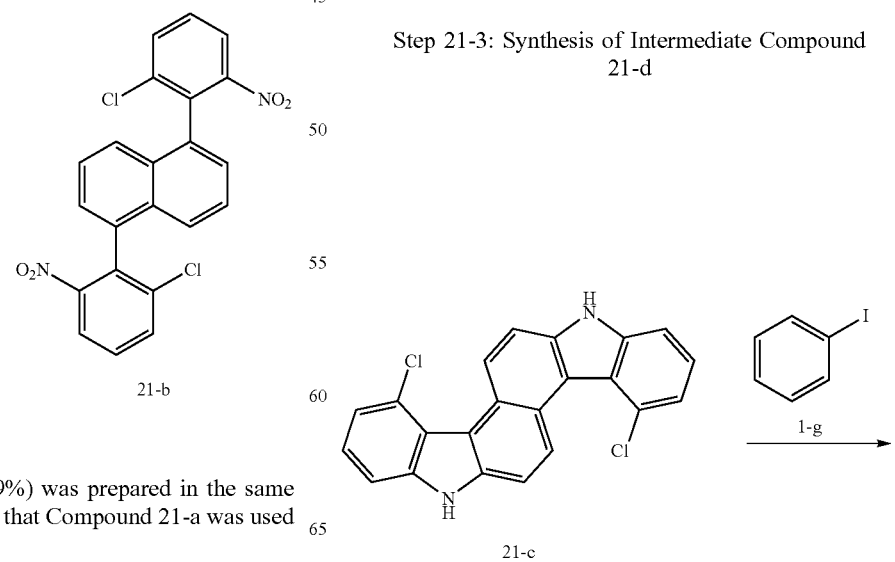

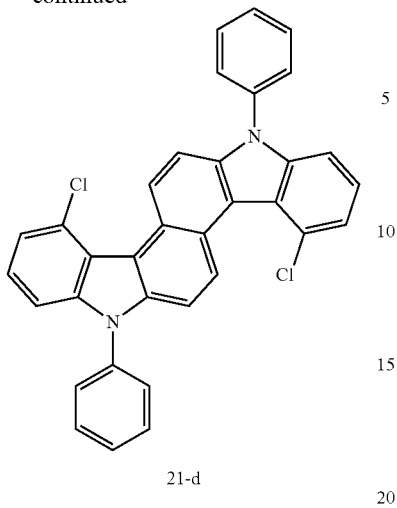
21-d
Compound 21-d (yield: 89%) was prepared in the same manner as in step 1-5, except that Compound 21-c was used instead of Compound 1-f.
m/z[M+H]⁺=527
Step 21-4: Synthesis of Intermediate Compound 21-e
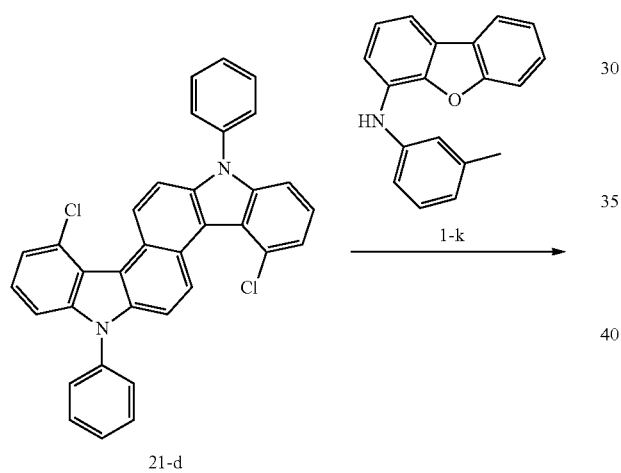
21-d
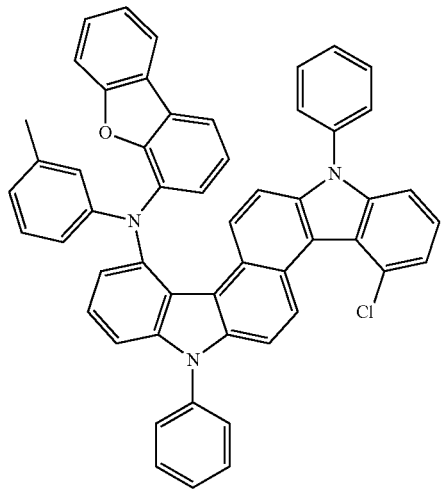
21-e
Compound 21-e (yield: 82%) was prepared in the same manner as in step 1-7, except that Compound 21-d was used instead of Compound 1-h.
m/z[M+H]⁺=764
Step 21-5: Synthesis of Compound 21
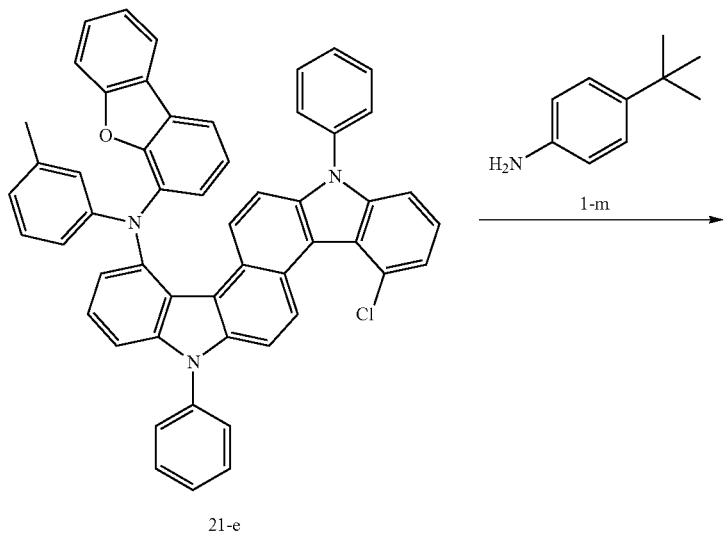
21-e -continued
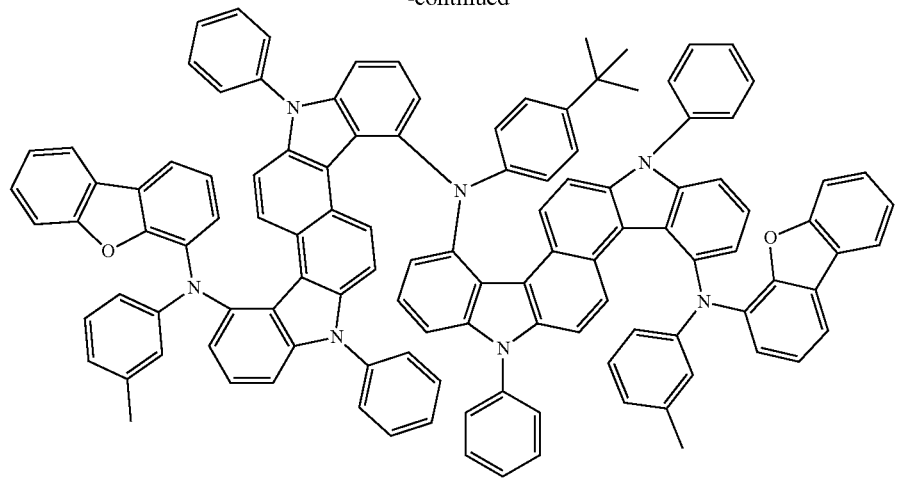
21
Compound 21 (yield: 85%) was prepared in the same manner as in step 1-8, except that Compound 21-e was used instead of Compound 1-l.
m/z[M+H]$^+$=1605
Comparative Preparation Example 1: Synthesis of Comparative Compound F
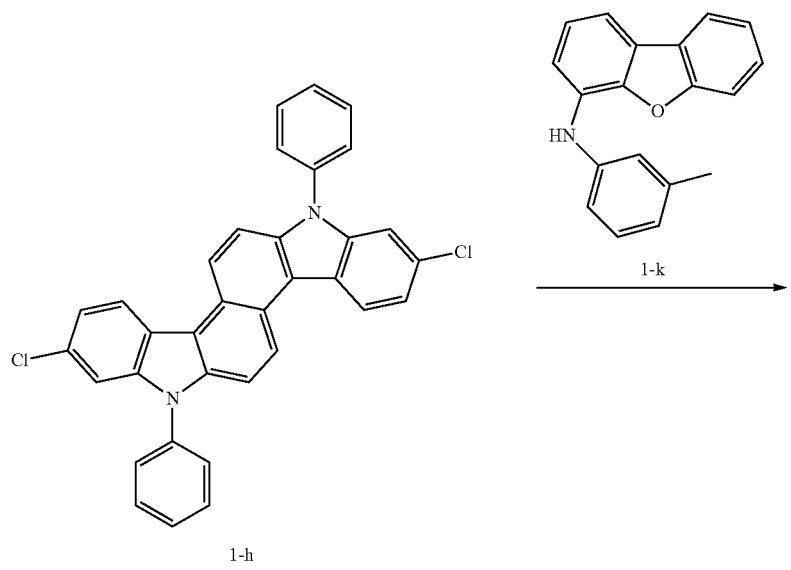

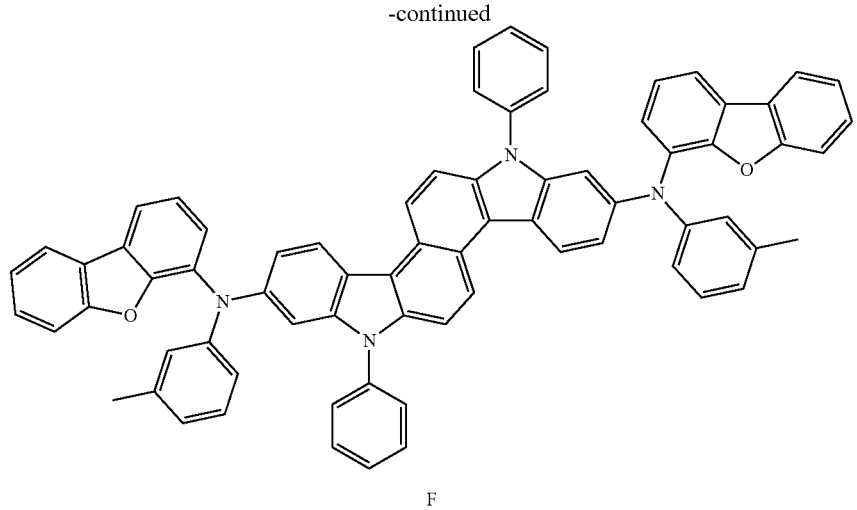

F

Compound 1-h (1.0 eq.), Compound 1-k (2.3 eq.), P(t-Bu)$_3$HBF$_4$ (10 mol %), and NaOt-Bu (2.2 eq.) were placed in a round bottom flask and dissolved in anhydrous PhMe (0.02 M). Pd$_2$(dba)$_3$ (5 mol %) was added dropwise to the reaction solution under a bath temperature of 105° C., and the mixture was stirred overnight. After the reaction, the reaction mixture was stirred and then cooled to room temperature. An excess of n-hexane was added dropwise to the reaction mixture to precipitate the product. The precipitate was washed with MeOH and H$_2$O and filtered to obtain a filter cake. A sufficiently dried filter cake was added to 1,2-dichlorobenzene and dissolved under heating. The dissolved reactant was passed through a celite-silica pad. An excess of n-hexane was added dropwise to the passed solution to precipitate the product. The precipitate was washed with n-hexane and MeOH and filtered to obtain a filter cake, which was sufficiently dried to synthesize Comparative Compound F (yield: 71%).

m/z[M+H]$^+$=1001.

Comparative Preparation Example 2: Synthesis of Comparative Compound G

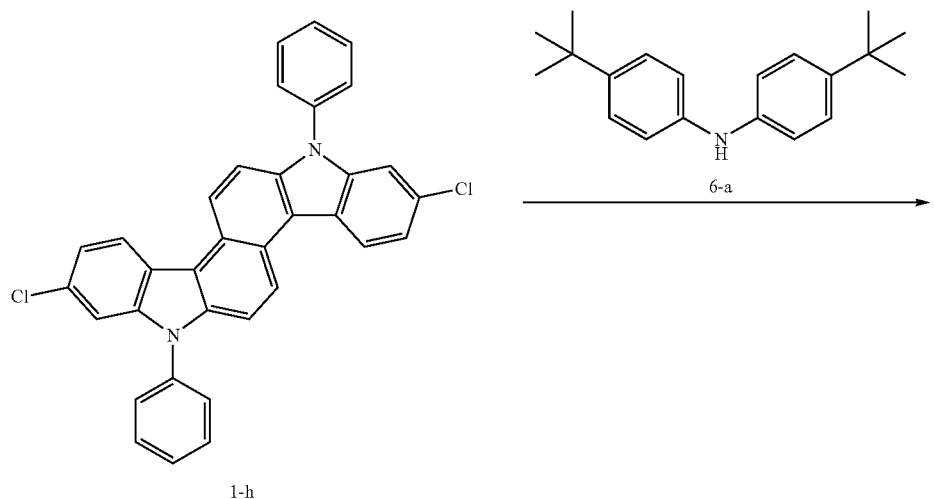

1-h

-continued
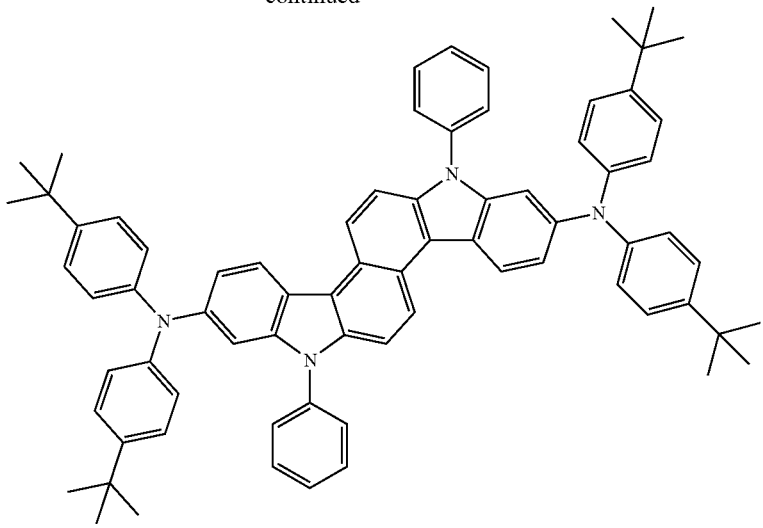
G
Compound G (yield: 74%) was prepared in the same manner as in the synthesis of Comparative Compound F, except that Compound 6-a was used instead of Compound 1-k.
m/z[M+H]$^+$=1018
Comparative Preparation Example 3: Synthesis of Comparative Compound H
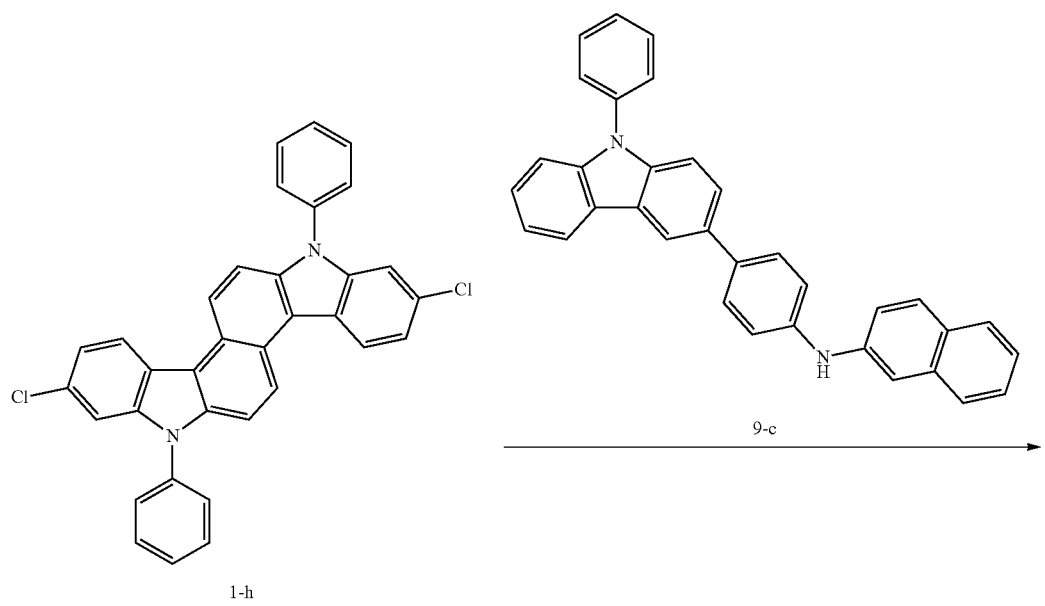

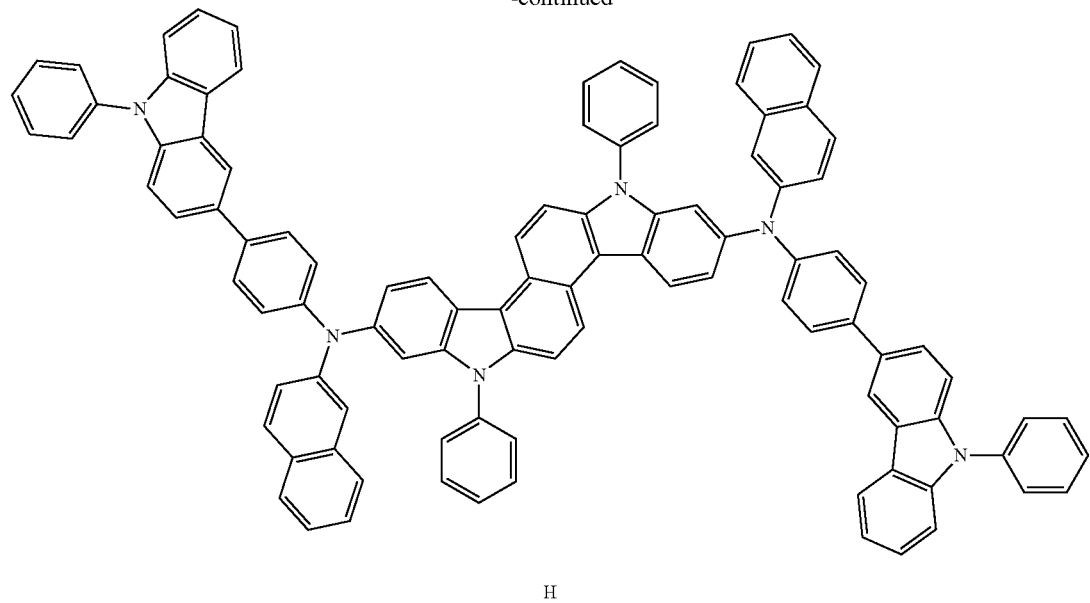
H
Compound H (yield: 68%) was prepared in the same manner as in the synthesis of Comparative Compound F, except that Compound 9-c was used instead of Compound 1-k.
m/z[M+H]⁺=1376
Comparative Preparation Example 4: Synthesis of Comparative Compound I
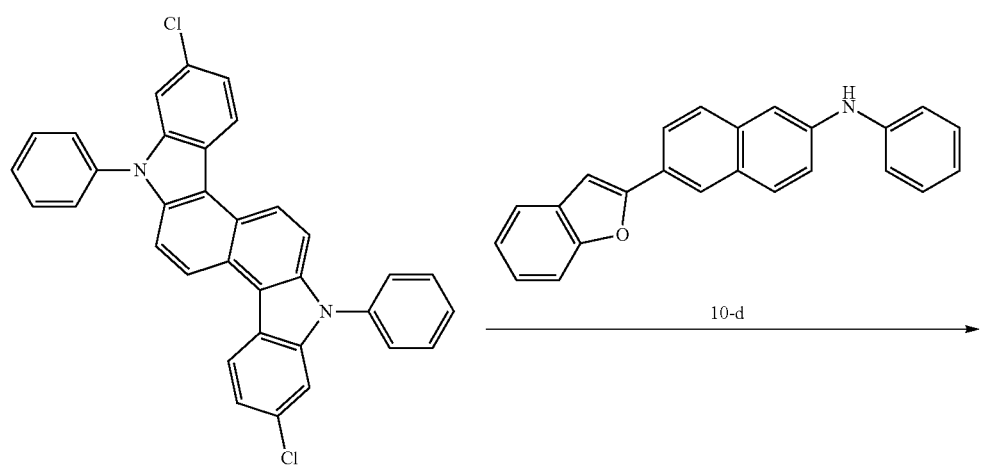

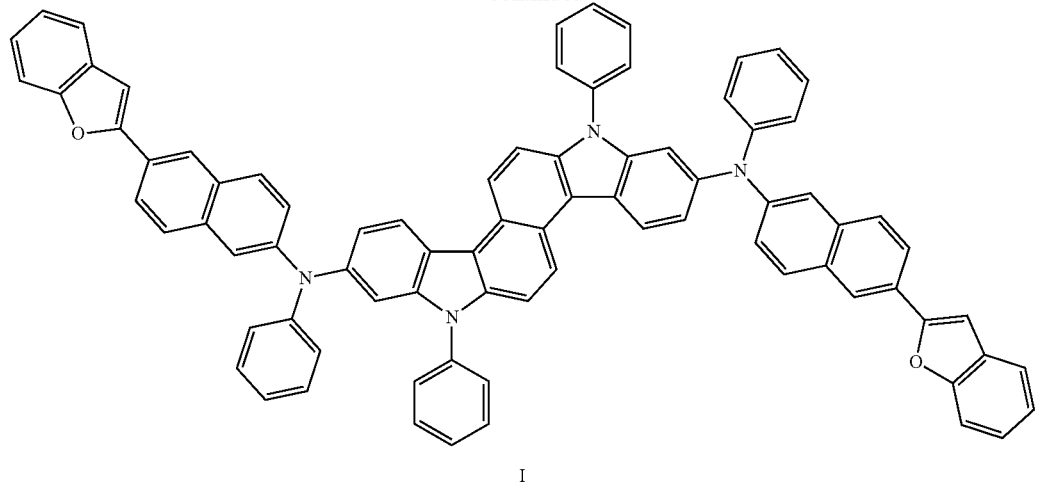
I
Compound I (yield: 68%) was prepared in the same manner as in the synthesis of Comparative Compound F, except that Compound 10-d was used instead of Compound 1-k.
m/z[M+H]$^+$=1125
Comparative Preparation Example 5: Synthesis of Comparative Compound J
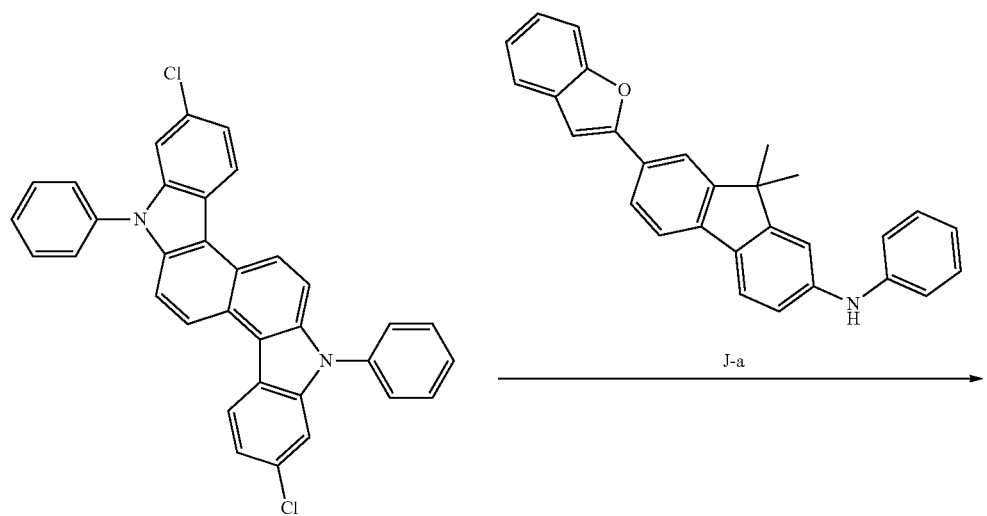

-continued

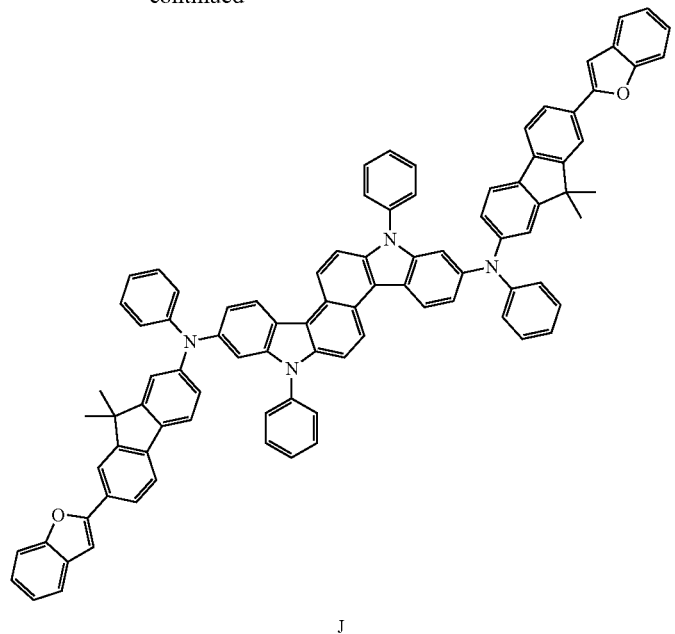

J

Compound J (yield: 82%) was prepared in the same manner as in the synthesis of Comparative Compound F, except that Compound J-a was used instead of Compound 1-k.

m/z[M+H]$^+$=1258

Experimental Example 1: Solubility Experiment

In order to confirm the solubility in the solvent used in the solution process of the compounds prepared in the Preparation Examples and the comparative compounds, each of them was dissolved in the solvent cyclohexanone (CHON) under normal temperature/pressure conditions, and it was confirmed whether 0.1 wt % or more was dissolved. The results are shown in Table 1 below.

TABLE 1

|  | Solvent CHON |
|---|---|
| Compound 1 | ○ |
| Compound 2 | ○ |
| Compound 3 | ○ |
| Compound 4 | ○ |
| Compound 5 | ○ |
| Compound 6 | ○ |
| Compound 7 | ○ |
| Compound 8 | ○ |
| Compound 9 | ○ |
| Compound 10 | ○ |
| Compound 11 | ○ |
| Compound 12 | ○ |
| Compound 13 | ○ |
| Compound 14 | ○ |
| Compound 15 | ○ |
| Compound 16 | ○ |
| Compound 17 | ○ |
| Compound 18 | ○ |
| Compound 19 | ○ |
| Compound 20 | ○ |

TABLE 1-continued

|  | Solvent CHON |
|---|---|
| Compound 21 | ○ |
| Compound J | X |

Evaluation list (○): 0.1 wt. % or more soluble
Evaluation list (X): 0.1 wt. % or more insoluble As shown in Table 1, it was confirmed that unlike the Comparative Compound J, the compounds included in Chemical Formula 1 exhibits excellent solubility in cyclohexanone, which is a solvent used in a solution process of an organic light emitting device.

Example 1: Manufacture of Organic Light Emitting Device

Example 1

A glass substrate thinly coated with indium tin oxide (ITO) to have a thickness of 500 Å was put into distilled water in which a detergent was dissolved, and ultrasonically washed. In this case, a product manufactured by Fischer Co., was used as the detergent, and distilled water twice filtered using a filter manufactured by Millipore Co., was used as the distilled water. After the ITO was washed for 30 minutes, ultrasonic washing was conducted twice repeatedly using distilled water for 10 minutes. After the washing using distilled water was completed, ultrasonic washing was conducted using isopropyl alcohol, and acetone solvents, and drying was conducted, and then the substrate was cleaned for 5 minutes, and then transferred to a glove box.

A coating composition, in which the following Compound B and the following Compound C (weight ratio of 2:8) were dissolved in 20 wt/v % cyclohexanone, was spin-coated (4000 rpm) on the ITO transparent electrode and heat-treated (cured) at 200° C. for 30 minutes to form a hole injection layer with a thickness of 400 Å. A coating composition, in which the following Compound A (Mn: 27,900; Mw: 35,600; measured by gel permeation chromatography (GPC) on Agilent 1200 series, relative to PC standards) was dissolved in 6 wt/v % toluene, spin-coated (4000 rpm) on the hole injection layer and heat-treated at 200° C. for 30 minutes to form a hole transport layer with a thickness of 200 Å.

A coating composition, in which Compound 1 prepared in Preparation Example 1 and the following Compound D (weight ratio of 2:98) were dissolved in 2 wt/v % cyclo-hexanone, spin-coated (4000 rpm) on the hole transport layer and heat-treated at 180° C. for 30 minutes to form a light emitting layer with a thickness of 400 Å. After being transferred to a vacuum depositor, the following E was vacuum-deposited to a thickness of 350 Å on the light emitting layer to form an electron injection and transport layer.

LiF and aluminum were sequentially deposited to have a thickness of 10 Å and 1000 Å, respectively, on the electron injection and transport layer, thereby forming a cathode.

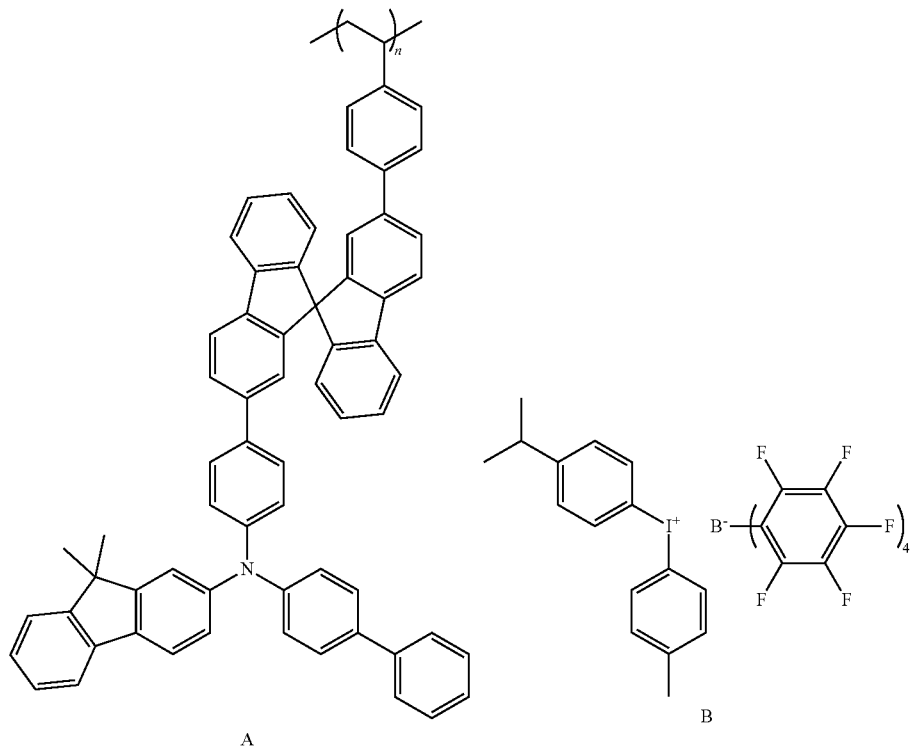

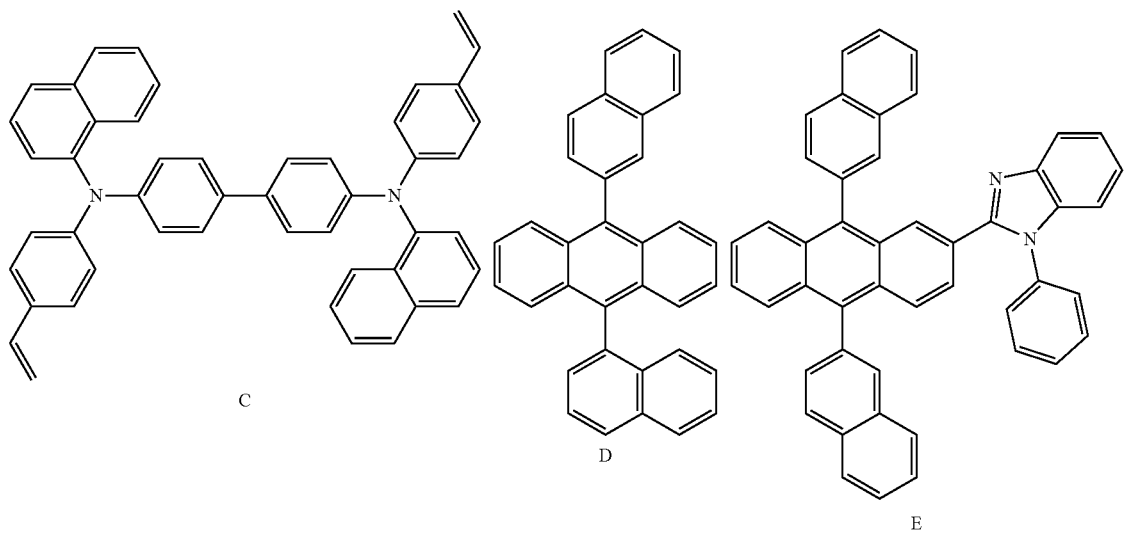

In the above-mentioned process, the vapor deposition rate of the organic material was maintained at 0.4 to 0.7 Å/sec, the deposition rate of LiF was maintained at 0.3 Å/sec, the deposition rate of aluminum was maintained at 2 Å/sec, and the degree of vacuum during the deposition was maintained at $2 \times 10^{-7}$ to $5 \times 10^{-8}$ torr.

Examples 2 to 21

An organic light emitting device was manufactured in the same manner as in Example 1, except that the compounds shown in Table 2 below were used instead of Compound 1 as a dopant in the light emitting layer.

Comparative Examples 1 to 4

An organic light emitting device was manufactured in the same manner as in Example 1, except that the compounds shown in Table 2 below were used instead of Compound 1 as a dopant in the light emitting layer.

The structures of the compounds used in the Examples and Comparative Examples are as follows:

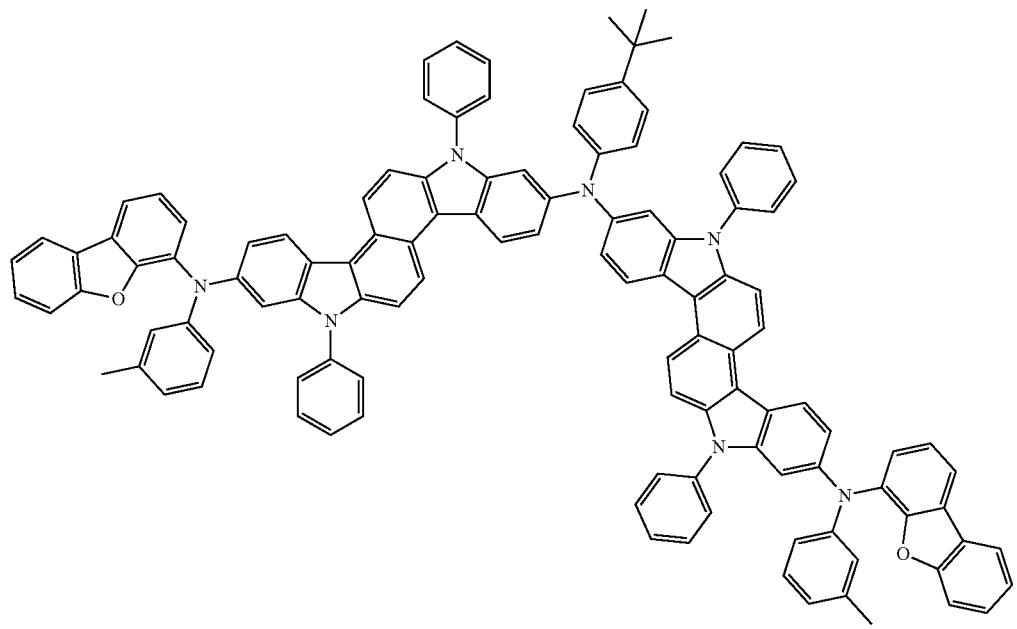

1

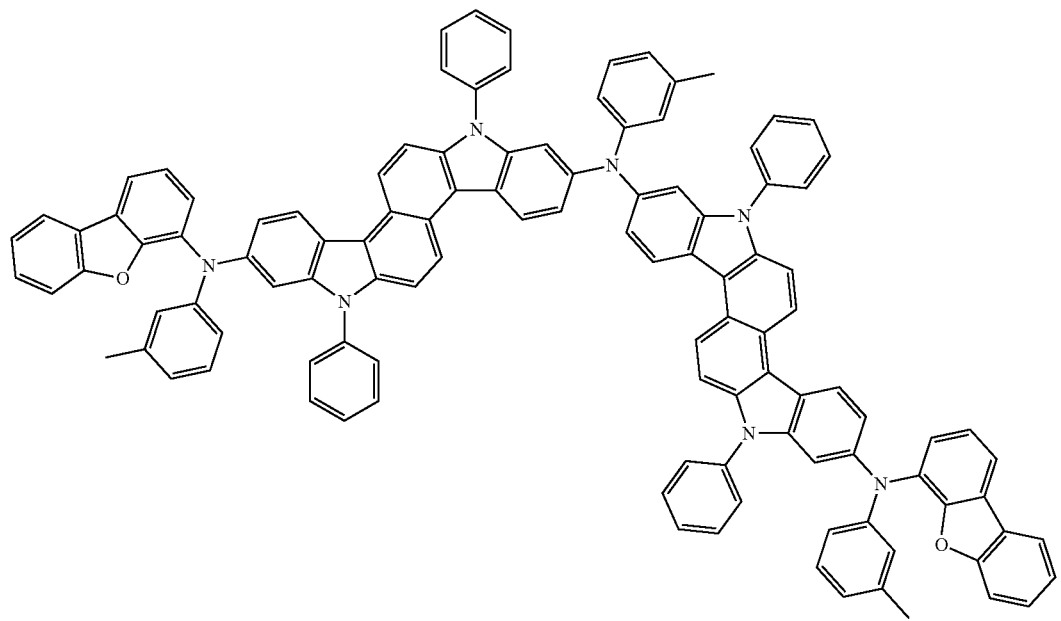

2

-continued
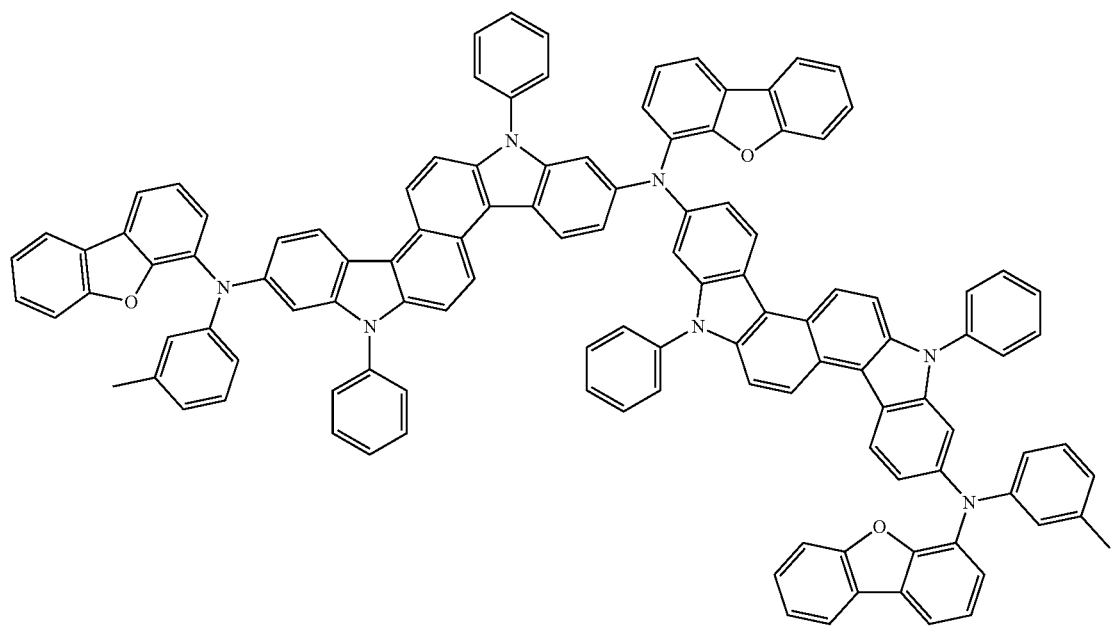
3
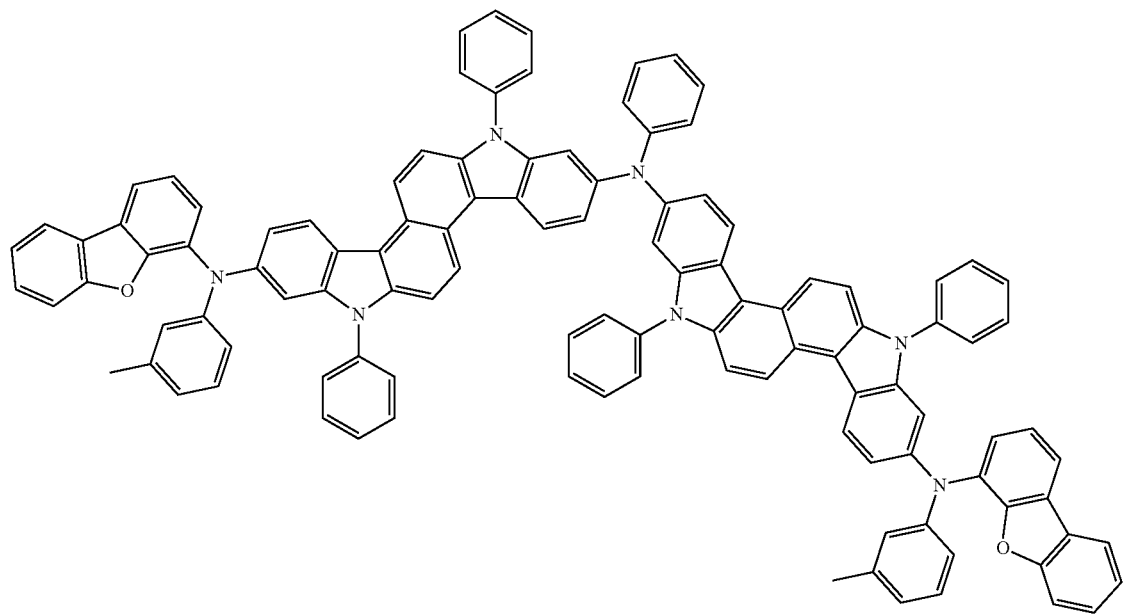
4

-continued
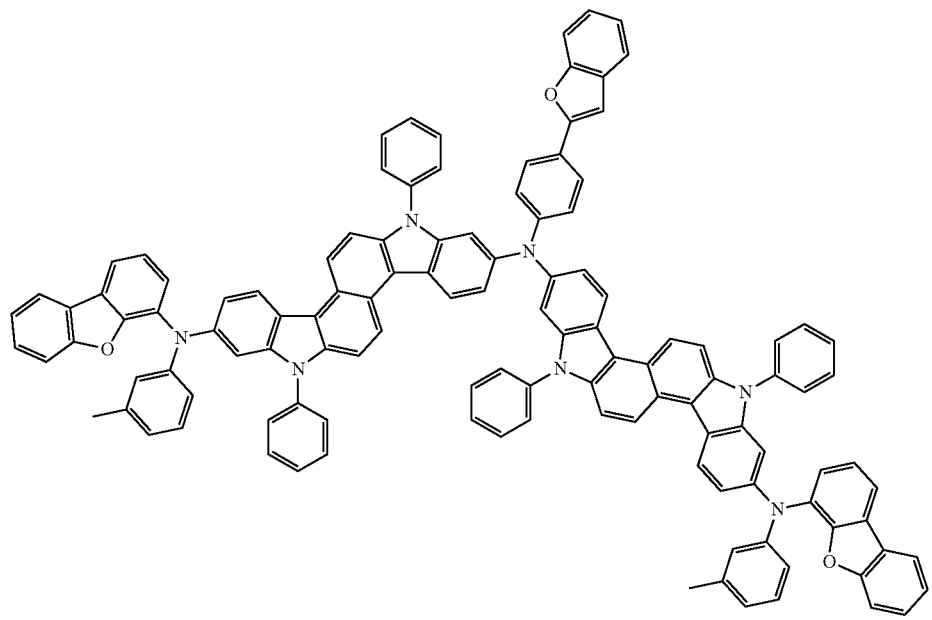
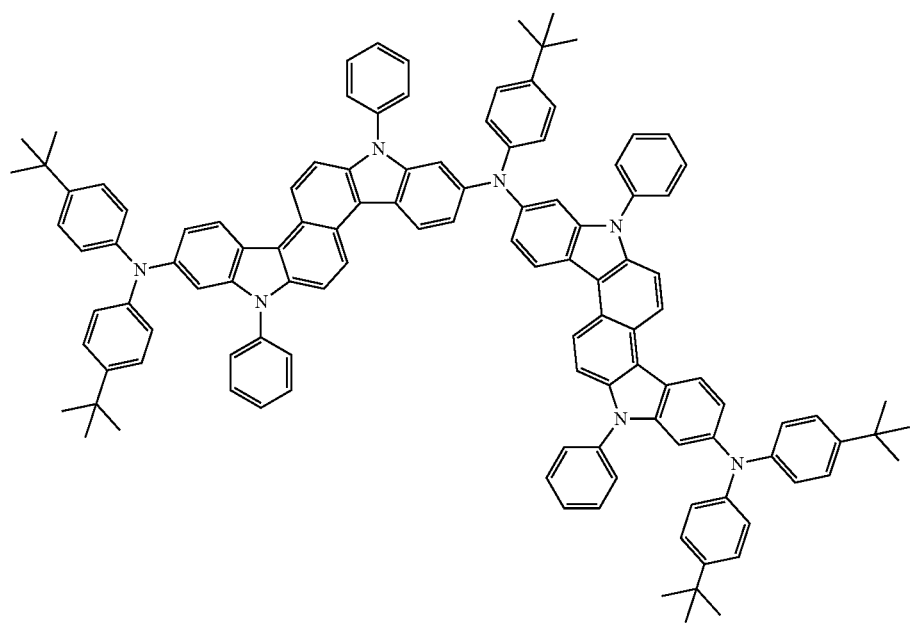

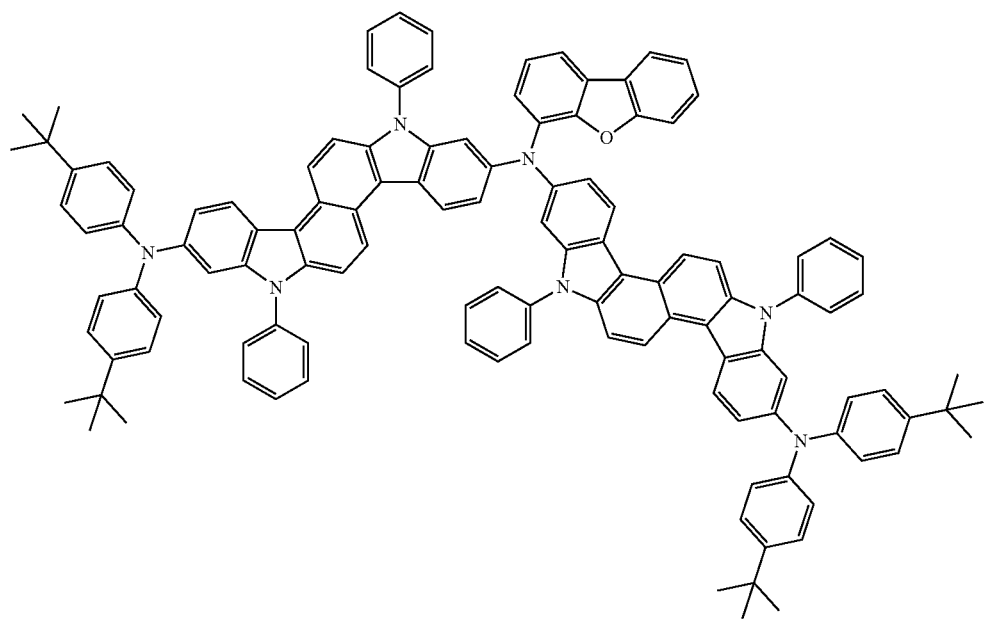
7
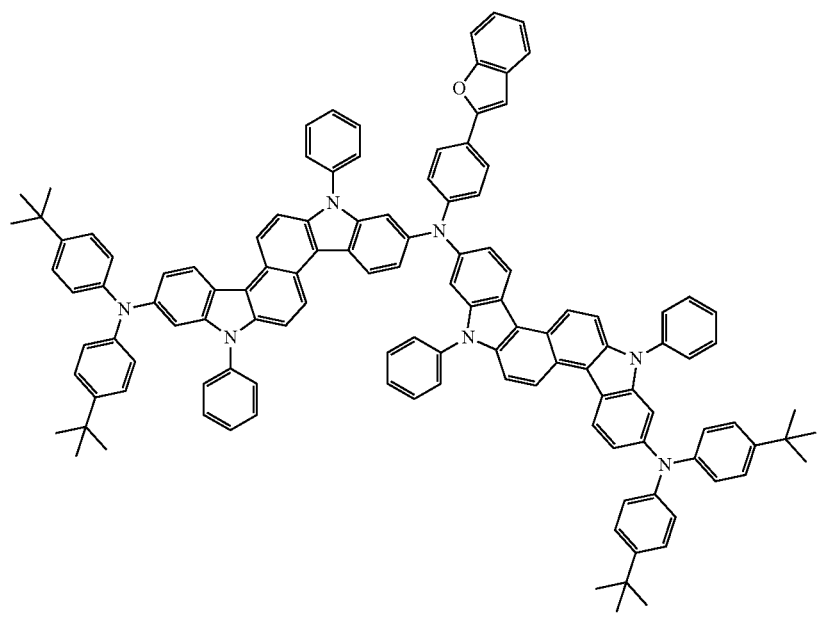
8

9
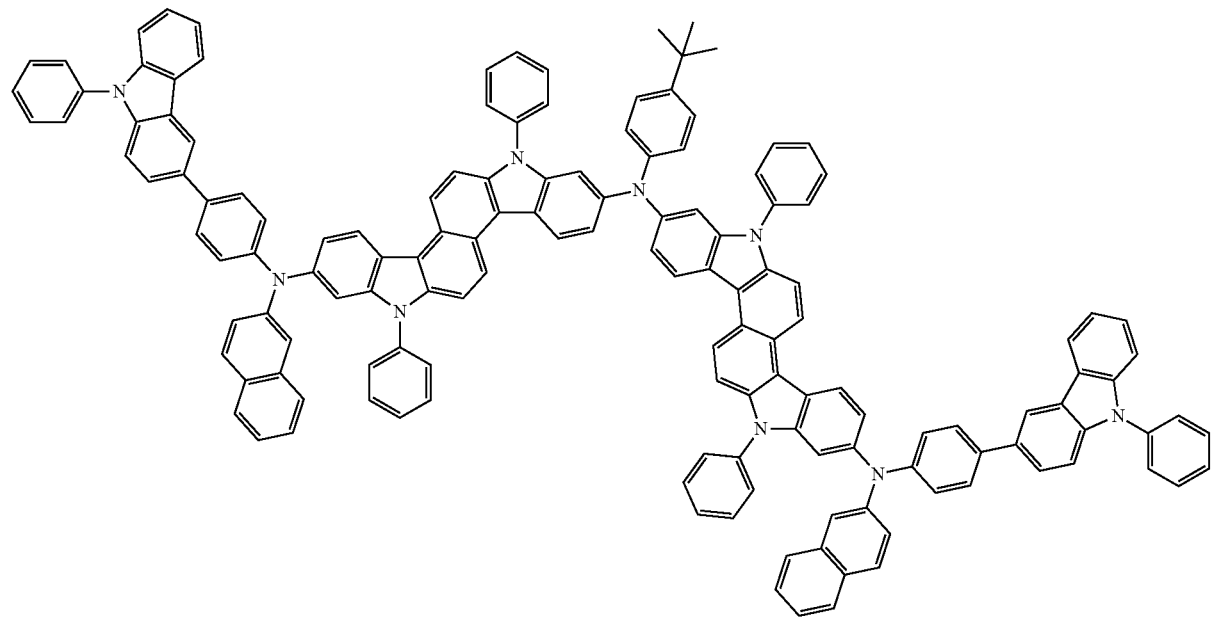
10
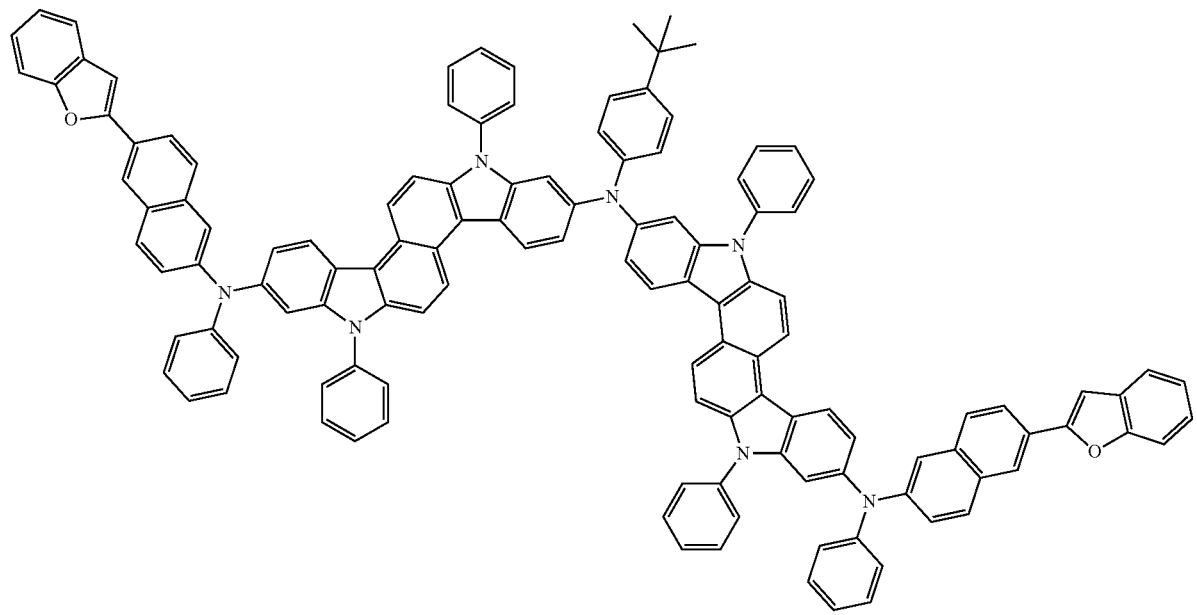

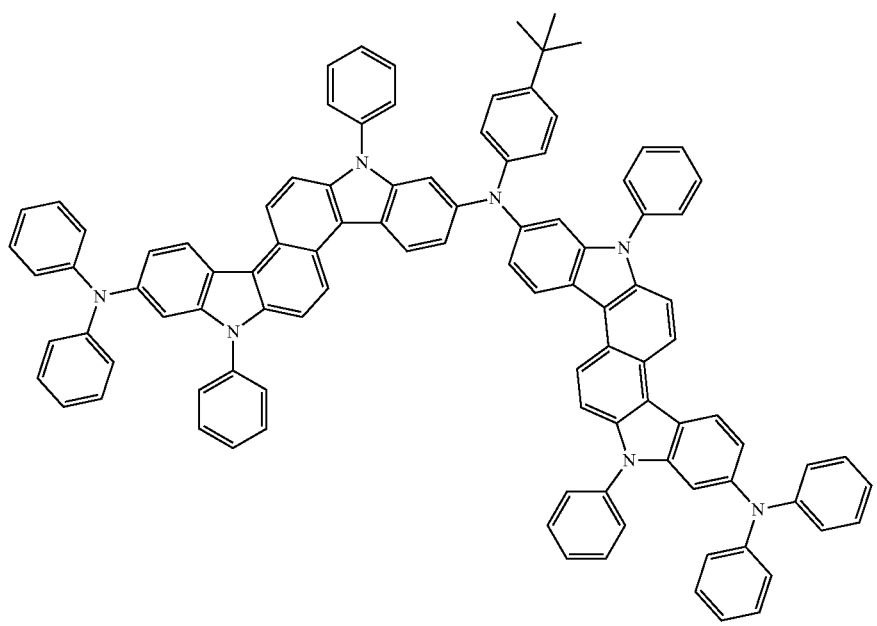
11
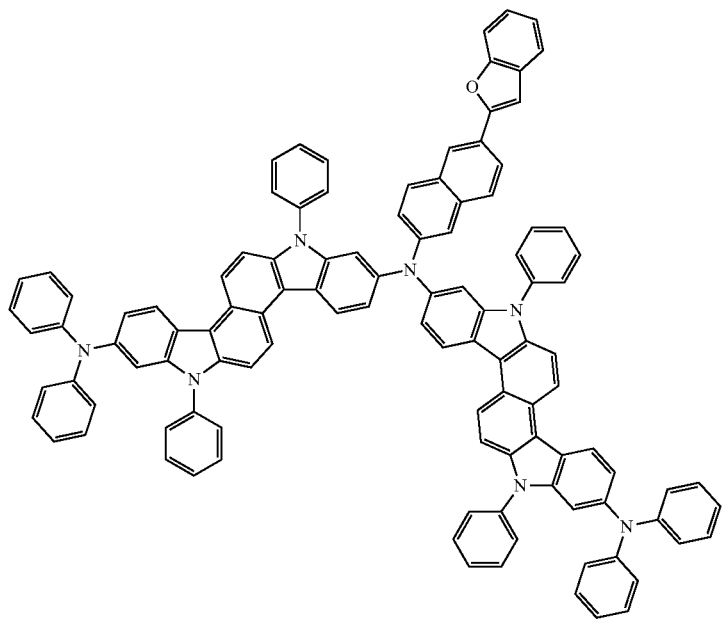
12

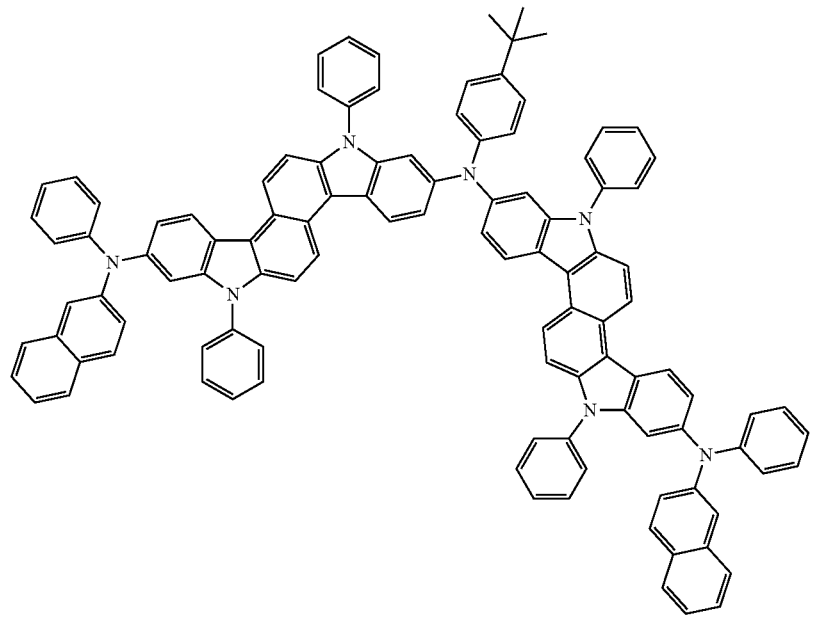
13
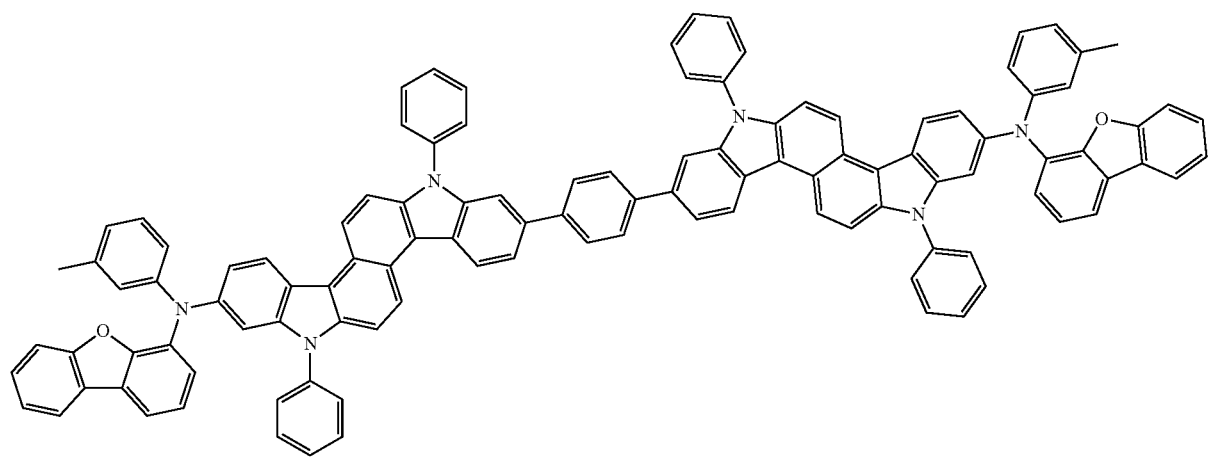
14

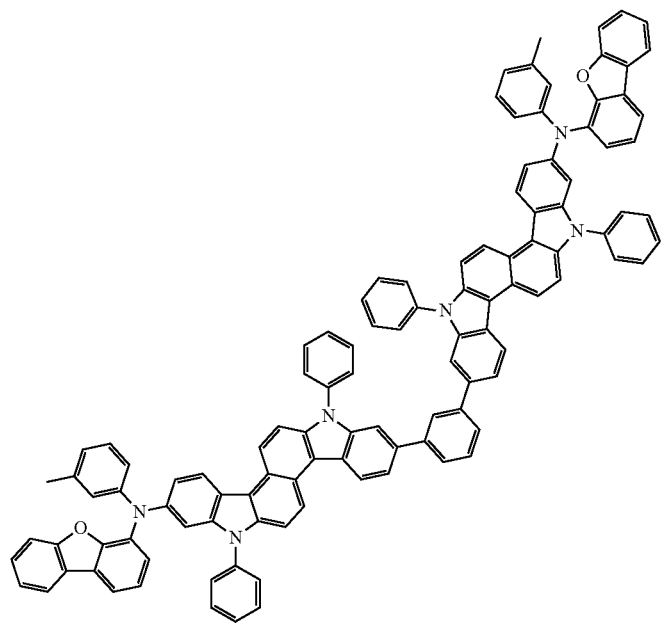
15
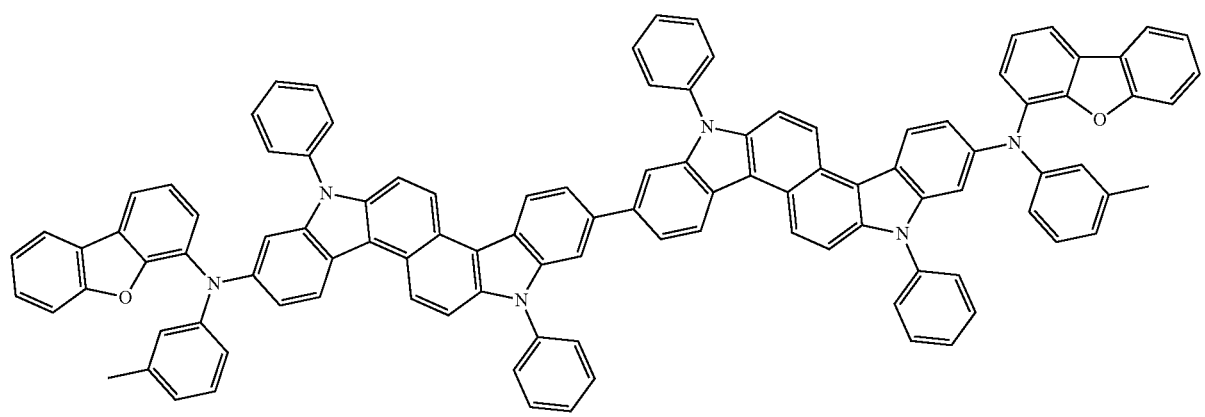
16

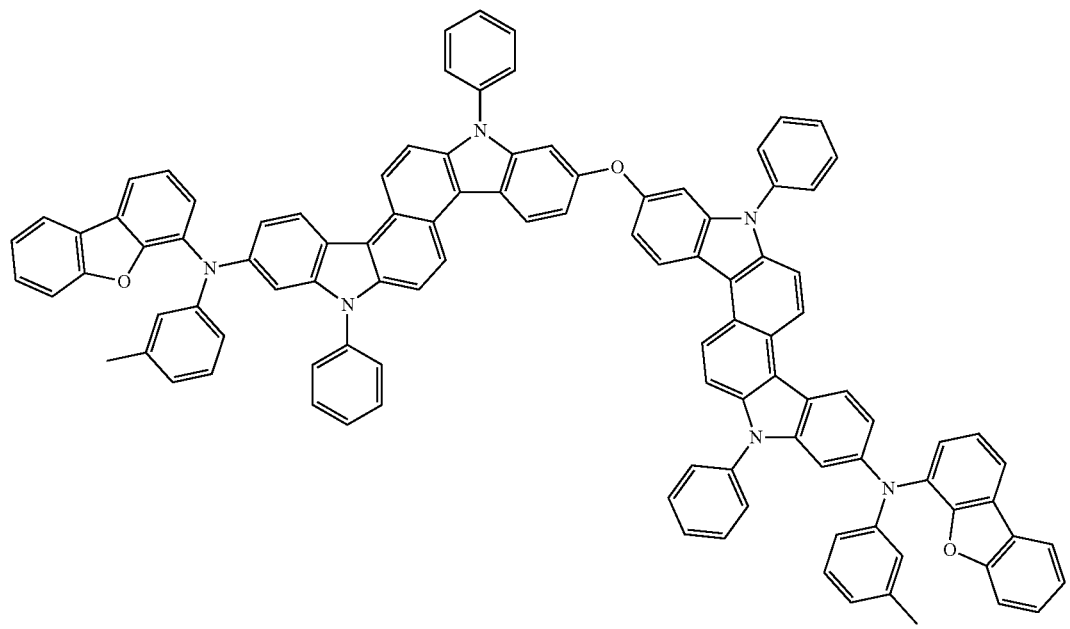
17
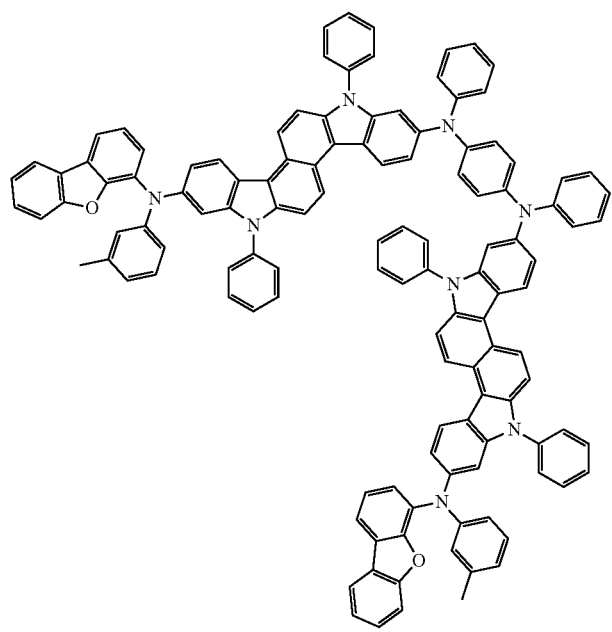
18

-continued
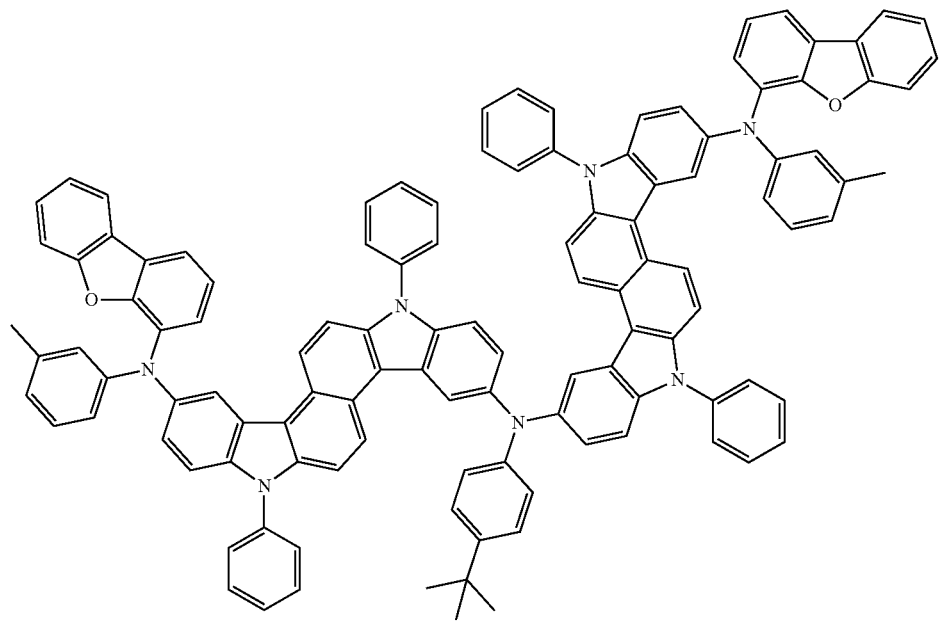
19
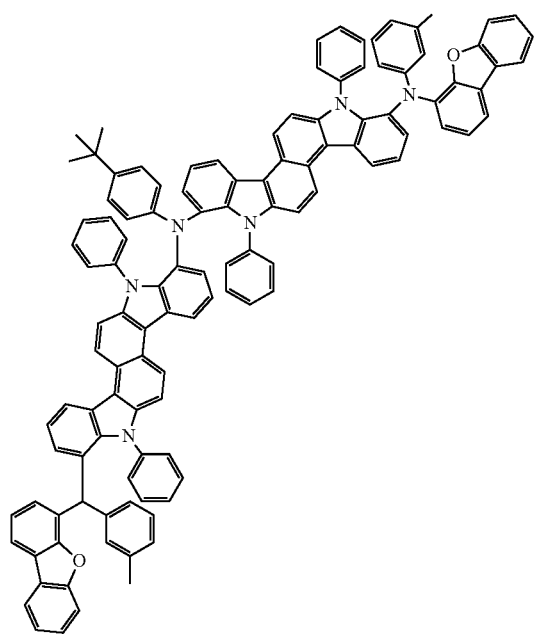
20

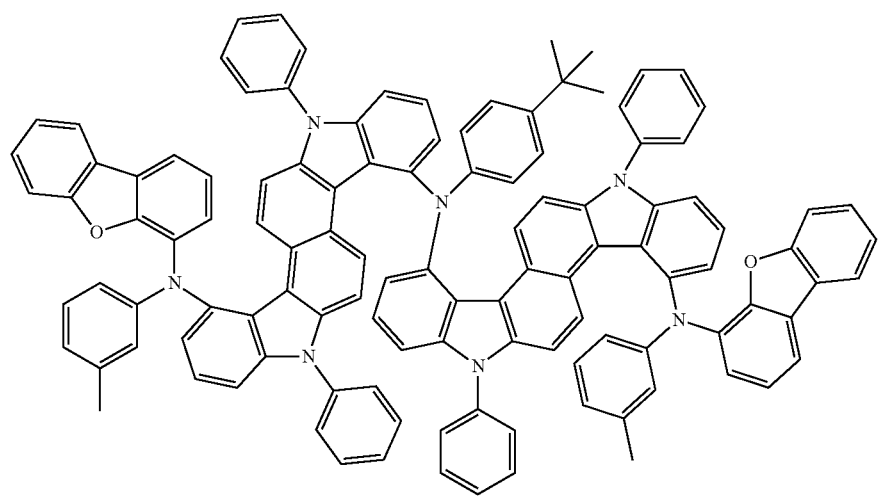
21
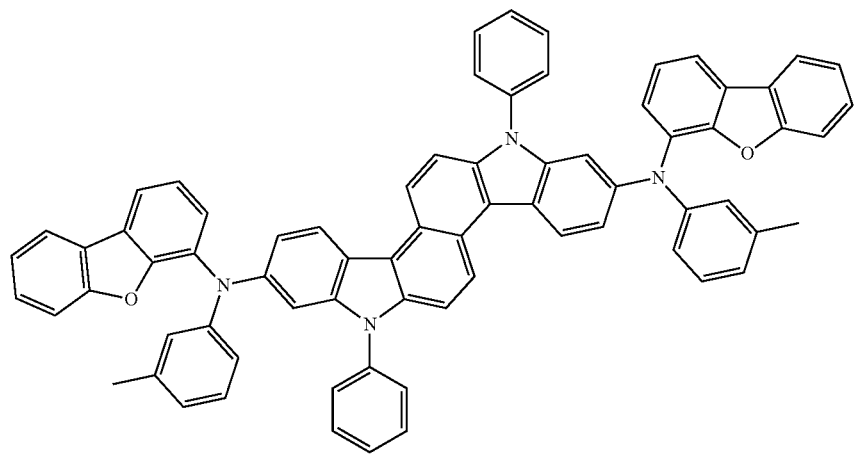
F
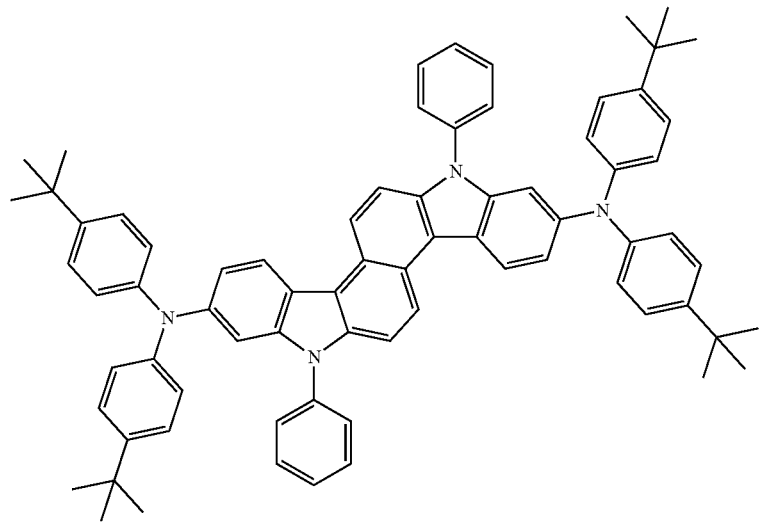
G

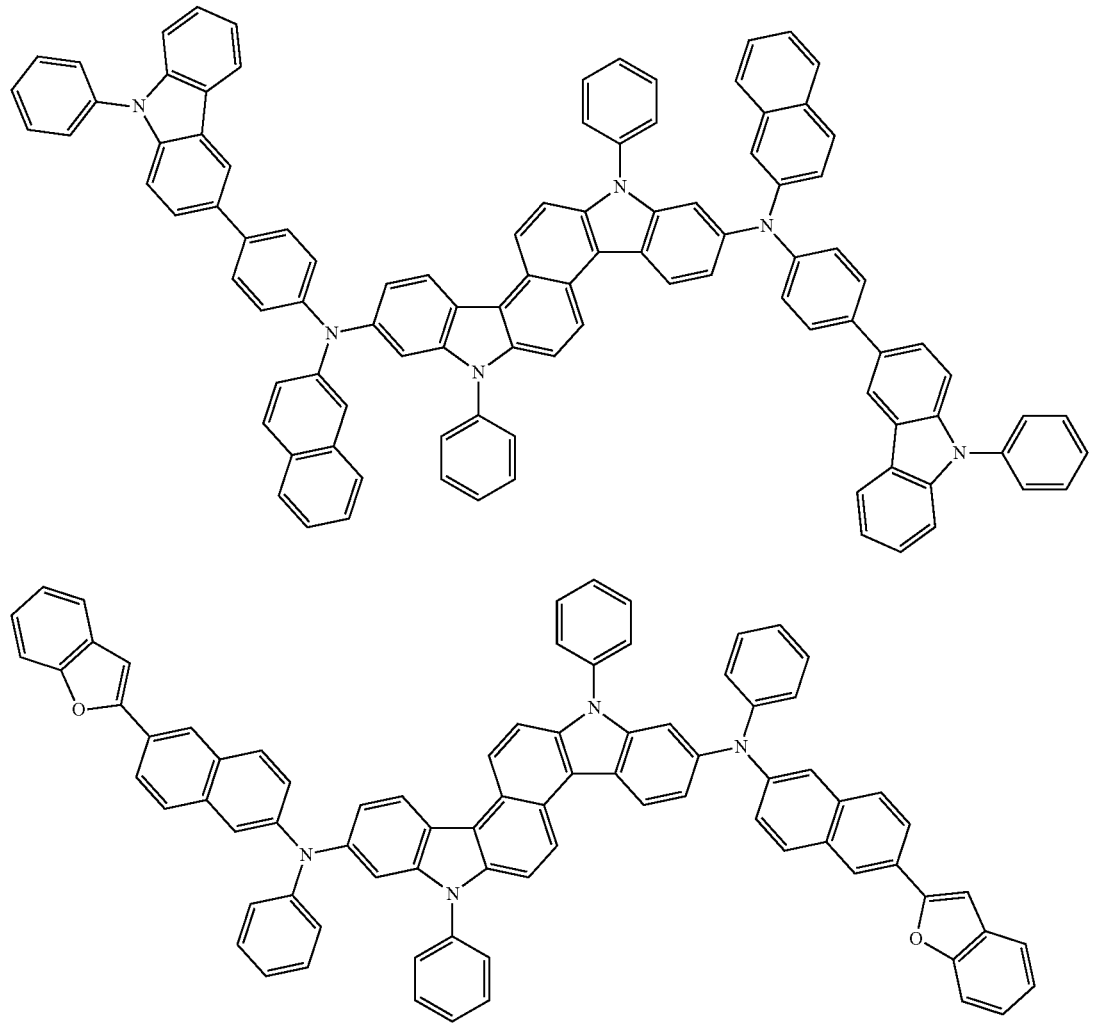

Experimental Example 2

The driving voltage, external quantum efficiency (EQE), and lifetime were measured by applying a current of 10 mA/cm$^2$ to the organic light emitting devices manufactured in the Examples and Comparative Examples, and the results are shown in Table 2 below. At this time, the external quantum efficiency (EQE) was calculated as "(the number of emitted photon)/(the number of injected charge carrier) *100", and T90 means the time required for the luminance to be reduced to 90% of the initial luminance (500 nit).

TABLE 2

| | Dopant of light emitting layer | Driving voltage (V @ 10 mA/cm$^2$) | EQE (% @ 10 mA/cm$^2$) | Lifetime (hr) (T90 @ 500 nit) |
|---|---|---|---|---|
| Example 1 | Compound 1 | 4.63 | 8.89 | 250 |
| Example 2 | Compound 2 | 4.61 | 8.61 | 239 |
| Example 3 | Compound 3 | 4.65 | 8.78 | 268 |
| Example 4 | Compound 4 | 4.67 | 8.67 | 257 |
| Example 5 | Compound 5 | 4.62 | 8.74 | 265 |
| Example 6 | Compound 6 | 4.58 | 8.78 | 264 |
| Example 7 | Compound 7 | 4.61 | 8.77 | 259 |
| Example 8 | Compound 8 | 4.67 | 8.69 | 235 |
| Example 9 | Compound 9 | 4.59 | 8.73 | 265 |
| Example 10 | Compound 10 | 4.61 | 8.76 | 271 |
| Example 11 | Compound 11 | 4.66 | 8.79 | 267 |
| Example 12 | Compound 12 | 4.67 | 8.54 | 275 |
| Example 13 | Compound 13 | 4.70 | 8.68 | 251 |
| Example 14 | Compound 14 | 4.62 | 8.72 | 239 |
| Example 15 | Compound 15 | 4.68 | 8.69 | 254 |
| Example 16 | Compound 16 | 4.59 | 8.76 | 267 |
| Example 17 | Compound 17 | 4.64 | 8.77 | 253 |
| Example 18 | Compound 18 | 4.63 | 8.79 | 256 |
| Example 19 | Compound 19 | 4.67 | 8.56 | 265 |
| Example 20 | Compound 20 | 4.63 | 8.57 | 261 |
| Example 21 | Compound 21 | 4.62 | 8.67 | 258 |
| Comparative Example 1 | Compound F | 4.70 | 6.87 | 58 |
| Comparative Example 2 | Compound G | 4.68 | 7.11 | 67 |
| Comparative Example 3 | Compound H | 4.66 | 7.11 | 67 |

TABLE 2-continued

| | Dopant of light emitting layer | Driving voltage (V @ 10 mA/cm$^2$) | EQE (% @ 10 mA/cm$^2$) | Lifetime (hr) (T90 @ 500 nit) |
|---|---|---|---|---|
| Comparative Example 4 | Compound I | 4.69 | 6.95 | 69 |

As shown in Table 2 above, it was confirmed that the organic light emitting devices manufactured by using the compounds of the present disclosure as the dopant of the light emitting layer exhibits excellent characteristics in terms of conversion efficiency and lifetime, as compared with the organic light emitting devices manufactured by using Compound F, Compound G, Compound H, or Compound I of Comparative Examples as the dopant of the light emitting layer.

<Description of symbols>

1: substrate
2: anode
3: light emitting layer
4: cathode
5: hole injection layer
6: hole transport layer
7: electron injection and transport layer

The invention claimed is:

1. A compound represented by the following Chemical Formula 1:

[Chemical Formula 1]

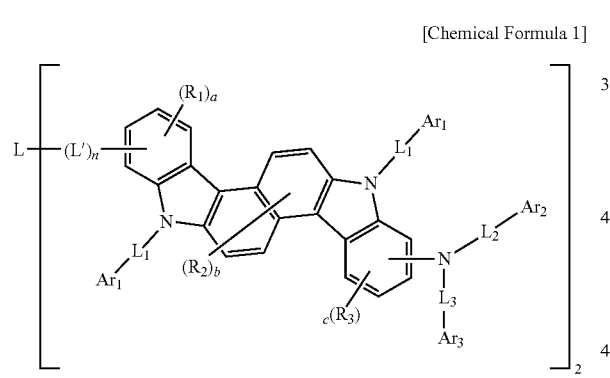

wherein in Chemical Formula 1,

L is a single bond; O; S; N($Z_1$); C($Z_2$)($Z_3$); a substituted or unsubstituted $C_{6-60}$ arylene; or a substituted or unsubstituted $C_{2-60}$ heteroarylene containing at least one heteroatom selected from N, O or S;

L' is a single bond; or N($Z_4$);

n is 0 or 1, wherein $Z_1$ to $Z_4$ are each independently hydrogen; deuterium; a substituted or unsubstituted $C_{1-60}$ alkyl; a substituted or unsubstituted $C_{6-60}$ aryl; or a substituted or unsubstituted $C_{2-60}$ heteroaryl containing at least one heteroatom selected from N, O or S, $L_1$ to $L_3$ are each independently a single bond; a substituted or unsubstituted $C_{6-60}$ arylene; or a substituted or unsubstituted $C_{2-60}$ heteroarylene containing at least one heteroatom selected from N, O or S, $Ar_1$ to $Ar_3$ are each independently a substituted or unsubstituted $C_{6-60}$ aryl; or a substituted or unsubstituted $C_{2-60}$ heteroaryl containing at least one heteroatom selected from N, O or S, $R_1$ to $R_3$ are each independently deuterium; halogen; cyano; a substituted or unsubstituted $C_{1-60}$ alkyl; a substituted or unsubstituted $C_{6-60}$ aryl; or a substituted or unsubstituted $C_{2-60}$ heteroaryl containing at least one heteroatom selected from N, O or S, a and c are each independently an integer of 0 to 3, b is an integer of 0 to 4.

2. The compound of claim 1, wherein the compound is represented by any one of the following Chemical Formulas 1-1 to 1-4:

[Chemical Formula 1-1]

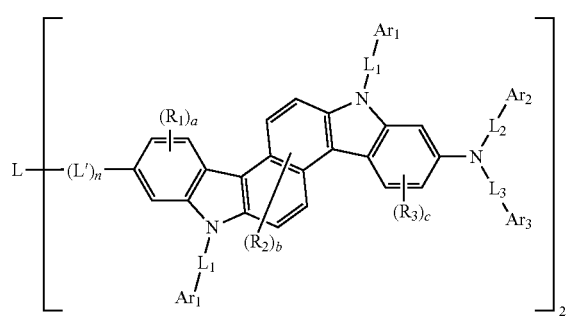

[Chemical Formula 1-2]

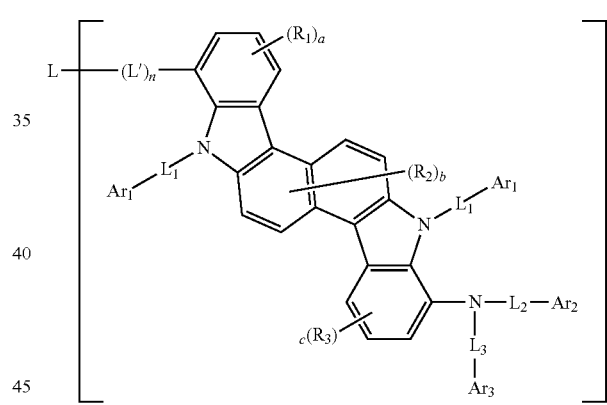

[Chemical Formula 1-3]

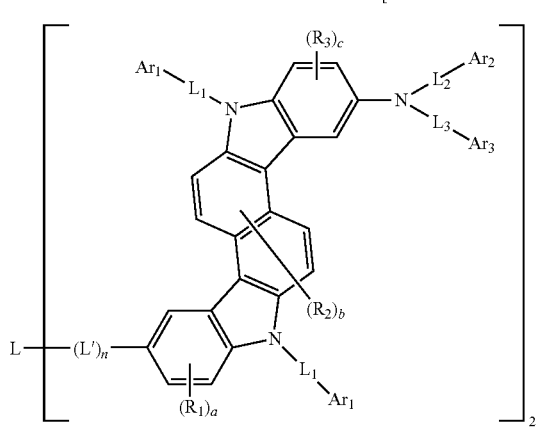

[Chemical Formula 1-4]

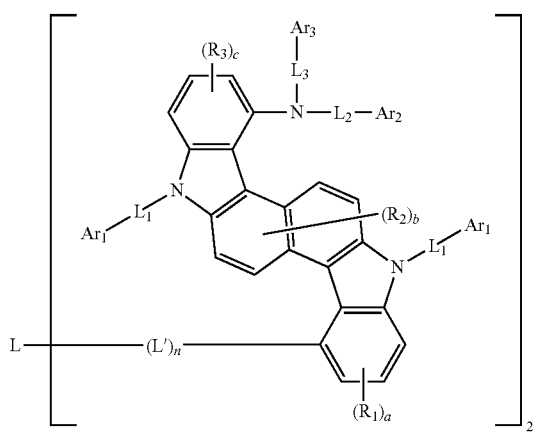

wherein in Chemical Formulas 1-1 to 1-4,
L, L', n, L₁ to L₃, Ar₁ to Ar₃, R₁ to R₃, a, b and c are as defined in claim 1.

3. The compound of claim 1,
wherein L is a single bond; O; or N(Z₁), n is 0; or L is a $C_{6-20}$ arylene, and n is 0, or 1.

4. The compound of claim 1,
wherein Z₁ to Z₄ are each independently phenyl which is unsubstituted or substituted with one or more substituents selected from the group consisting of a $C_{1-10}$ alkyl, benzofuranyl and benzothiophenyl; naphthyl which is unsubstituted or substituted with one or more substituents selected from the group consisting of a $C_{1-10}$ alkyl, benzofuranyl and benzothiophenyl; or dibenzofuranyl which is unsubstituted or substituted with one or more substituents selected from the group consisting of a $C_{1-10}$ alkyl, benzofuranyl and benzothiophenyl.

5. The compound of claim 1,
wherein L is a single bond, or any one selected from the group consisting of:

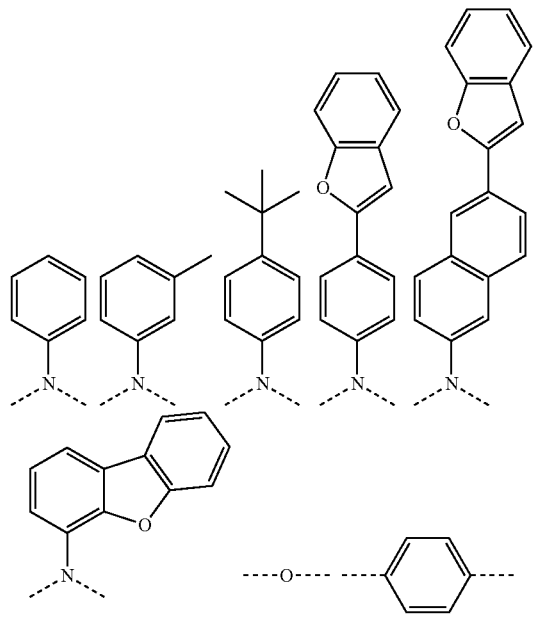

6. The compound of claim 1,
wherein the -(L')ₙ- is a single bond,

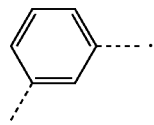

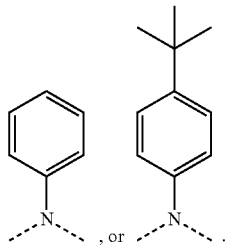

7. The compound of claim 1,
wherein L₁ to L₃ are each independently a single bond, phenylene, or naphthylene.

8. The compound of claim 1,
wherein Ar₁ to Ar₃ are each independently a $C_{6-20}$ aryl which is unsubstituted or substituted with one or more substituents selected from the group consisting of deuterium, methyl, tert-butyl, phenyl and a Si(phenyl)₃; or a $C_{2-20}$ heteroaryl containing one heteroatom of N, O or S which is unsubstituted or substituted with one or more substituents selected from the group consisting of deuterium, methyl, tert-butyl, phenyl and Si(phenyl)₃.

9. The compound of claim 8,
wherein Ar₁ and Ar₂ are each independently

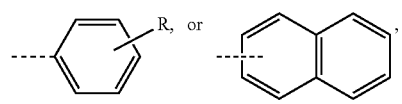

wherein R is methyl, or tert-butyl.

10. The compound of claim 8,
wherein Ar₃ is any one selected from the group consisting of:

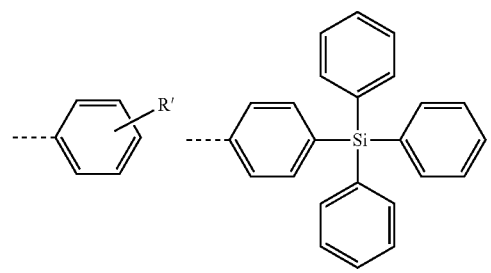

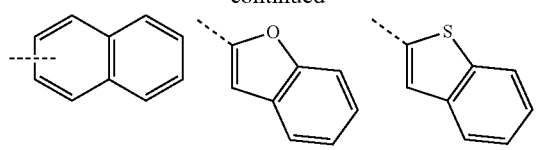
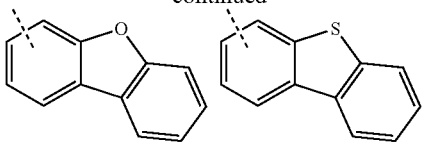
wherein R' is methyl, or tert-butyl.
11. The compound of claim 1,
wherein $R_1$ to $R_3$ are each deuterium.
12. The compound of claim 1,
wherein structure in each bracket ([ ]) is identical to each other.
13. The compound of claim 1,
wherein the compound is represented by any one of the following Chemical Formulas 1-1-1 to 1-4-1:
[Chemical Formula 1-1-1]
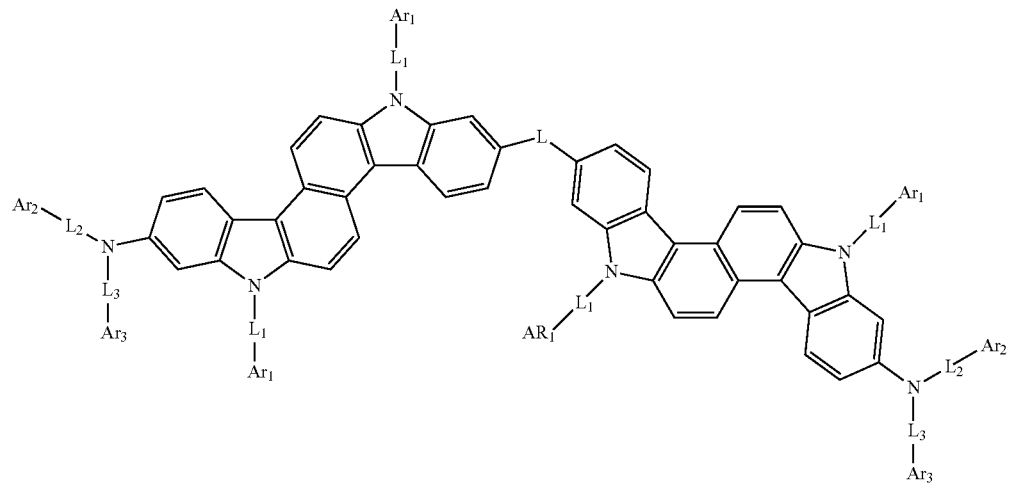
[Chemical Formula 1-2-1]
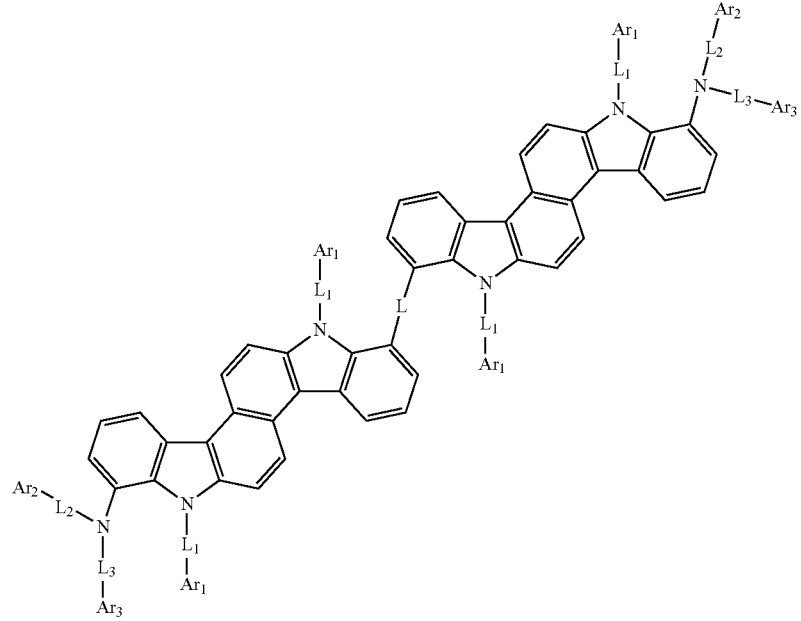

[Chemical Formula 1-3-1]
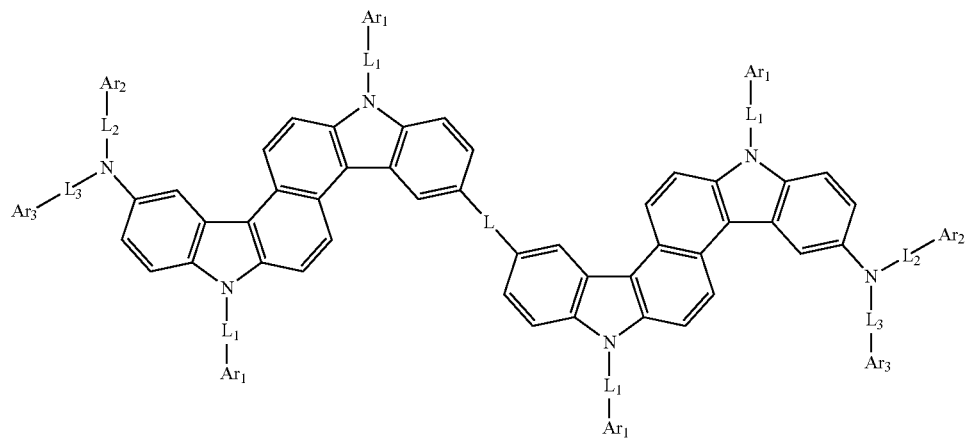
[Chemical Formula 1-4-1]
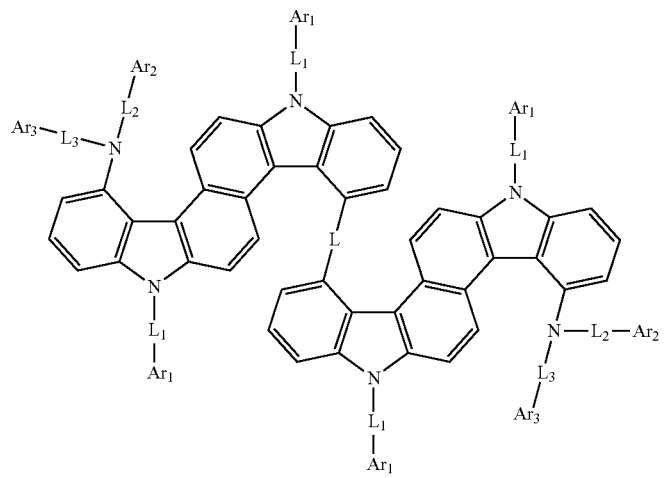
wherein in Chemical Formulas 1-1-1 to 1-4-1,
L is a single bond; O; N($Z_1$); or a $C_{6-20}$ arylene, and
$Z_1$, $L_1$ to $L_3$ and $Ar_1$ to $Ar_3$ are as defined in claim 1.
14. The compound of claim 1,
wherein the compound is any one selected from the group consisting of the following compounds:
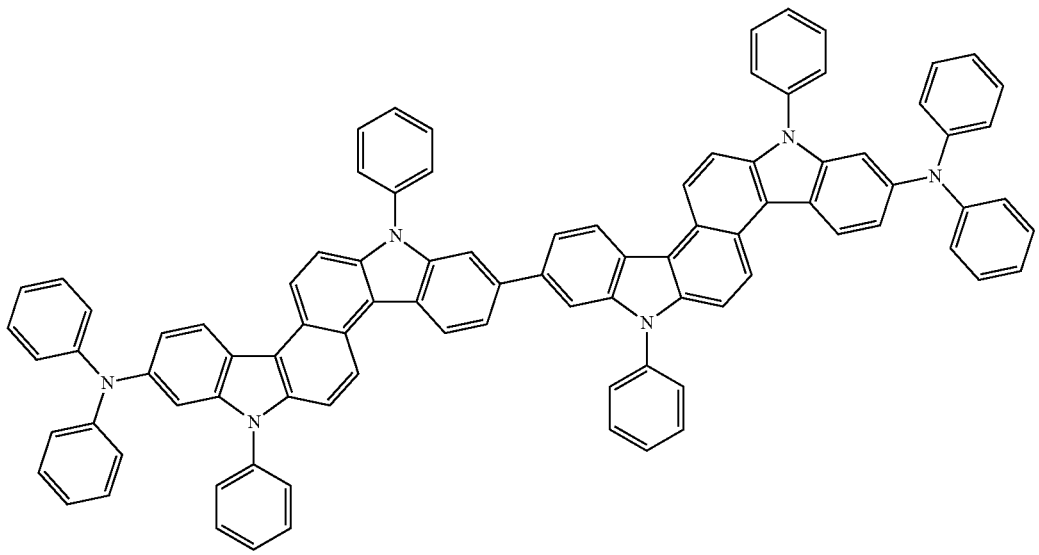

175
176
-continued
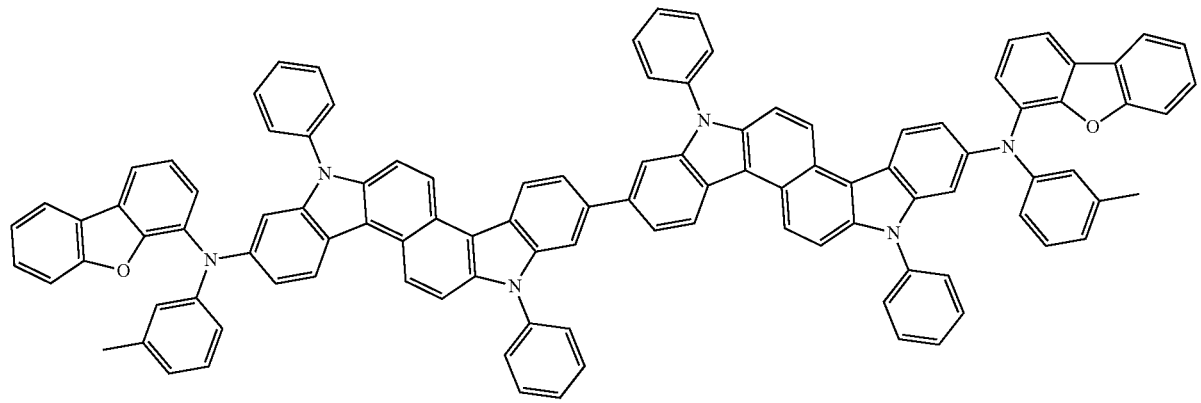
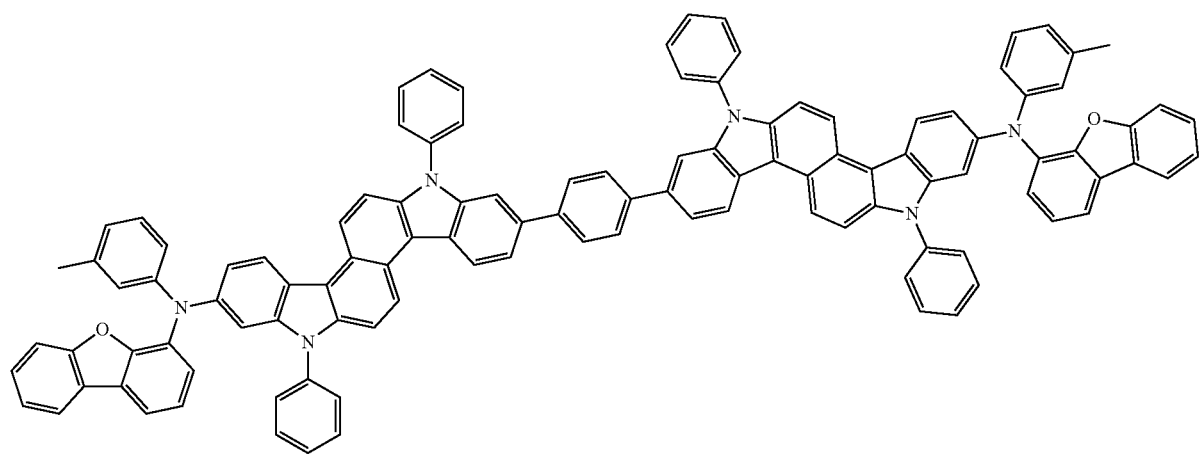

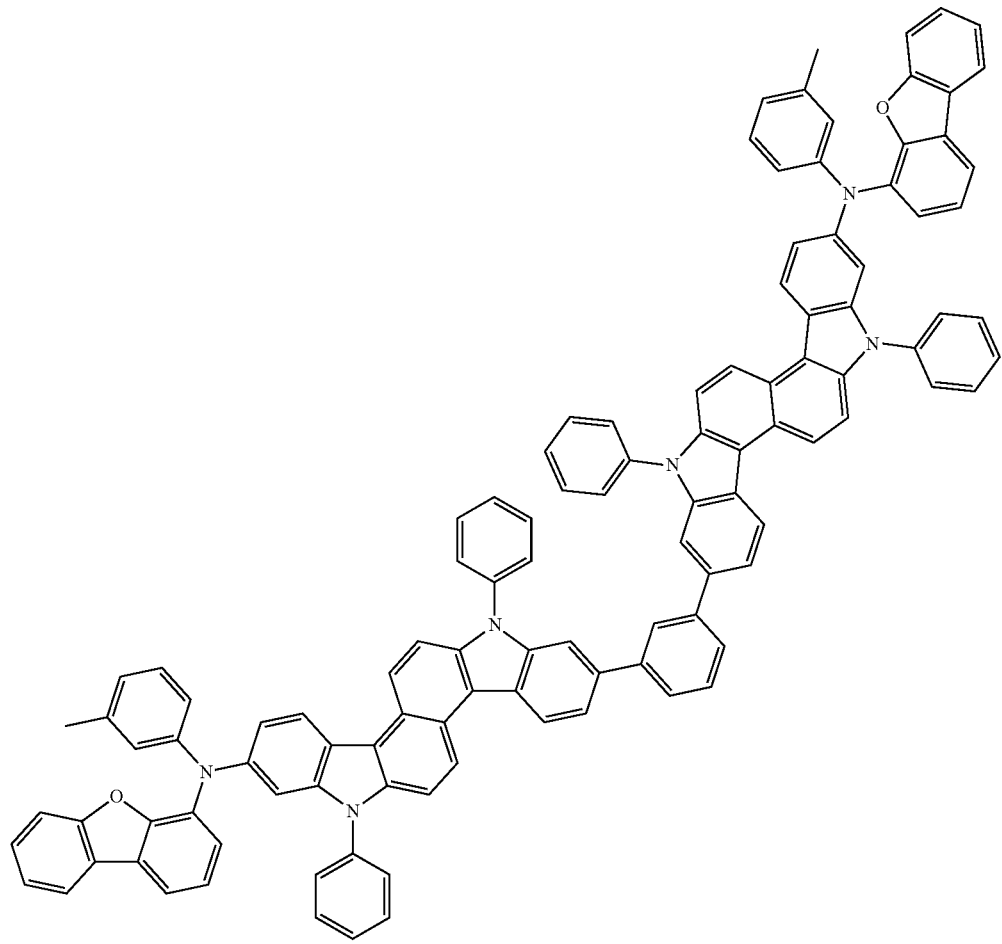
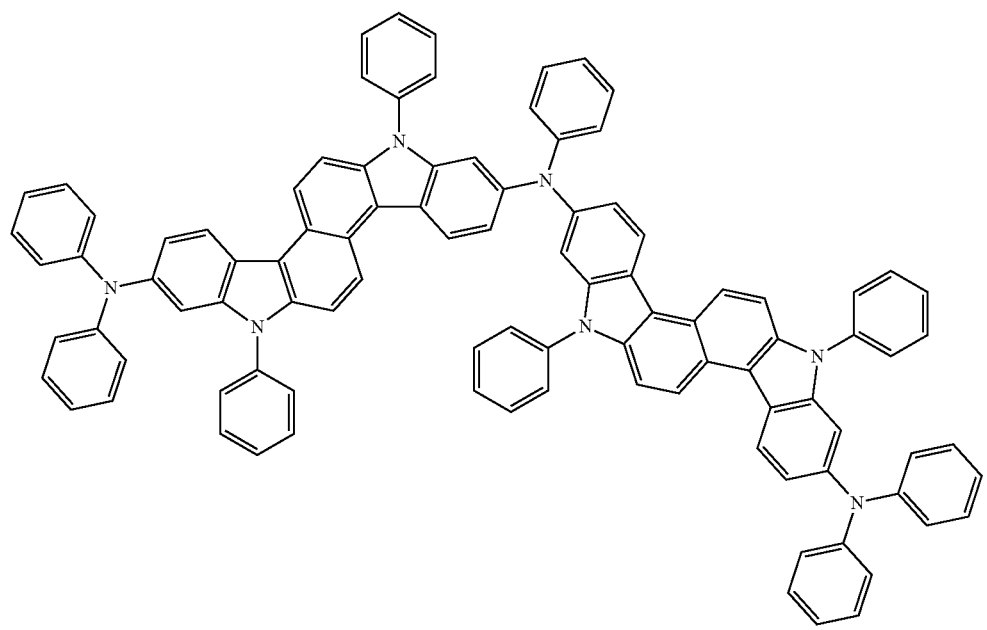

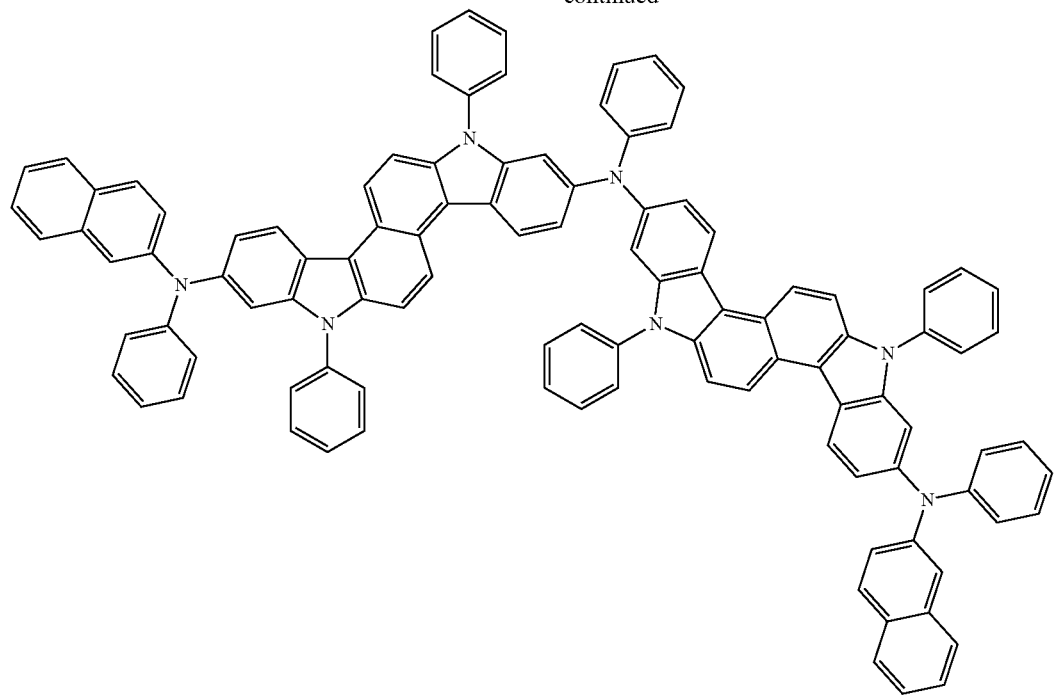
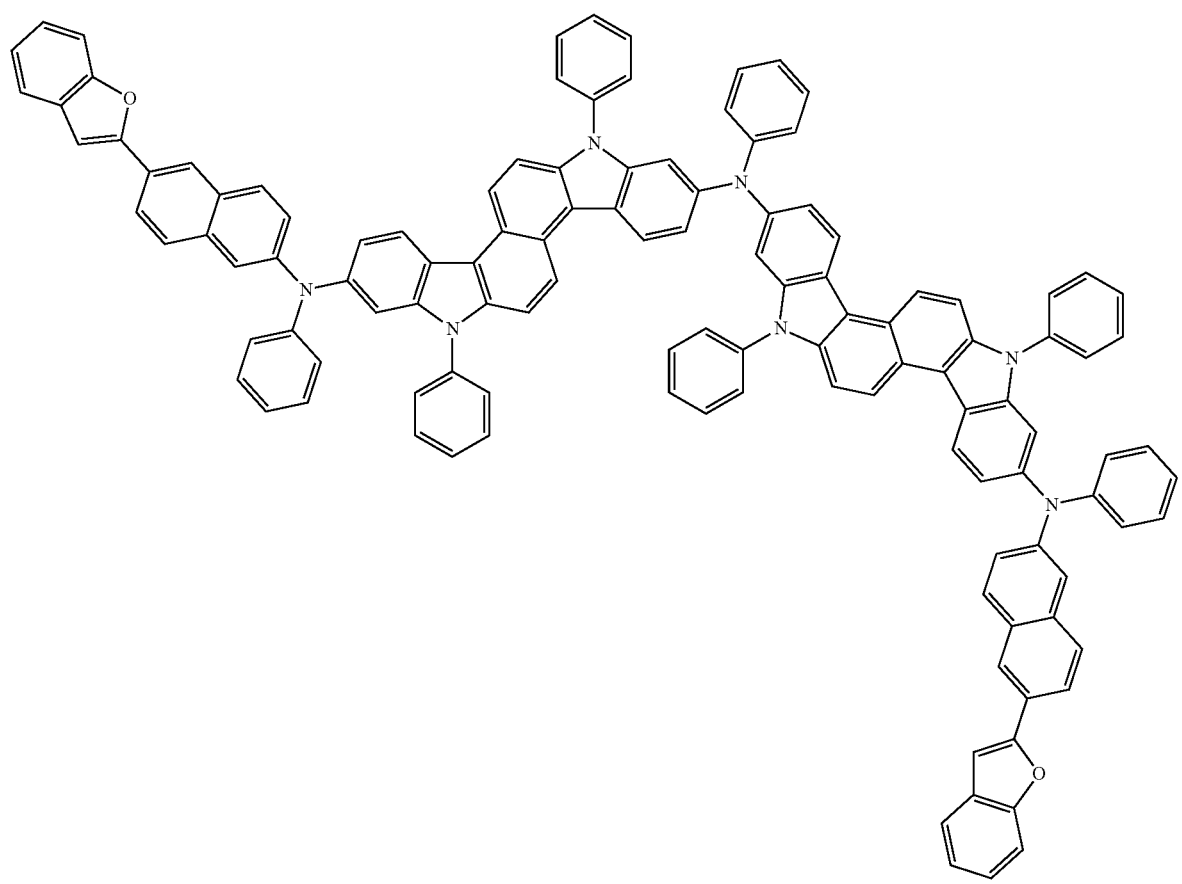

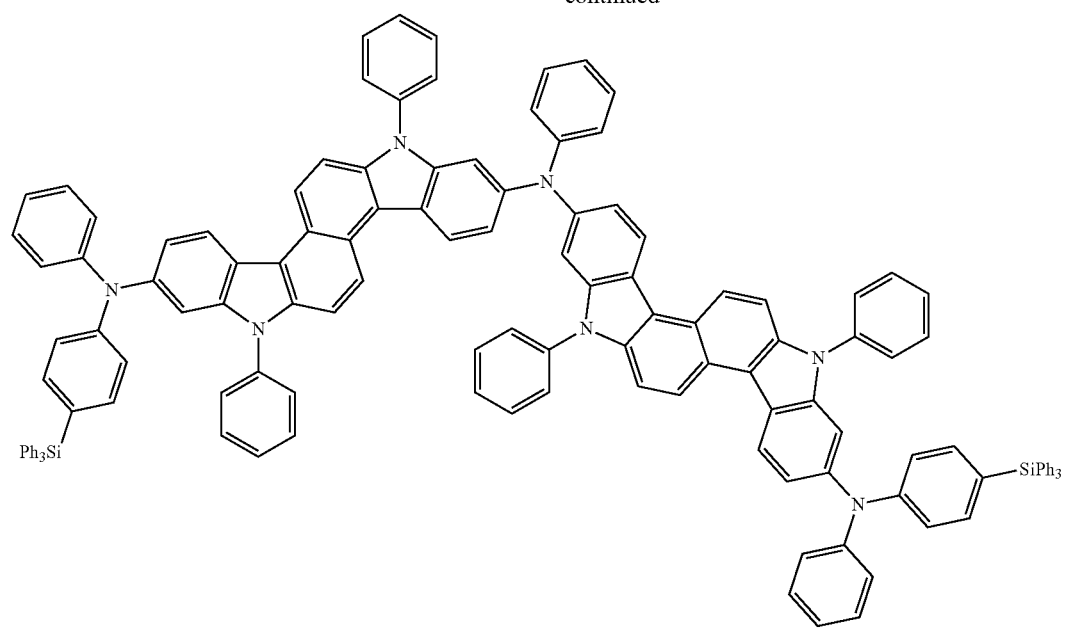
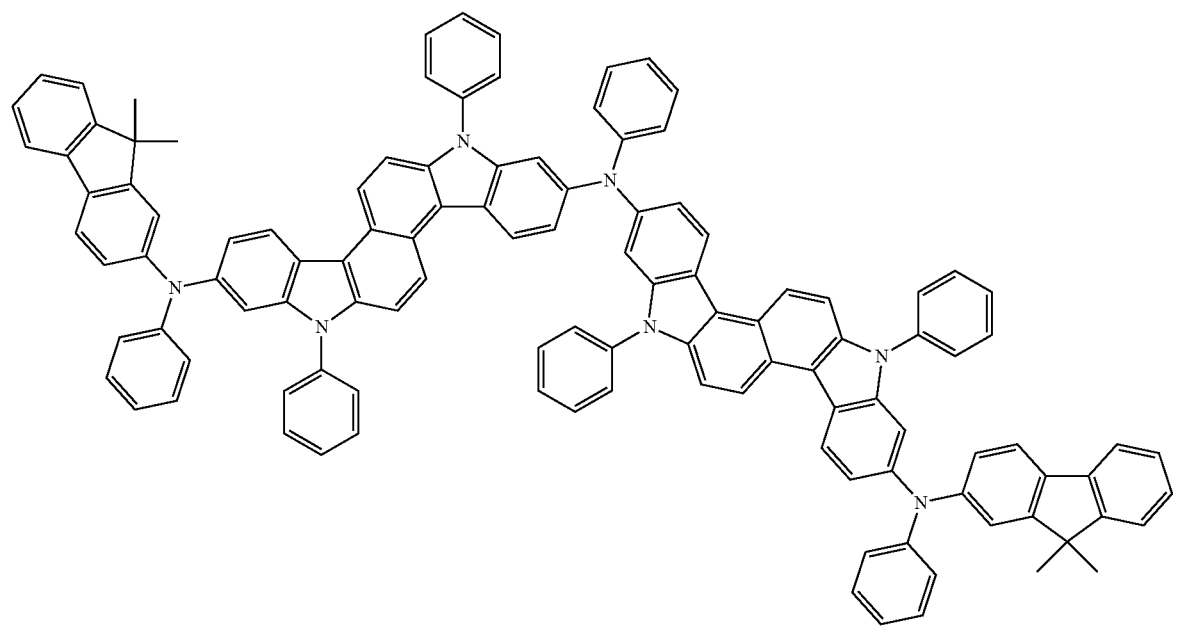

-continued
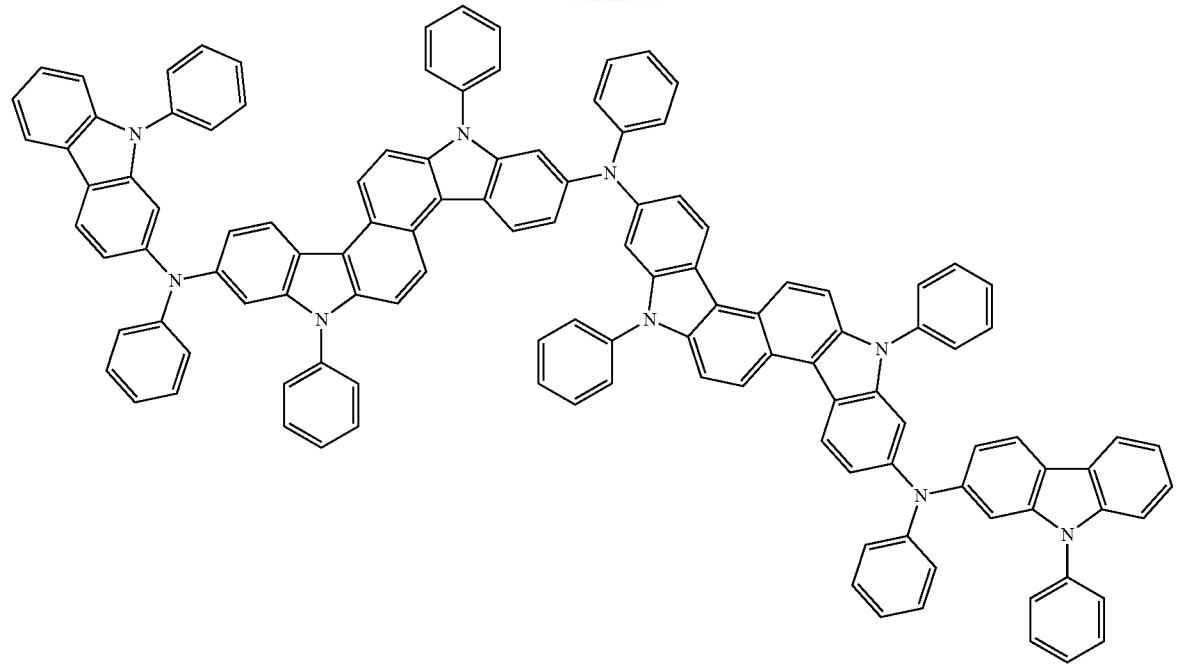
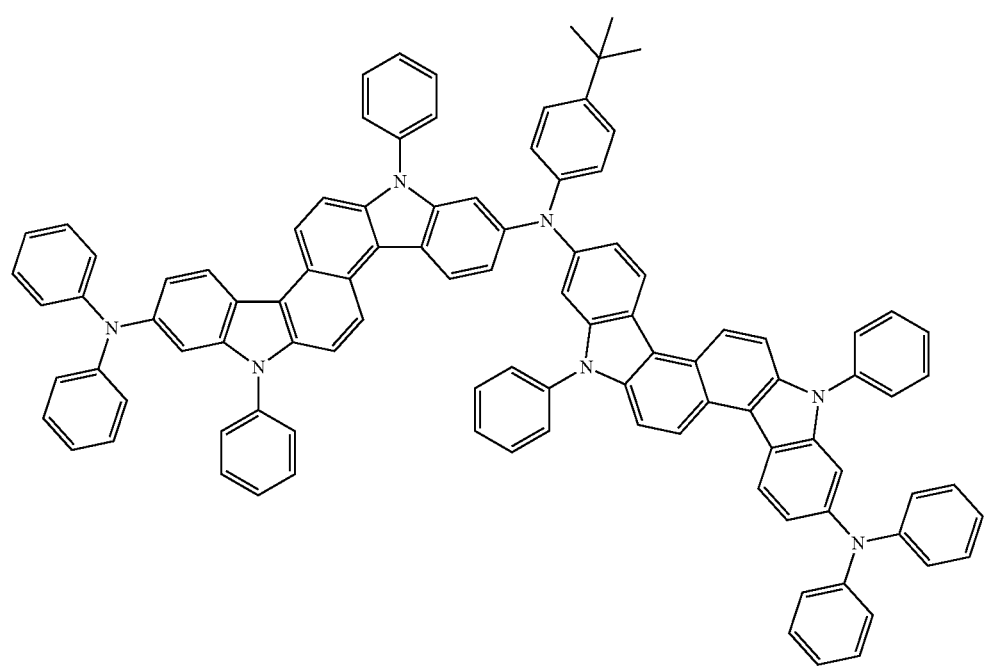

-continued
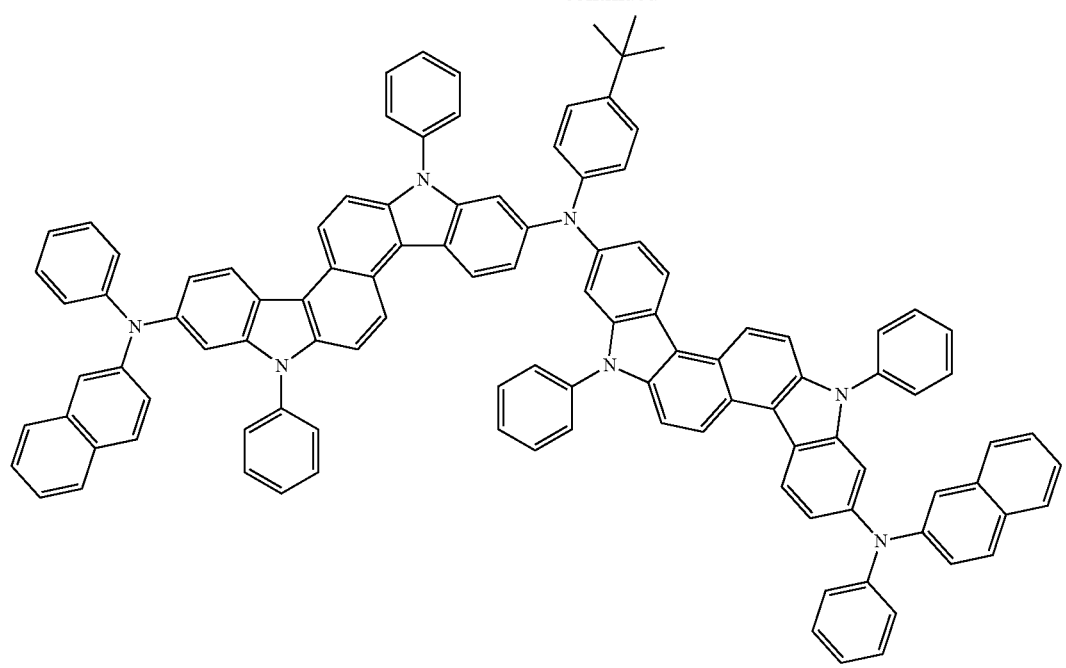
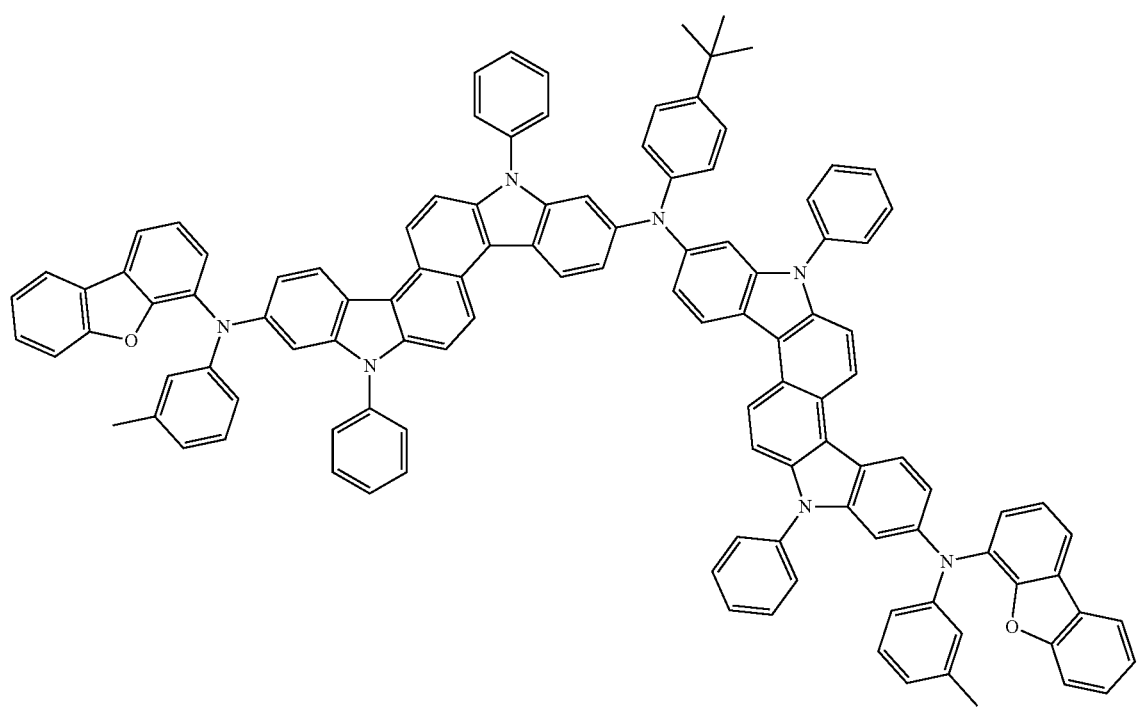

-continued
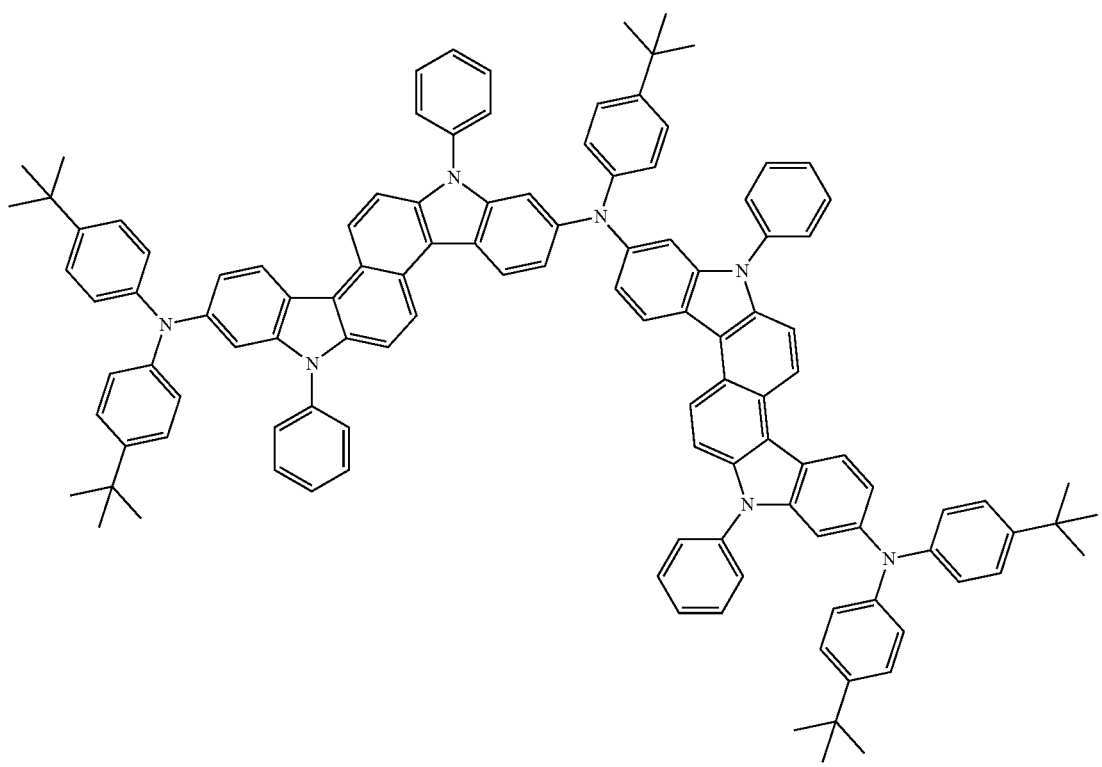
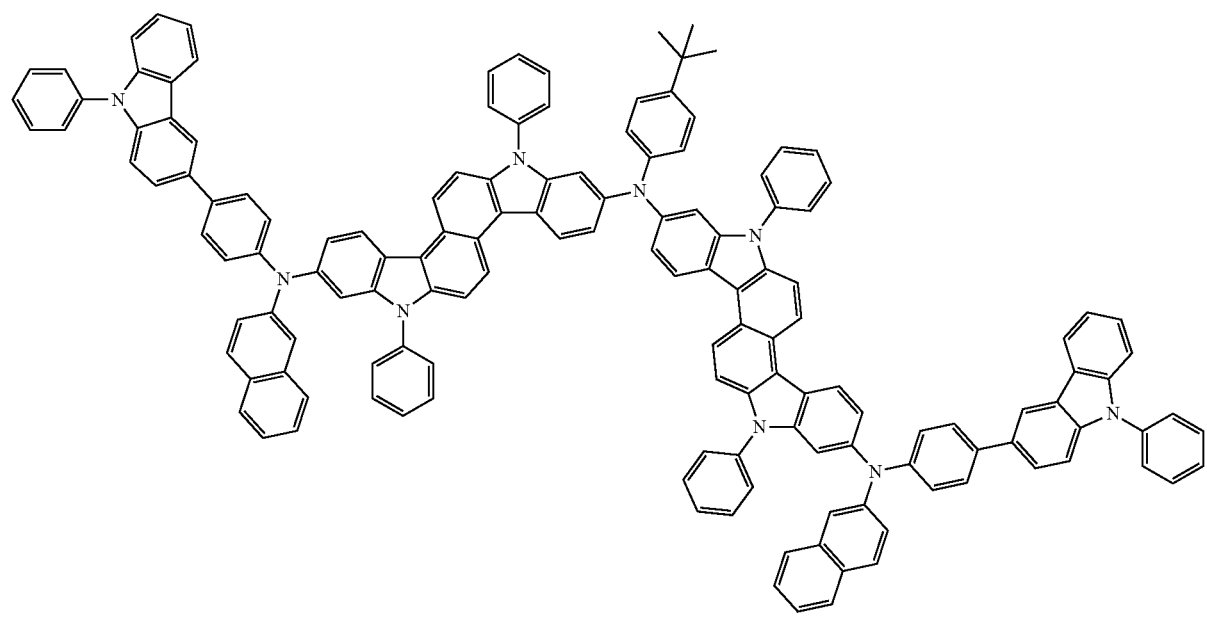

-continued
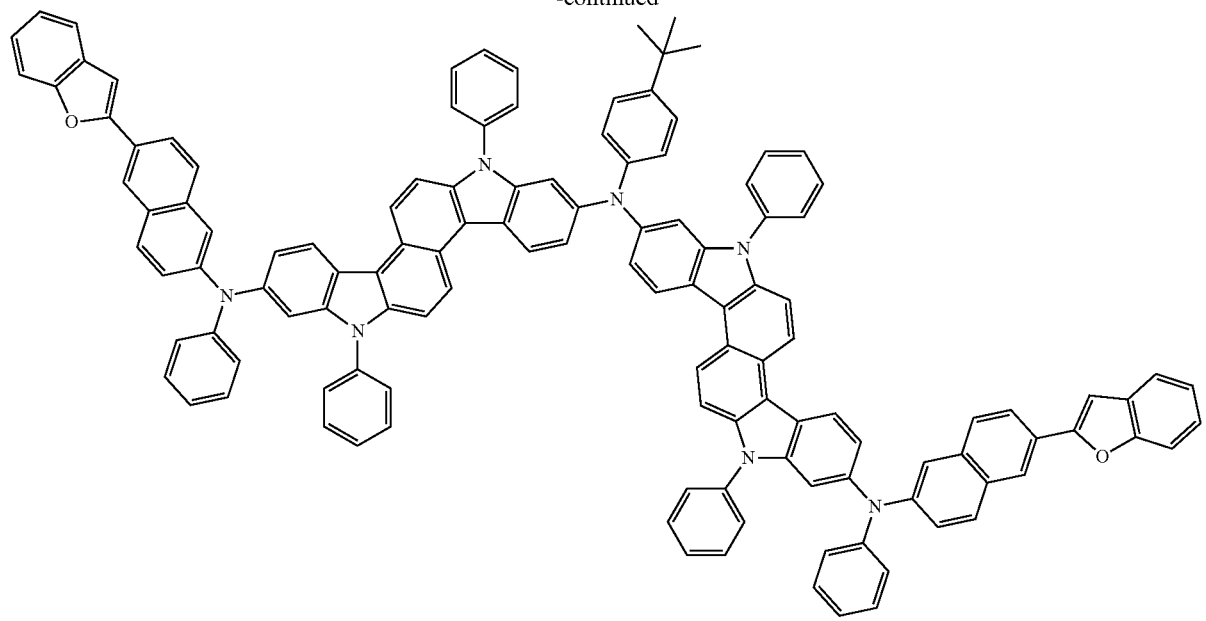
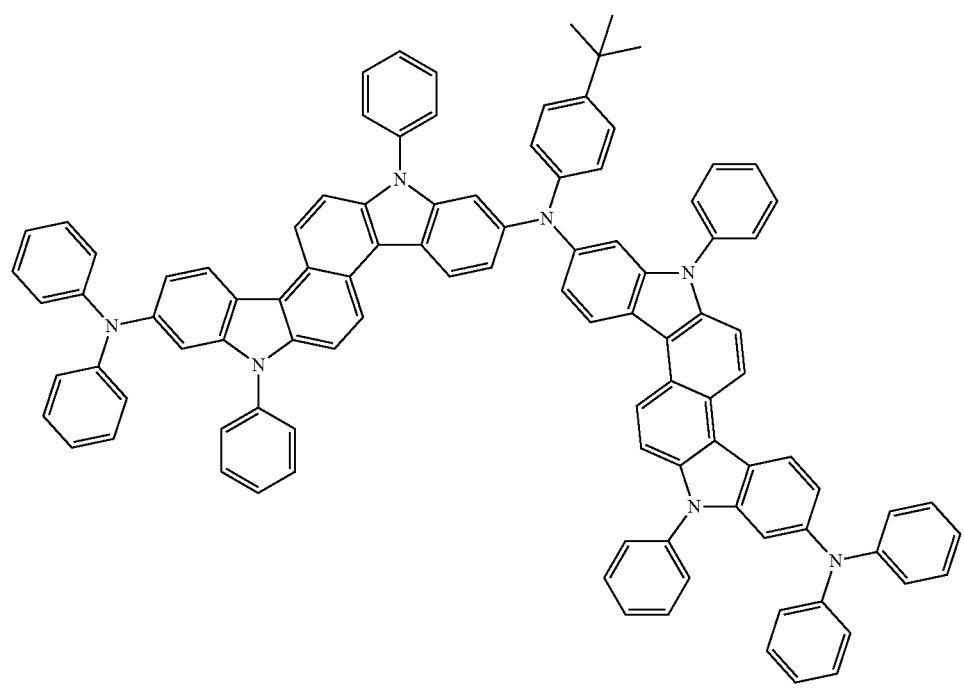

-continued
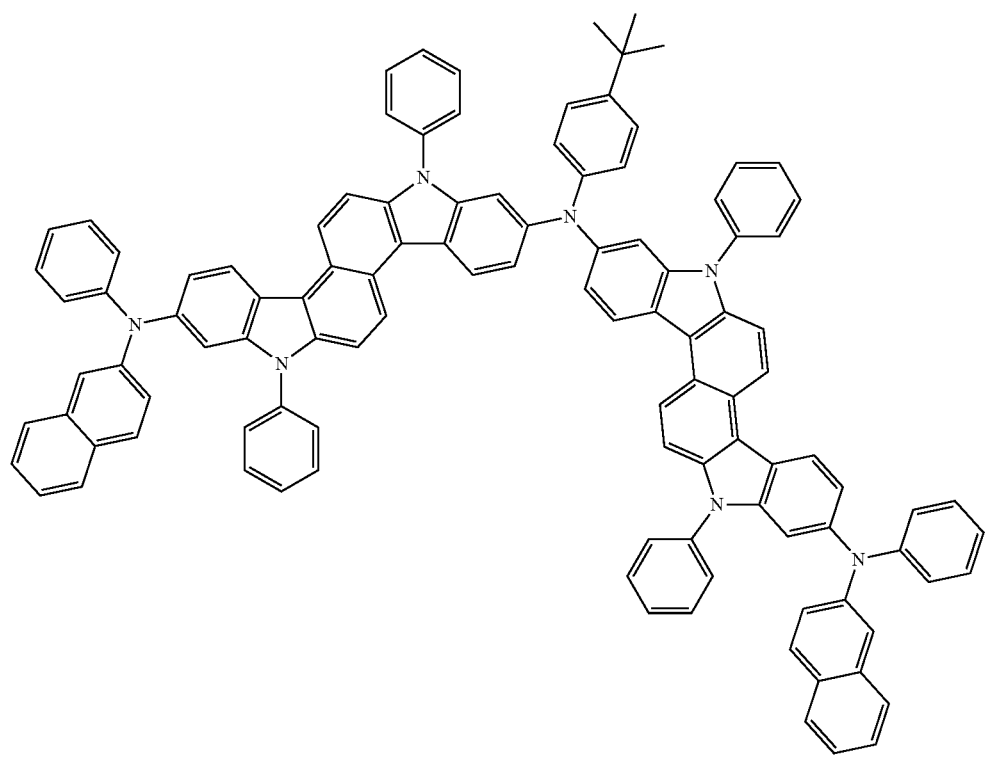
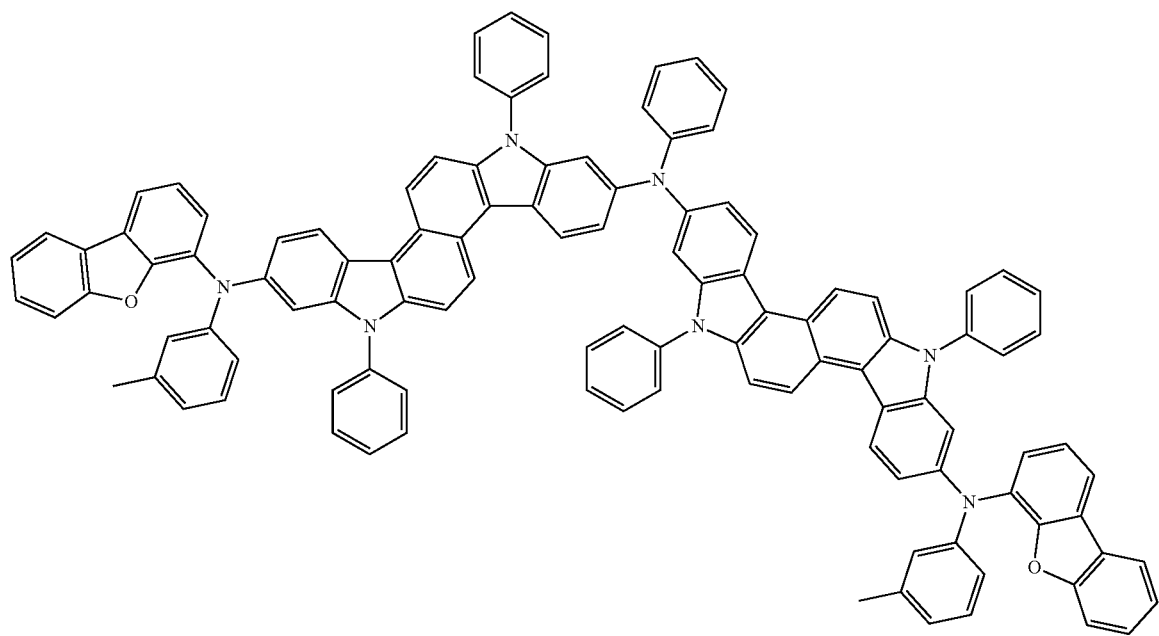

-continued
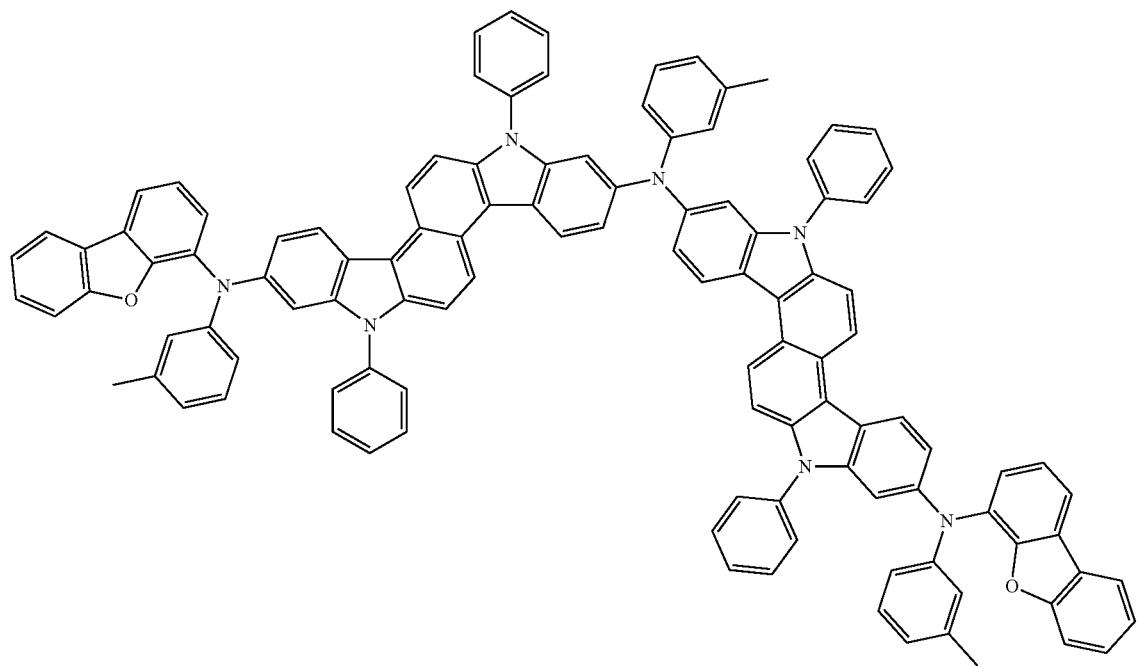
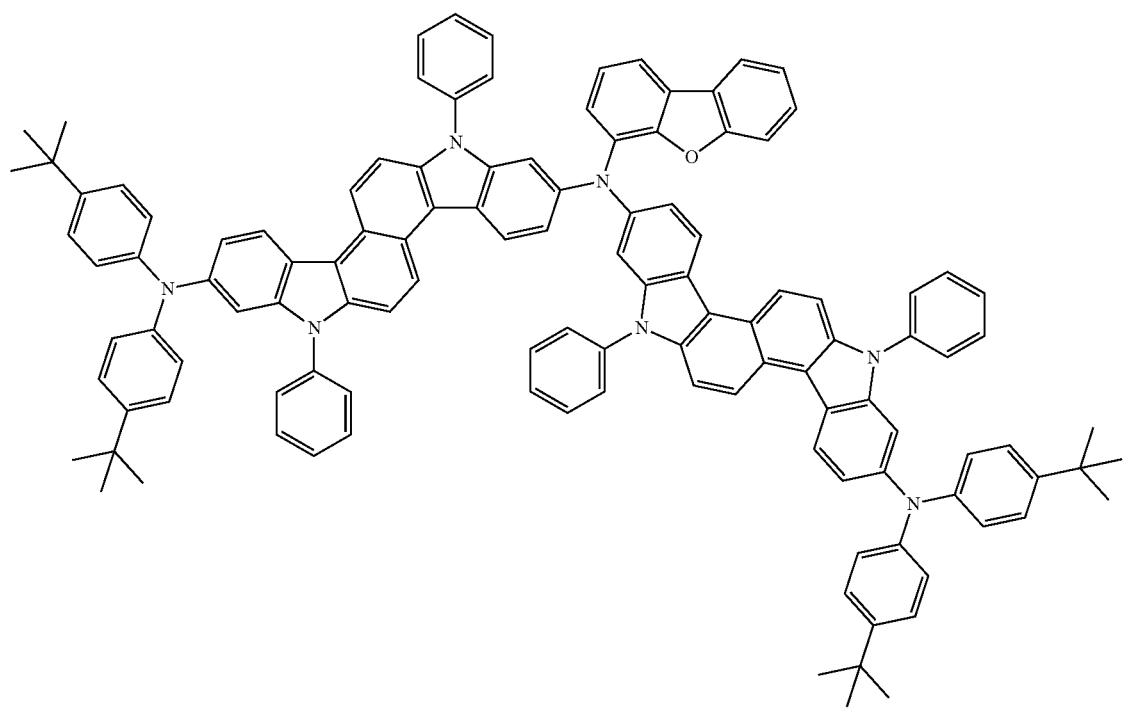

-continued
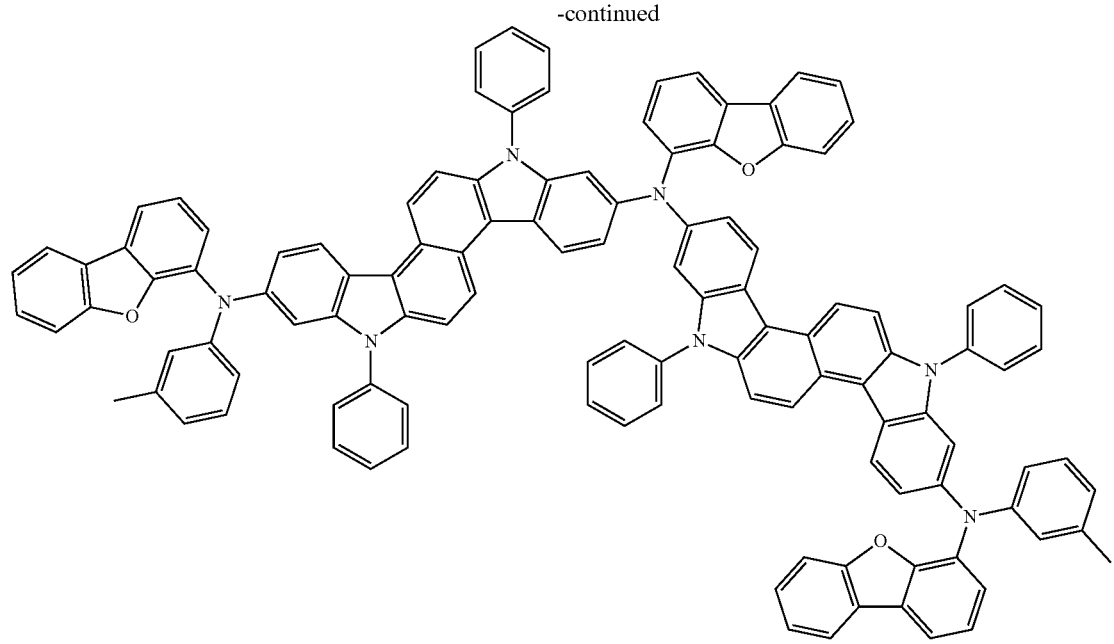
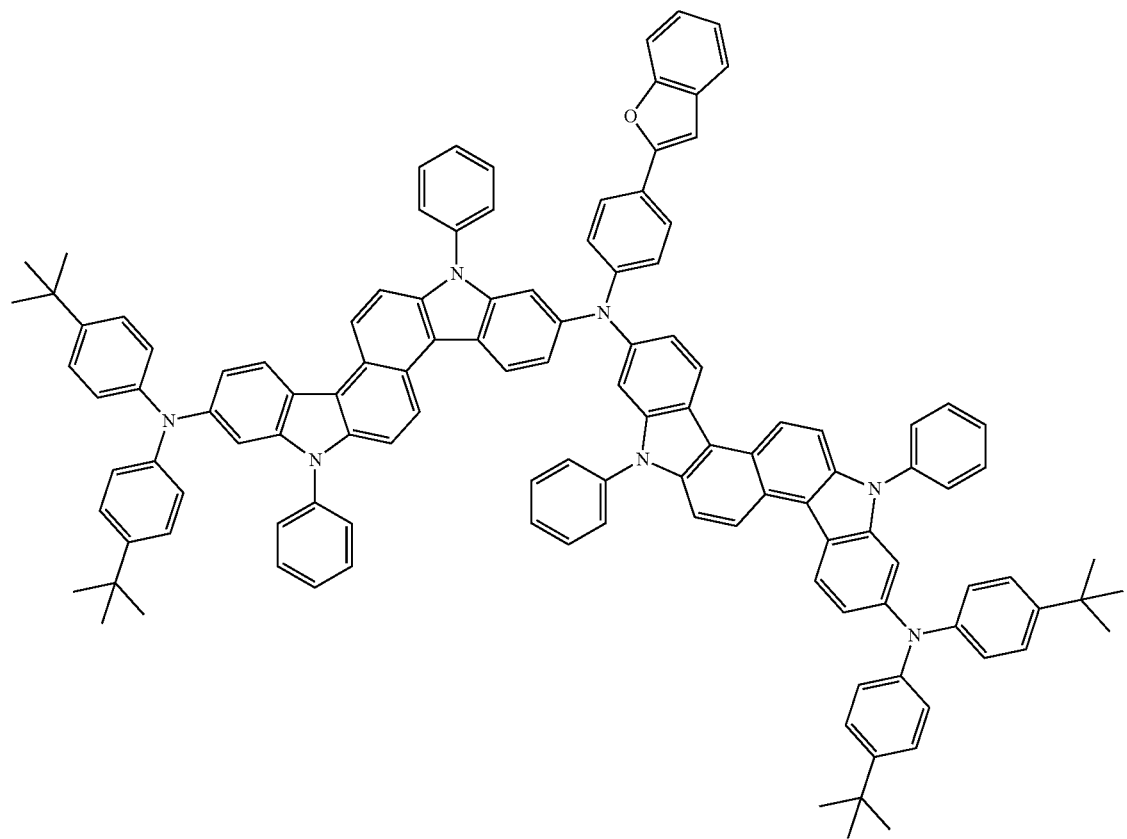

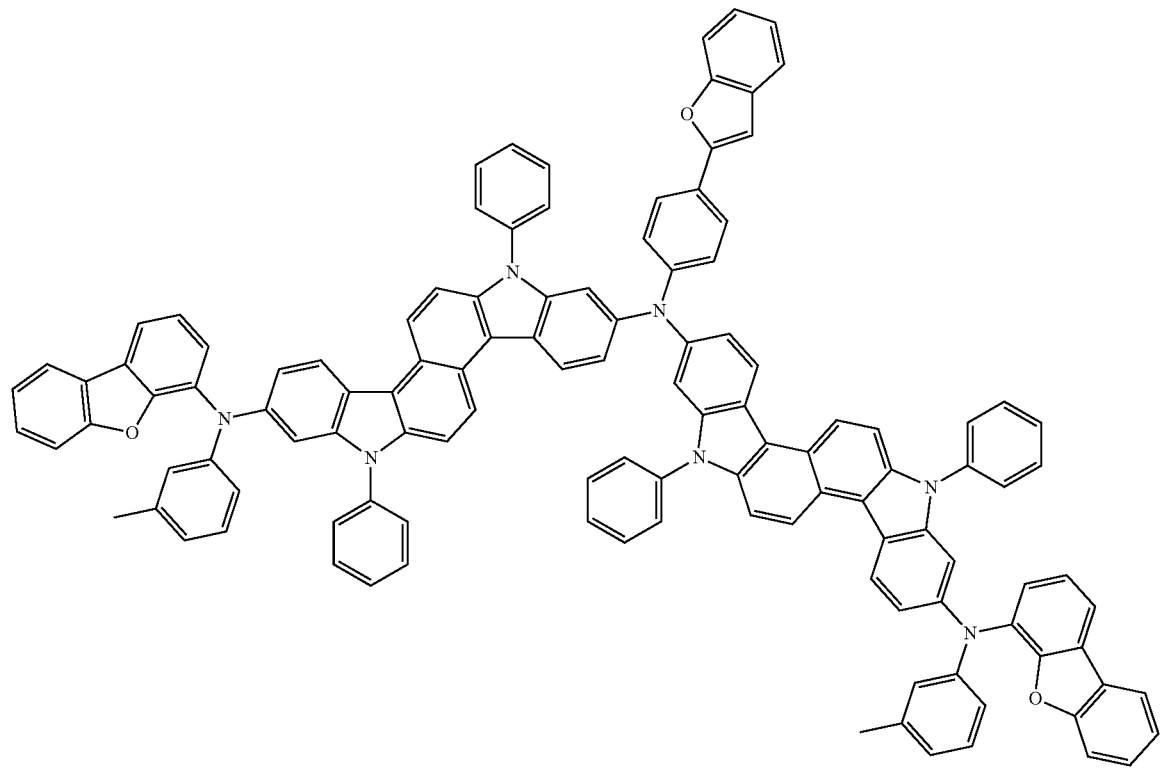
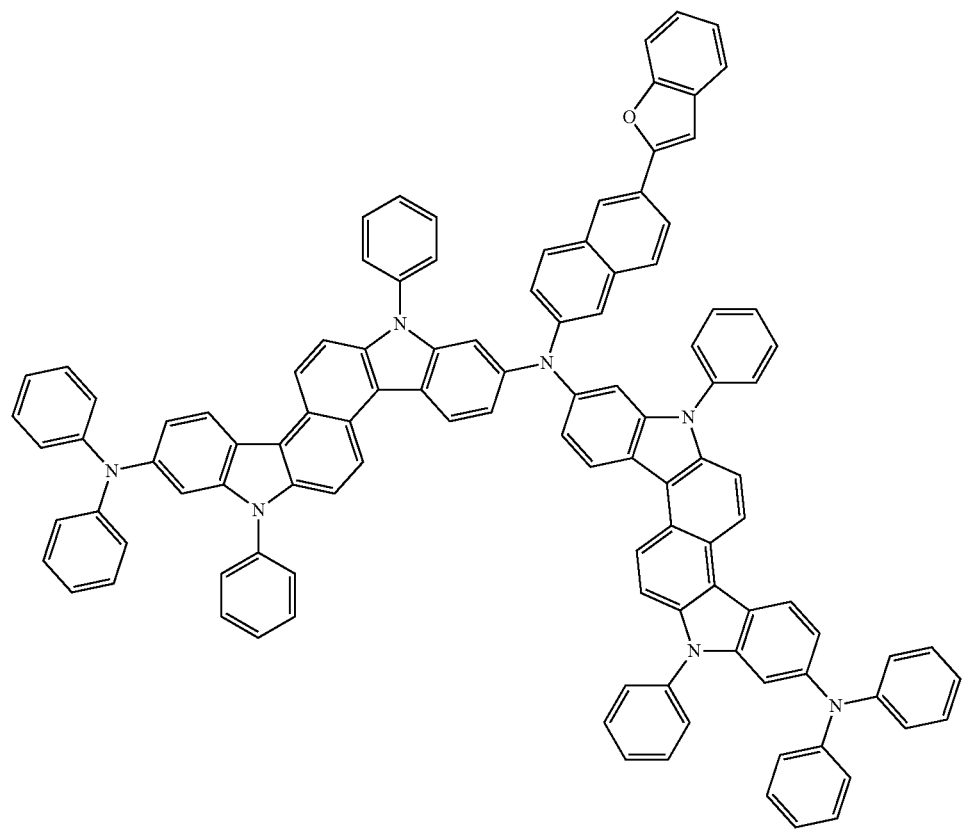

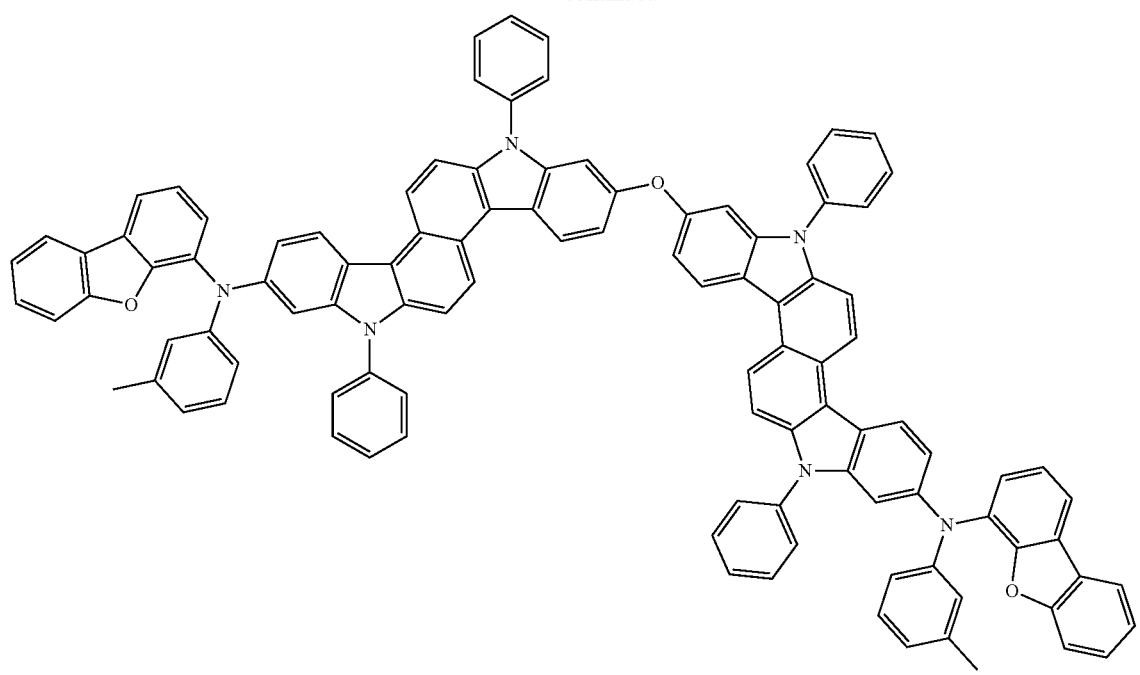
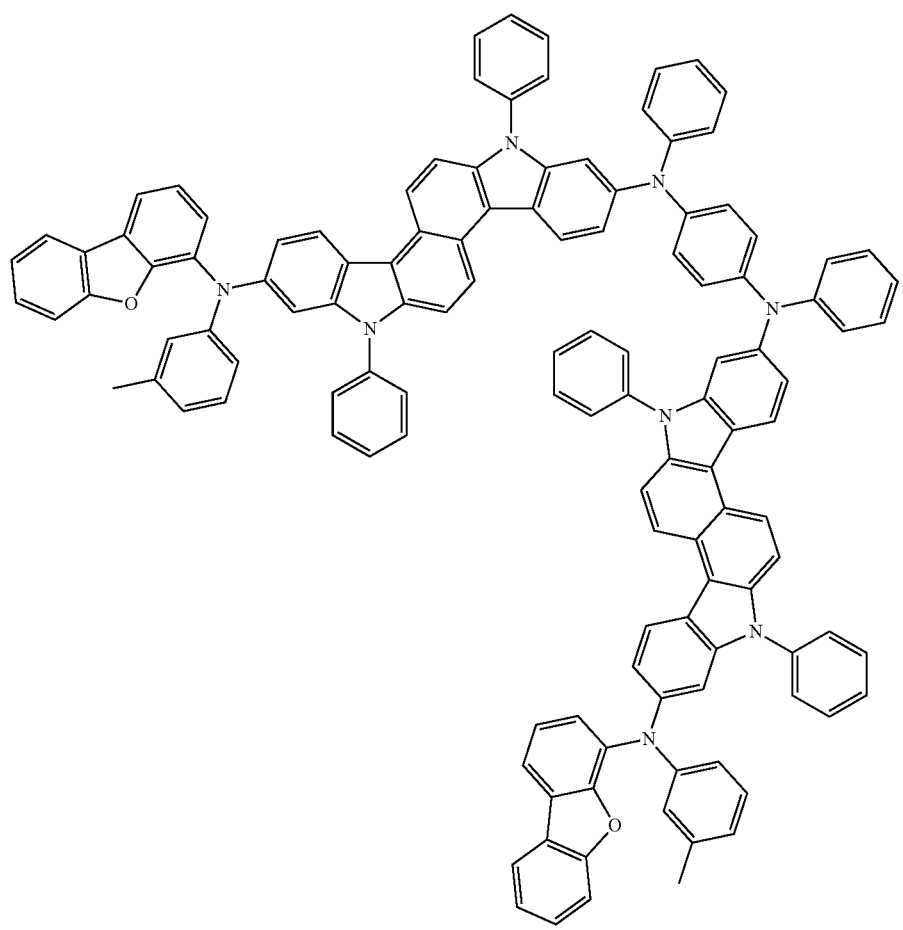

-continued
201
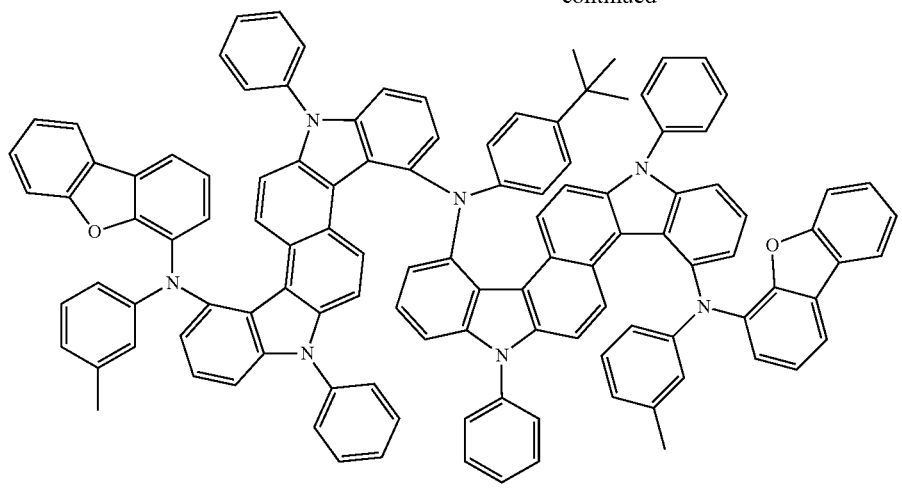
202
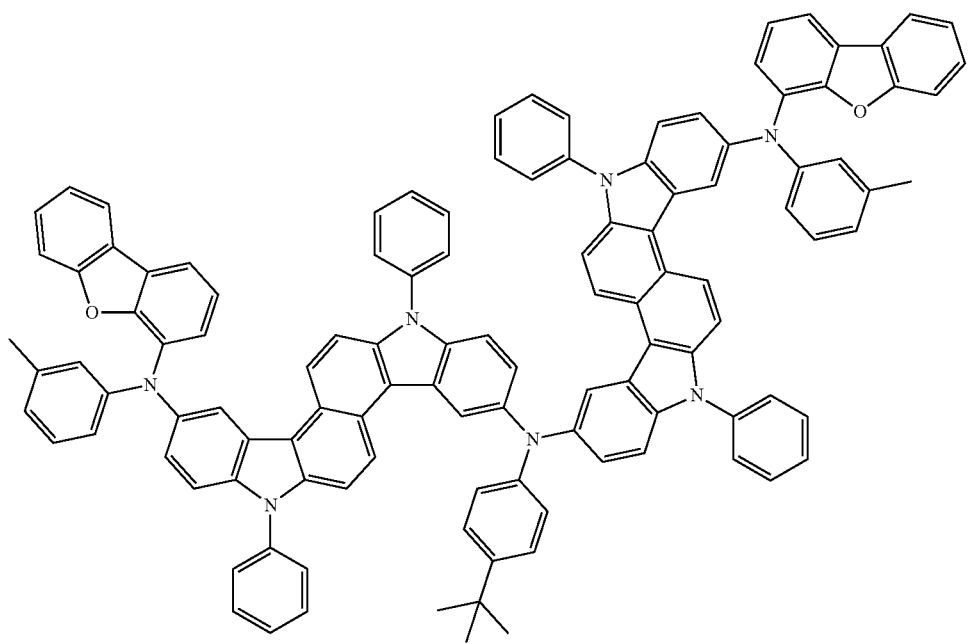

-continued
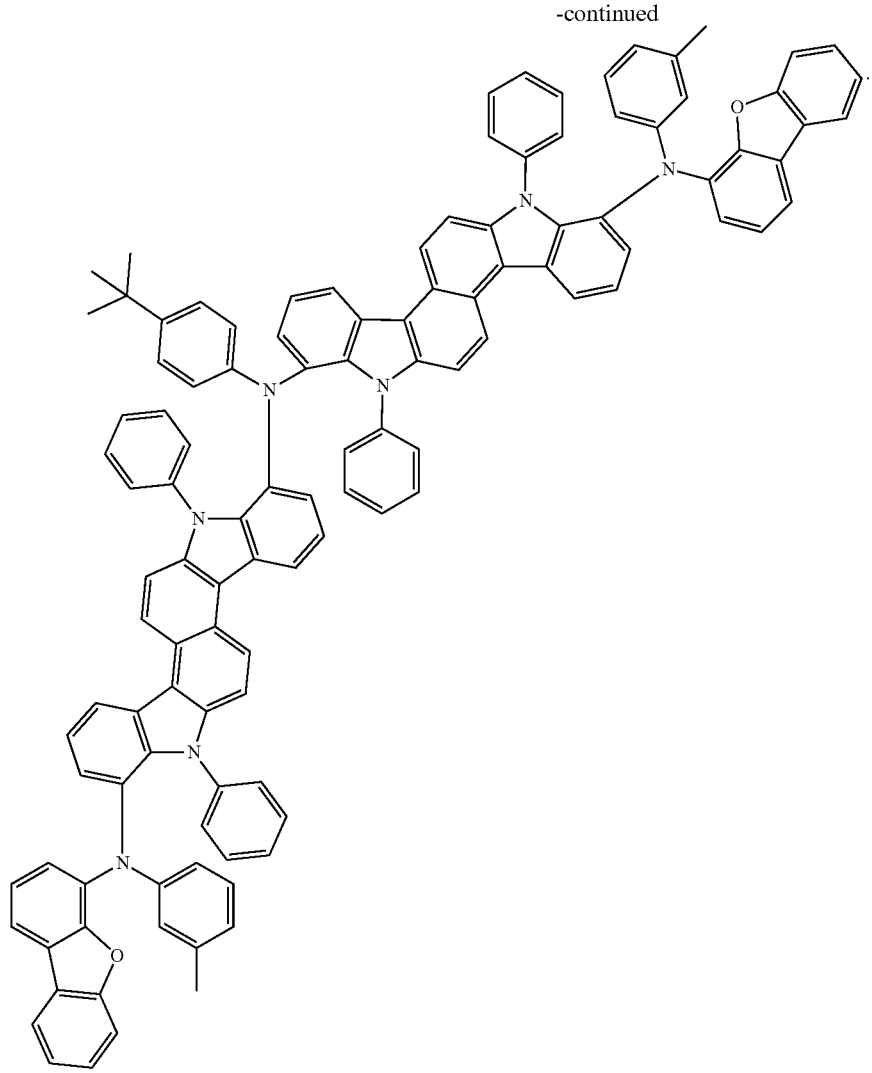
15. An organic light emitting device comprising: a first electrode; a second electrode that is provided opposite to the first electrode; and a light emitting layer that is provided between the first electrode and the second electrode, wherein the light emitting layer includes the compound of claim 1.
* * * * *